(12) United States Patent
Peng et al.

(10) Patent No.: US 12,321,679 B2
(45) Date of Patent: *Jun. 3, 2025

(54) INTEGRATED CIRCUIT, SYSTEM AND METHOD OF FORMING THE SAME

(71) Applicant: TAIWAN SEMICONDUCTOR MANUFACTURING COMPANY, LTD., Hsinchu (TW)

(72) Inventors: Shih-Wei Peng, Hsinchu (TW); Te-Hsin Chiu, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/333,259

(22) Filed: Jun. 12, 2023

(65) Prior Publication Data

US 2023/0342535 A1    Oct. 26, 2023

Related U.S. Application Data

(63) Continuation of application No. 17/345,361, filed on Jun. 11, 2021, now Pat. No. 11,675,952.

(Continued)

(51) Int. Cl.
*G06F 30/392* (2020.01)
*G06F 30/398* (2020.01)
(Continued)

(52) U.S. Cl.
CPC .......... *G06F 30/392* (2020.01); *G06F 30/398* (2020.01); *H01L 21/768* (2013.01);
(Continued)

(58) Field of Classification Search
None
See application file for complete search history.

(56) References Cited

U.S. PATENT DOCUMENTS

| 7,260,442 B2 | 8/2007 | Hwang et al. |
| 9,256,709 B2 | 2/2016 | Yu et al. |

(Continued)

FOREIGN PATENT DOCUMENTS

| TW | 202013066 | 4/2020 |
| TW | 202018554 | 5/2020 |

OTHER PUBLICATIONS

Office Action dated May 13, 2022 for corresponding case No. TW 11120474340. (pp. 1-11).

*Primary Examiner* — Jack Chiang
*Assistant Examiner* — Aric Lin
(74) *Attorney, Agent, or Firm* — Hauptman Ham, LLP

(57) ABSTRACT

An integrated circuit includes a first power rail, a first signal line, a first transistor and a second transistor. The first power rail is on a back-side of a substrate and is configured to supply a first supply voltage. The first signal line is on the back-side of the substrate and is separated from the first power rail. The first transistor has a first active region is in a front-side of the substrate. The first active region is overlapped by the first power rail and is electrically coupled to the first power rail. The second transistor has a second active region that is in the front-side of the substrate. The second active region is separated from the first active region, is overlapped by the first signal line, and is configured to receive the first supply voltage of the first power rail through the first active region of the first transistor.

20 Claims, 50 Drawing Sheets

Related U.S. Application Data

(60) Provisional application No. 63/142,327, filed on Jan. 27, 2021.

(51) Int. Cl.
  *H01L 21/768* (2006.01)
  *H01L 23/50* (2006.01)
  *H01L 23/528* (2006.01)
  *H10D 89/10* (2025.01)

(52) U.S. Cl.
  CPC .......... *H01L 23/50* (2013.01); *H01L 23/5286* (2013.01); *H10D 89/10* (2025.01)

(56) References Cited

U.S. PATENT DOCUMENTS

| | | | |
|---|---|---|---|
| 11,675,952 B2 * | 6/2023 | Peng | G06F 30/398 |
| | | | 716/120 |
| 2004/0130349 A1 * | 7/2004 | Morgenshtein | G06F 30/327 |
| | | | 326/112 |
| 2010/0269081 A1 * | 10/2010 | Hou | G06F 30/39 |
| | | | 716/130 |
| 2014/0040838 A1 | 2/2014 | Liu et al. | |
| 2015/0278429 A1 | 10/2015 | Chang | |
| 2018/0331094 A1 * | 11/2018 | DeLaCruz | H01L 25/0657 |
| 2020/0105670 A1 | 4/2020 | Zhu et al. | |

* cited by examiner

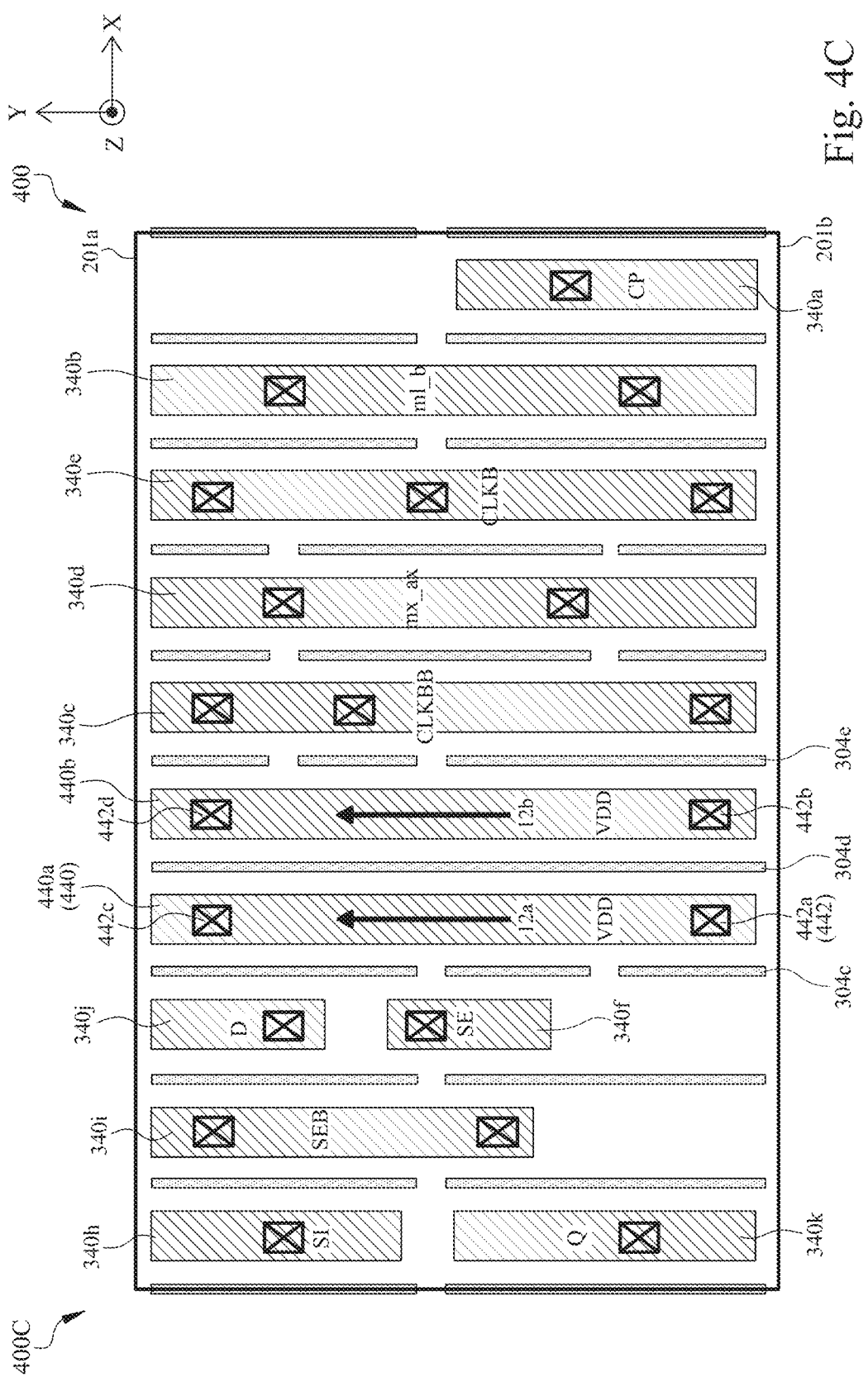

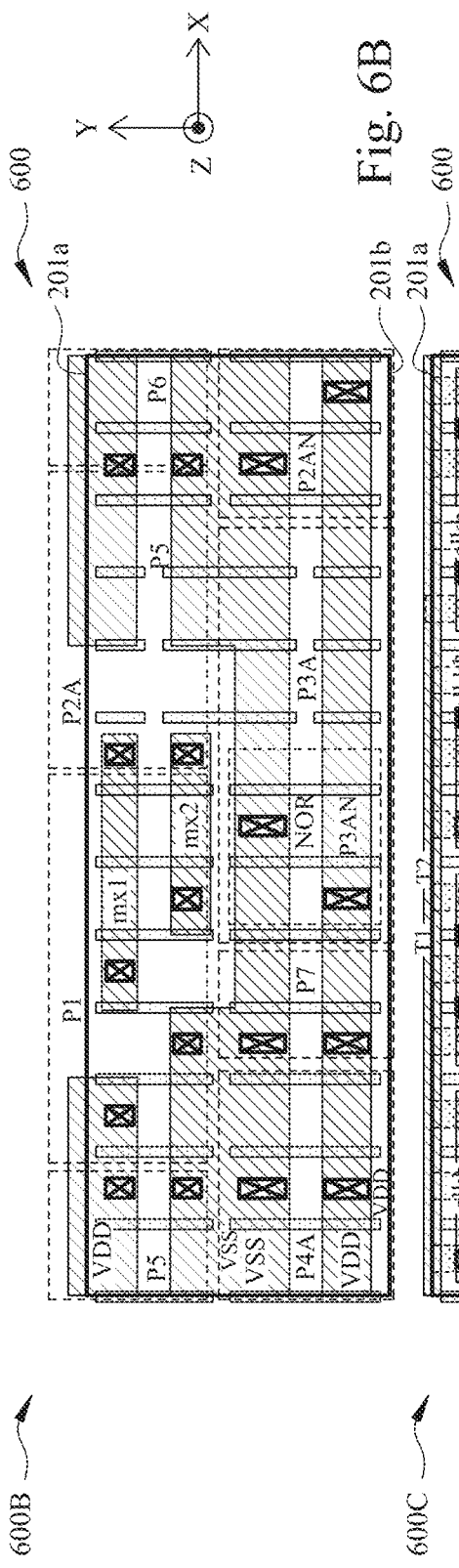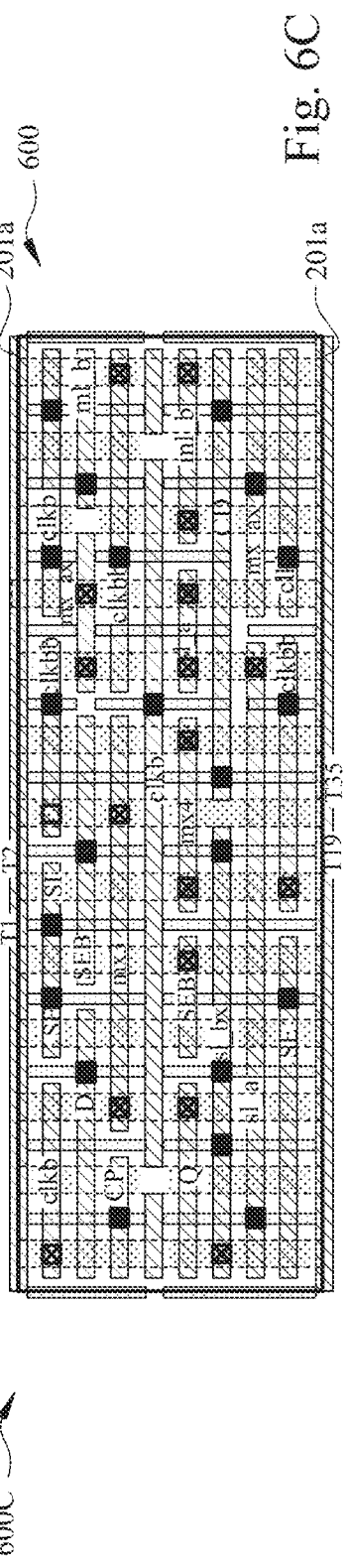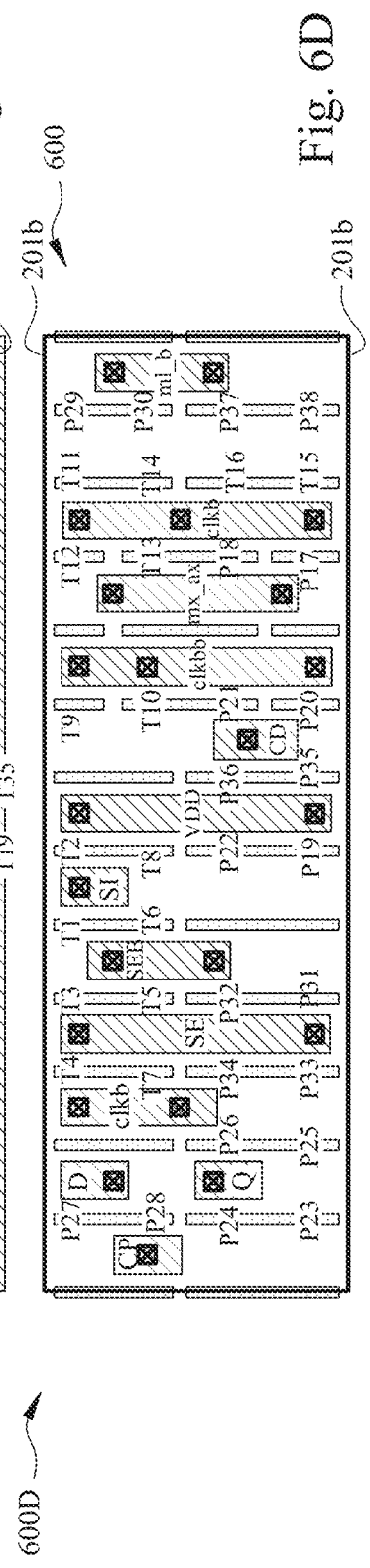
Fig. 6B
Fig. 6C
Fig. 6D

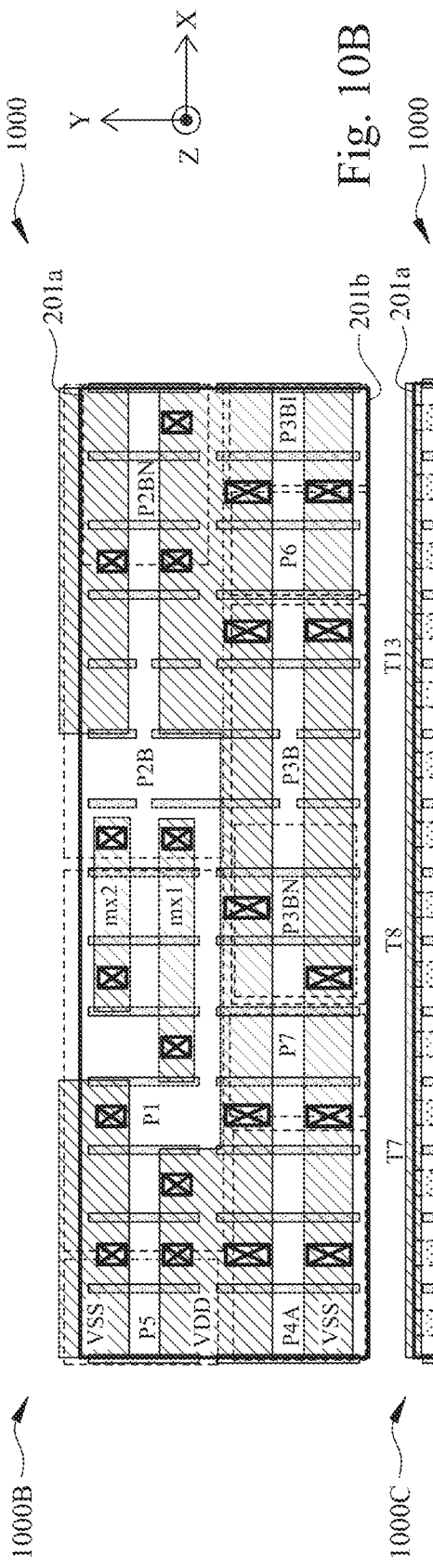
Fig. 10B
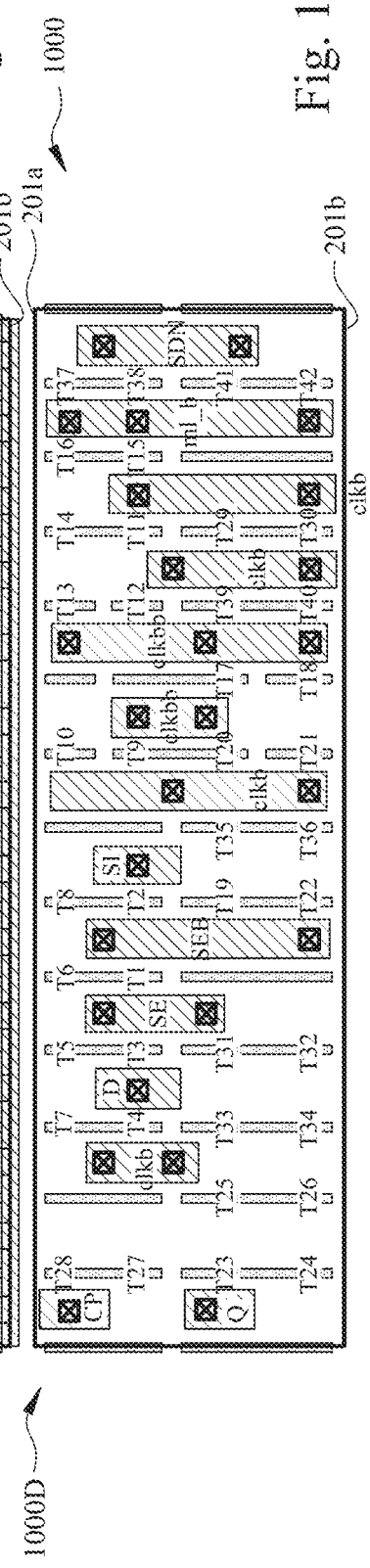
Fig. 10C
Fig. 10D

INTEGRATED CIRCUIT, SYSTEM AND METHOD OF FORMING THE SAME

PRIORITY CLAIM

This application is a continuation of U.S. application Ser. No. 17/345,361, filed Jun. 11, 2021, now U.S. Pat. No. 11,675,952, issued Jun. 13, 2023, which claims the benefit of U.S. Provisional Application No. 63/142,327, filed Jan. 27, 2021, which are herein incorporated by reference in their entireties.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4C are diagrams of an integrated circuit, in accordance with some embodiments.

FIGS. 6B-6D are corresponding diagrams of corresponding portions of a layout design divided into regions of a floorplan, simplified for ease of illustration.

FIGS. 10B-10D are corresponding diagrams of corresponding portions of a layout design divided into regions of a floorplan, simplified for ease of illustration.

DETAILED DESCRIPTION

Figure 1A:
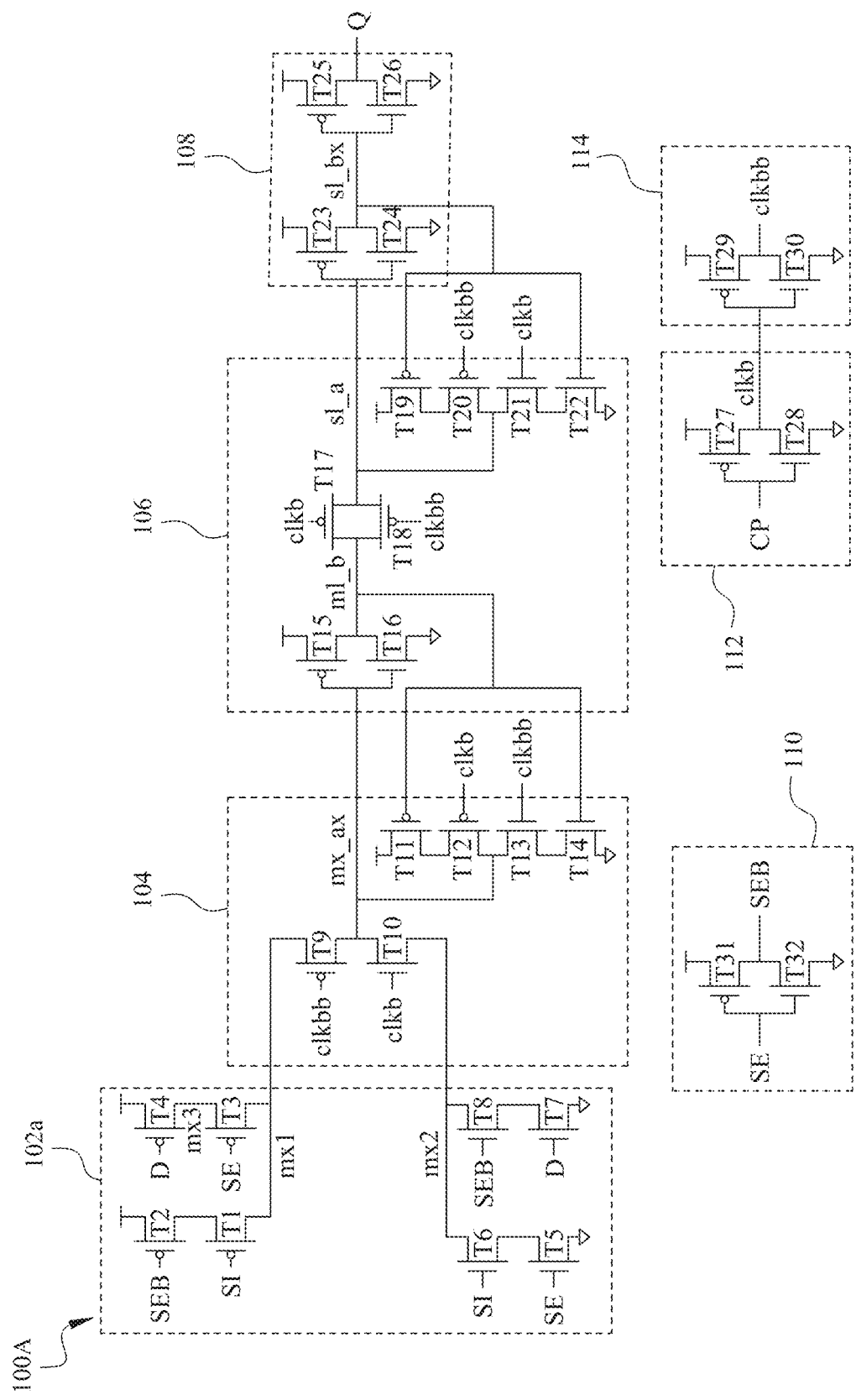
FIG. 1A is a circuit diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first power rail, a first signal line, a first transistor and a second transistor. In some embodiments, the first power rail extends in a first direction and is configured to supply a first supply voltage, and is on a back-side of a substrate. In some embodiments, the first signal line extends in the first direction and is separated from the first power rail in a second direction different from the first direction. In some embodiments, the first power rail and the first signal line are on a back-side of a substrate.

In some embodiments, the first transistor has a first active region. In some embodiments, first active region extends in the first direction and is in a front-side of the substrate opposite from the back-side. In some embodiments, the first active region is overlapped by the first power rail, and is electrically coupled to the first power rail.

In some embodiments, the second transistor has a second active region. In some embodiments, the second active region is in the front-side of the substrate. In some embodiments, the second active region extends in the first direction, and is separated from the first active region in at least the second direction.

In some embodiments, the second active region is covered by the first signal line. In some embodiments, the second active region is electrically coupled to the first power rail through the first active region of the first transistor. In some embodiments, by electrically coupling the second active region to the first power rail through the first active region of the first transistor, the second active region is configured to receive the first supply voltage of the first power rail through the first active region of the first transistor even though the second active region is covered by the first signal line resulting in more via landing spots and routing resources than other approaches.

In some embodiments, portions of the second active region are coupled to each other by the first signal line, and the integrated circuit of the present disclosure offers more routing flexibility and more via landing spots, thus increasing routing resources compared to other approaches.

FIG. 1A is a circuit diagram of an integrated circuit 100A, in accordance with some embodiments.

In some embodiments, integrated circuit 100A is a flip-flop circuit. In some embodiments, integrated circuit 100A is a multi-bit flip-flop (MBFF) circuit.

Integrated circuit 100A is a flip-flop circuit. Integrated circuit 100A is configured to receive at least a data signal D or a scan in signal SI, and is configured to output an output signal Q. In some embodiments, the data signal D is a data input signal. In some embodiments, the scan in signal SI is a scan input signal. In some embodiments, the output signal Q is a stored state of at least the data signal D or the scan in signal SI. A flip-flop circuit is used for illustration, other types of circuits are within the scope of the present disclosure.

Integrated circuit 100A includes a multiplexer 102a, a latch 104, a latch 106, an output circuit 108, an inverter 110, an inverter 112 and an inverter 114.

Multiplexer 102a includes a first input terminal configured to receive the data signal D, a second input terminal configured to receive the scan in signal SI, a third input terminal configured to receive a scan enable signal SE, and a fourth input terminal configured to receive an inverted scan enable signal SEB. In some embodiments, the scan enable signal SE is a selection signal of multiplexer 102a, and the inverted scan enable signal SEB is an inverted selection signal of multiplexer 102a. An output terminal of multiplexer 102a is coupled to an input terminal of latch 104. Multiplexer 102a is configured to output a signal mx1 and mx2 to latch 104. In some embodiments, multiplexer 102a is coupled to inverter 110, and is configured to receive inverted scan enable signal SEB.

Latch 104 is coupled to multiplexer 102a and latch 106. The input terminal of latch 104 is configured to receive signals mx1 and mx2 from multiplexer 102a. An output terminal of latch 104 is coupled to an input terminal of latch 106. Latch 104 is configured to output a signal m_ax to latch 106 by the output terminal.

In some embodiments, latch 104 is coupled to inverter 112, and is configured to receive clock signal CLKB. In some embodiments, latch 104 is coupled to inverter 114, and is configured to receive clock signal CLKBB.

Latch 106 is coupled to latch 104 and output circuit 108. The input terminal of latch 106 is configured to receive signal mx_ax from latch 104. An output terminal of latch 106 is coupled to an input terminal of output circuit 108. Latch 106 is configured to output a signal sl_a to output circuit 108 by the output terminal. In some embodiments, latch 106 is coupled to inverter 112, and is configured to receive clock signal CLKB. In some embodiments, latch 106 is coupled to inverter 114, and is configured to receive clock signal CLKBB.

Output circuit 108 is coupled to latch 106. The input terminal of output circuit 108 is configured to receive signal sl_a from latch 106. An output terminal of output circuit 108 is configured to output the output signal Q.

An input terminal of inverter 110 is configured to receive the scan enable signal SE. In some embodiments, the input terminal of inverter 110 is coupled to the third input terminal of multiplexer 302. An output terminal of inverter 110 is configured to output the inverted scan enable signal SEB. In some embodiments, the output terminal of inverter 110 is coupled to the fourth input terminal of multiplexer 302.

An input terminal of inverter 112 is configured to receive clock signal CP. An output terminal of inverter 112 is configured to output the clock signal CLKB to at least an input terminal of inverter 114.

An input terminal of inverter 114 is coupled to at least the output terminal of inverter 112, and is configured to receive clock signal CLKB. An output terminal of inverter 114 is configured to output the clock signal CLKBB.

Multiplexer 102a includes transistors T1-T8. In some embodiments, each of transistors T1, T2, T3 and T4 is a p-type metal oxide semiconductor (PMOS) transistor. In some embodiments, each of transistors T5, T6, T7 and T8 is an n-type metal oxide semiconductor (NMOS) transistor.

A gate terminal of transistor T1 is configured to receive scan in signal SI. A gate terminal of transistor T6 is configured to receive scan in signal SI. In some embodiments, the gate terminal of transistor T1 is coupled to the gate terminal of transistor T6.

A gate terminal of transistor T2 is configured to receive inverted scan enable signal SEB. A source terminal of transistor T2 is coupled to the voltage supply VDD. A drain terminal of transistor T2 is coupled to a source terminal of transistor T1.

A gate terminal of transistor T3 is configured to receive scan enable signal SE. A source terminal of transistor T3 is coupled to a drain terminal of transistor T4.

A source terminal of transistor T4 is coupled to the voltage supply VDD. A gate terminal of transistor T4 is configured to receive data signal D. A gate terminal of transistor T7 is configured to receive data signal D. In some embodiments, the gate terminal of transistor T4 is coupled to the gate terminal of transistor T7.

A source terminal of transistor T5 is coupled to the reference voltage supply VSS. A drain terminal of transistor T5 is coupled to a source terminal of transistor T6. A gate terminal of transistor T5 is configured to receive scan enable signal SE. In some embodiments, the gate terminal of transistor T5 is coupled to the gate terminal of transistor T3.

A gate terminal of transistor T8 is configured to receive inverted scan enable signal SEB. In some embodiments, the gate terminal of transistor T8 is coupled to the gate terminal of transistor T2. A source terminal of transistor T8 is coupled to a drain terminal of transistor T7.

A source terminal of transistor T7 is coupled to the reference voltage supply VSS.

Latch 104 includes transistors T9-T14. In some embodiments, each of transistors T9, T11 and T12 is a PMOS transistor. In some embodiments, each of transistors T10, T13 and T14 is an NMOS transistor.

Each of a source terminal of transistor T9, a drain terminal of transistor T1 and a drain terminal of transistor T3 are coupled together. Signal mx1 is the signal of at least the source terminal of transistor T9, the drain terminal of transistor T1 or the drain terminal of transistor T3.

Each of a source terminal of transistor T10, a drain terminal of transistor T6 and a drain terminal of transistor T8 are coupled together. Signal mx2 is the signal of at least the source terminal of transistor T10, the drain terminal of transistor T6 or the drain terminal of transistor T8.

A gate terminal of transistor T9 is configured to receive clock signal CLKBB. A gate terminal of transistor T10 is configured to receive clock signal CLKB. In some embodiments, clock signal CLKBB is inverted from clock signal CLKB, and vice versa. In some embodiments, clock signal CLKB is inverted from clock signal CP, and vice versa.

Each of the drain terminal of transistor T9, the drain terminal of transistor T10, a drain terminal of transistor T13, a drain terminal of transistor T12, a gate terminal of transistor T15 and a gate terminal of transistor T16 are coupled together. Signal mx_ax is the signal of at least the drain terminal of transistor T9, the drain terminal of transistor T10, the drain terminal of transistor T13, the drain terminal of transistor T12, the gate terminal of transistor T15 or the gate terminal of transistor T16.

A gate terminal of transistor T11 and a gate terminal of transistor T14 are coupled together, and are further coupled to latch 106.

A source terminal of transistor T11 is coupled to the voltage supply VDD. A drain terminal of transistor T11 is coupled to a source terminal of transistor T12.

A gate terminal of transistor T12 is configured to receive clock signal CLKB. In some embodiments, the gate terminal of transistor T12 is coupled to at least an output terminal of inverter 112.

A gate terminal of transistor T13 is configured to receive clock signal CLKBB. In some embodiments, the gate terminal of transistor T13 is coupled to at least an output terminal of inverter 114.

A source terminal of transistor T13 is coupled to a drain terminal of transistor T14. A source terminal of transistor T14 is coupled to the reference voltage supply VSS.

Latch 106 includes transistors T15-T22. In some embodiments, each of transistors T15, T17, T19 and T20 is a PMOS transistor. In some embodiments, each of transistors T16, T18, T21 and T22 is an NMOS transistor.

Transistors T15 and T16 are configured as an inverter configured to receive signal mx_ax, and to generate signal ml_b. The gate terminals of transistors T15 and T16 are configured to receive signal mx_ax. A source terminal of transistor T15 is coupled to the voltage supply VDD. A source terminal of transistor T16 is coupled to the reference voltage supply VSS.

Each of a drain terminal of transistor T15, a drain terminal of transistor T16, a source/drain terminal of transistor T17, a source/drain terminal of transistor T18, the gate terminal of transistor T11 and the gate terminal of transistor T14 are coupled together.

Transistors T17 and 18 are configured as a transmission gate (not labelled). A gate terminal of transistor T17 is configured to receive clock signal CLKB. A gate terminal of transistor T18 is configured to receive clock signal CLKBB.

Each of a drain/source terminal of transistor T17, a drain/source terminal of transistor T18, a gate terminal of transistor T23, a gate terminal of transistor T24, a drain terminal of transistor T20 and a drain terminal of transistor T21 are coupled together. Signal sl_a is the signal of at least the drain/source terminal of transistor T17, the drain/source terminal of transistor T18, the gate terminal of transistor T23, the gate terminal of transistor T24, the drain terminal of transistor T20 or the drain terminal of transistor T21.

Each of a gate terminal of transistor T19, a gate terminal of transistor T22, a drain terminal of transistor T23, a drain terminal of transistor T24, a gate terminal of transistor T25 and a gate terminal of transistor T26 are coupled together. The gate terminal of transistor T19 and the gate terminal of transistor T22 are configured to receive signal sl_bx from the drain terminal of transistor T23 and the drain terminal of transistor T24.

A source terminal of transistor T19 is coupled to the voltage supply VDD. A drain terminal of transistor T19 is coupled to a source terminal of transistor T20.

A gate terminal of transistor T20 is configured to receive clock signal CLKBB. In some embodiments, the gate terminal of transistor T20 is coupled to at least an output terminal of inverter 114.

A gate terminal of transistor T21 is configured to receive clock signal CLKB. In some embodiments, the gate terminal of transistor T21 is coupled to at least an output terminal of inverter 112.

A source terminal of transistor T21 is coupled to a drain terminal of transistor T22. A source terminal of transistor T22 is coupled to the reference voltage supply VSS.

Output circuit 108 includes transistors T23-T26. In some embodiments, each of transistors T23 and T25 is a PMOS transistor. In some embodiments, each of transistors T24 and T26 is an NMOS transistor.

Transistors T23 and T24 are configured as an inverter (not labelled) configured to receive signal sl_a, and to generate signal sl_bx. The gate terminals of transistors T23 and T24 are configured to receive signal sl_a. A source terminal of transistor T23 is coupled to the voltage supply VDD. A source terminal of transistor T24 is coupled to the reference voltage supply VSS. The drain terminals of transistors T23 and T24 are configured to output the signal sl_bx.

Transistors T25 and T26 are configured as an inverter (not labelled) configured to receive signal sl_bx, and to generate signal Q. The gate terminals of transistors T25 and T26 are coupled together, and configured to receive signal sl_bx. A source terminal of transistor T25 is coupled to the voltage supply VDD. A source terminal of transistor T26 is coupled to the reference voltage supply VSS. The drain terminals of transistors T25 and T26 are coupled together, and configured to output the signal Q.

Inverter 110 includes transistors T31-T32. In some embodiments, transistor T31 is a PMOS transistor. In some embodiments, transistor T32 is an NMOS transistor.

A gate terminal of transistor T31 and a gate terminal of transistor T32 are configured to receive scan enable signal SE. The gate terminals of transistor T31 and transistor T32 are coupled together. A source terminal of transistor T31 is coupled to the voltage supply VDD. A drain terminal of transistor T31 and a drain terminal of transistor T32 are coupled together, and are configured to output inverted scan enable signal SEB. A source terminal of transistor T32 is coupled to the reference voltage supply VSS.

Inverter 112 includes transistors T27-T28. In some embodiments, transistor T27 is a PMOS transistor. In some embodiments, transistor T28 is an NMOS transistor.

A gate terminal of transistor T27 and a gate terminal of transistor T28 are configured to receive clock signal CP. The gate terminals of transistor T27 and transistor T28 are coupled together. A source terminal of transistor T27 is coupled to the voltage supply VDD. A drain terminal of transistor T27 and a drain terminal of transistor T28 are coupled together, and are configured to output inverted clock signal CLKB. A source terminal of transistor T28 is coupled to the reference voltage supply VSS.

Inverter 114 includes transistors T29-T30. In some embodiments, transistor T29 is a PMOS transistor. In some embodiments, transistor T30 is an NMOS transistor.

Each of the drain terminal of transistor T27, the drain terminal of transistor T28, a gate terminal of transistor T29 and a gate terminal of transistor T30 are coupled together. The gate terminal of transistor T29 and the gate terminal of transistor T30 are configured to receive clock signal CLKB. A source terminal of transistor T29 is coupled to the voltage supply VDD. A drain terminal of transistor T29 and a drain terminal of transistor T30 are coupled together, and are configured to output inverted clock signal CLKBB. A source terminal of transistor T30 is coupled to the reference voltage supply VSS.

In some embodiments, one or more NMOS transistors are changed to one or more PMOS transistors, and vice versa. In some embodiments, one or more of the drains or sources are flipped with the other.

Other configurations, arrangements or other circuits in integrated circuit 100A are within the scope of the present disclosure.

Figure 1B:
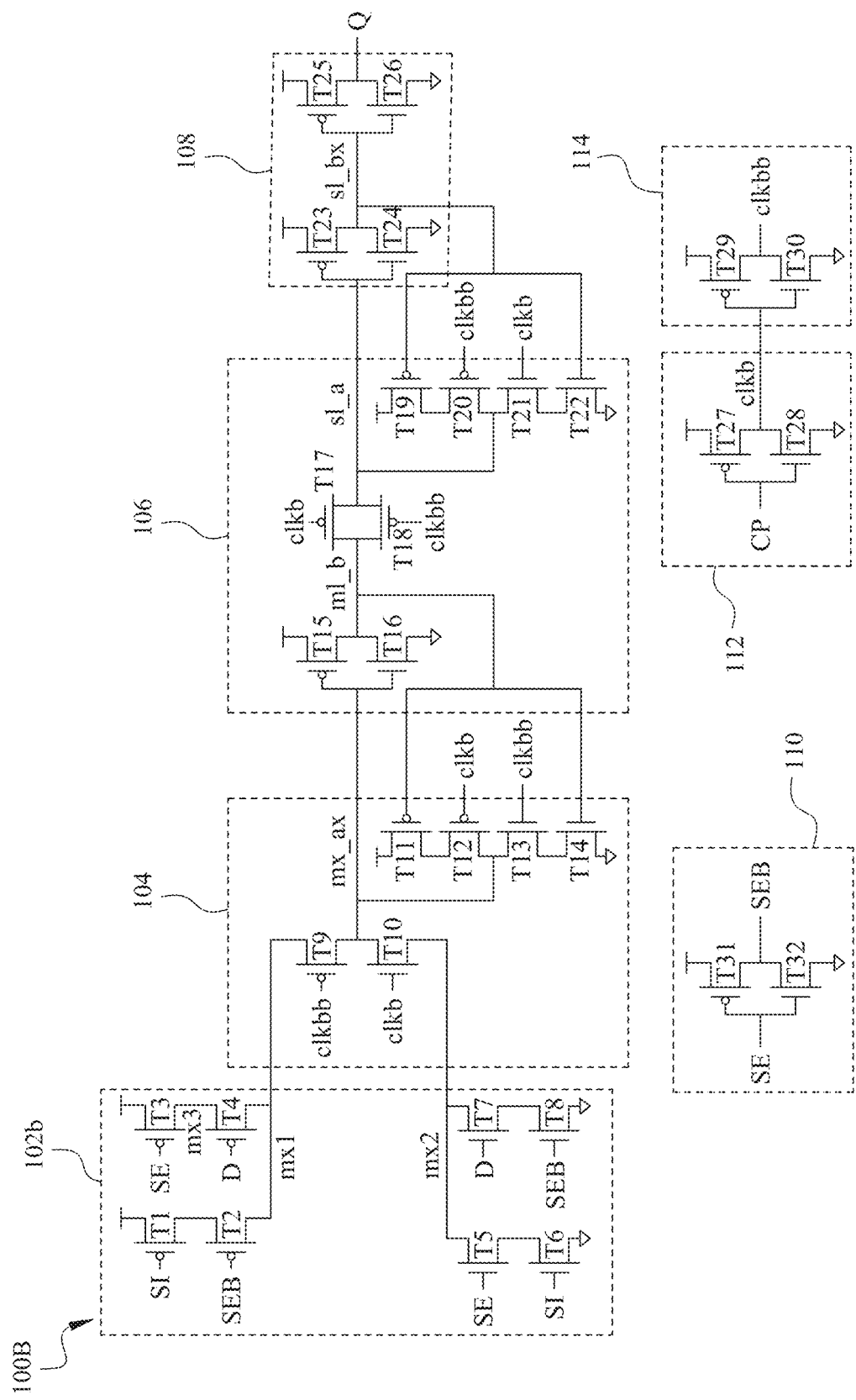
FIG. 1B is a circuit diagram of an integrated circuit, in accordance with some embodiments.

FIG. 1B is a circuit diagram of an integrated circuit 100B, in accordance with some embodiments.

Integrated circuit 100B is a variation of integrated circuit 100A. In comparison with integrated circuit 100A, a multiplexer 102b of FIG. 1B replaces multiplexer 102a, and similar detailed description is therefore omitted. For example, in comparison with multiplexer 102a of FIG. 1A, the positions of transistors T1 and T2 in multiplexer 102b of FIG. 1B are swapped with each other, the positions of transistors T3 and T4 in multiplexer 102b are swapped with each other, the positions of transistors T5 and T6 in in multiplexer 102b are swapped with each other, and the positions of transistors T7 and T8 in in multiplexer 102b are swapped with each other.

A source terminal of transistor T1 is coupled to the voltage supply VDD. A drain terminal of transistor T1 is coupled to a source terminal of transistor T2.

A source terminal of transistor T3 is coupled to the voltage supply VDD. A drain terminal of transistor T3 is coupled to a source terminal of transistor T4.

A source terminal of transistor T6 is coupled to the reference voltage supply VSS. A drain terminal of transistor T6 is coupled to a source terminal of transistor T5.

A source terminal of transistor T8 is coupled to the reference voltage supply VSS. A drain terminal of transistor T8 is coupled to a source terminal of transistor T7.

Each of the source terminal of transistor T9, the drain terminal of transistor T2 and the drain terminal of transistor T4 are coupled together. Signal mx1 is the signal of at least the source terminal of transistor T9, the drain terminal of transistor T2 or the drain terminal of transistor T4.

Each of the source terminal of transistor T10, the drain terminal of transistor T5 and the drain terminal of transistor T7 are coupled together. Signal mx2 is the signal of at least the source terminal of transistor T10, the drain terminal of transistor T5 or the drain terminal of transistor T7.

Other configurations, arrangements or other circuits in integrated circuit 100B are within the scope of the present disclosure.

Figure 2A:
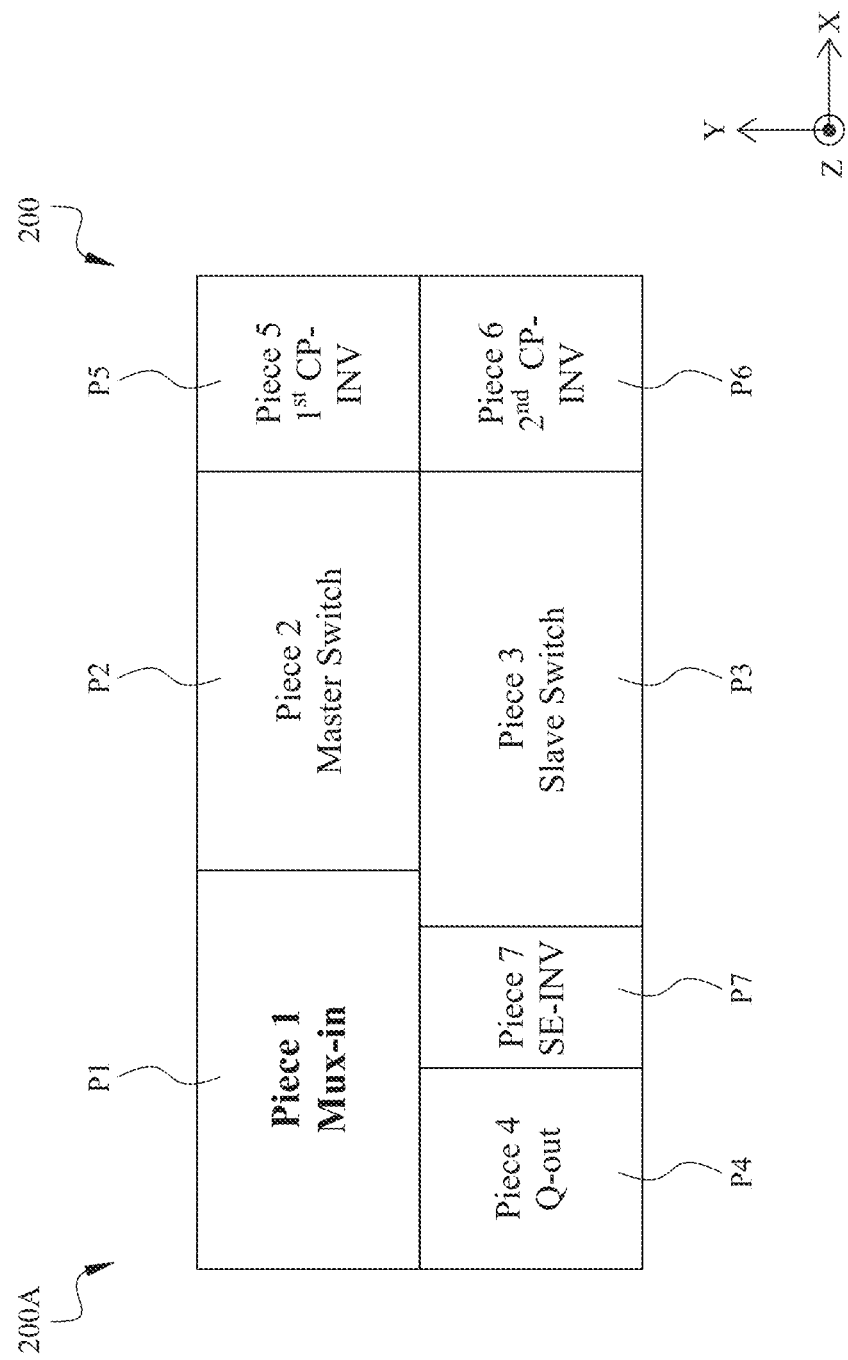
FIG. 2A is a diagram of a floorplan of an integrated circuit, in accordance with some embodiments.

FIG. 2A is a diagram of a floorplan 200A of an integrated circuit, in accordance with some embodiments.

In some embodiments, floorplan 200A is a floorplan of integrated circuit 100A of FIG. 1A or integrated circuit 100B of FIG. 1B. In some embodiments, floorplan 200A corresponds to the layout diagram 200 shown in FIGS. 2B-2G.

Floorplan 200A includes a multiplexer region P1, a latch region P2, a latch region P3, an output region P4, an inverter region P5, an inverter region P6 and an inverter region P7.

In some embodiments, multiplexer region P1 corresponds to multiplexer 102a or 102b, latch region P2 corresponds to latch 104, latch region P3 corresponds to latch 106, output region P4 corresponds to corresponds to output circuit 108, inverter region P5 corresponds to inverter 110, inverter region P6 corresponds to inverter 112, and inverter region P7 corresponds to inverter 114, and similar detailed description is therefore omitted.

Floorplan 200A has two rows extending in a first direction X, and being separated from each other in a second direction Y. In some embodiments, the second direction Y is different from the first direction X.

Each of multiplexer region Pl, latch region P2 and inverter region P5 are in a first row. Latch region P2 is between multiplexer region P1 and inverter region P5.

Each of output region P4, inverter region P7, latch region P3 and inverter region P6 are in a second row.

Inverter region P7 and latch region P3 are between output region P4 and inverter region P6. Inverter region P7 is between output region P4 and latch region P3. Latch region P3 is between inverter region P7 and inverter region P6. Inverter region P7 is adjacent to each of output region P4 and latch region P3. In some embodiments, adjacent elements are directly next to each other.

Figure 2B:
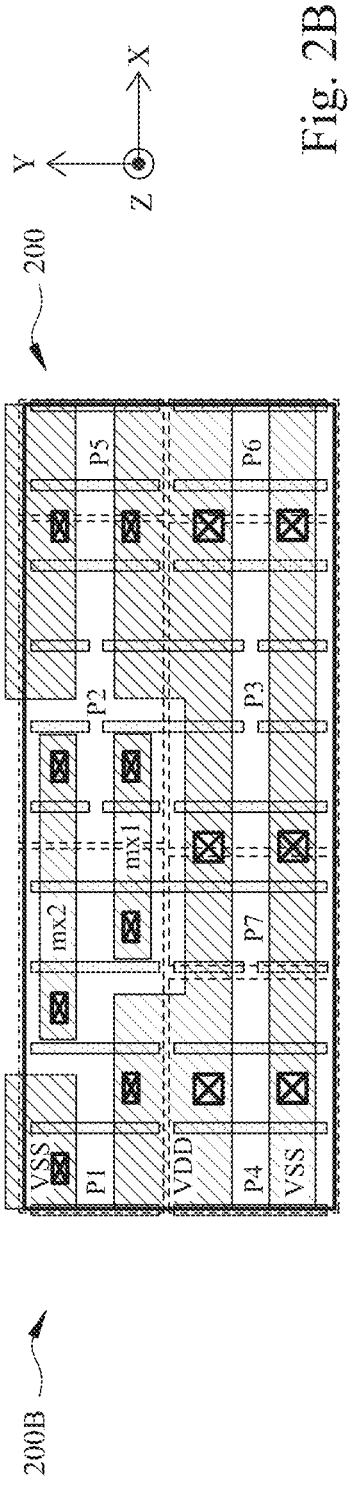
FIGS. 2B-2D are corresponding diagrams of corresponding portions of a layout design divided into regions of a floorplan, simplified for ease of illustration.
Figure 2C:
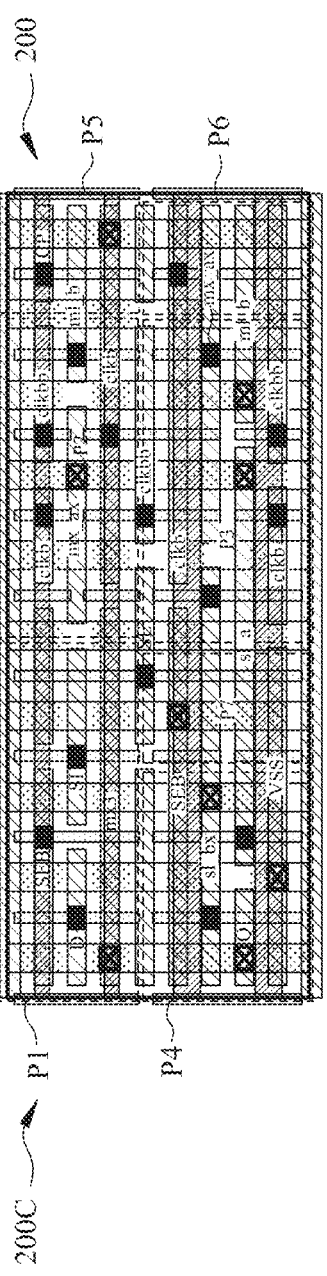
Figure 2D:
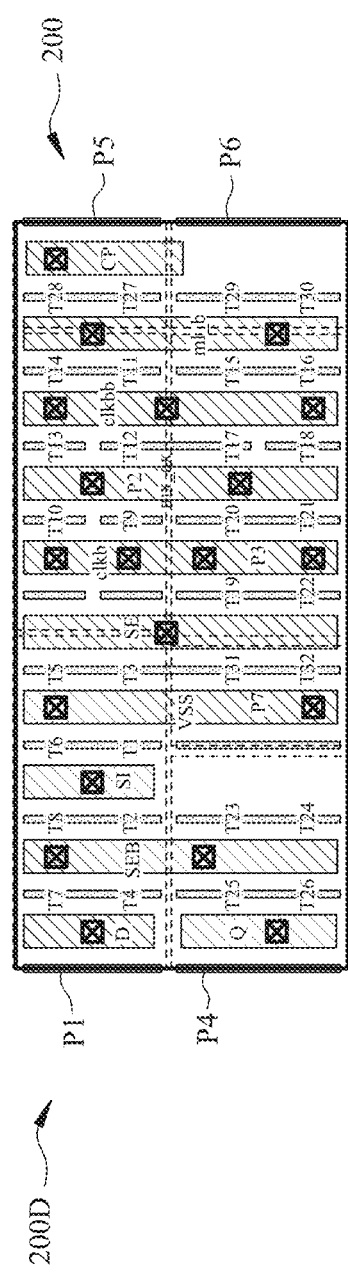

FIGS. 2B-2D are corresponding diagrams of corresponding portions 200B-200D of a layout design 200 divided into the regions of floorplan 200A, simplified for ease of illustration.

The layout design 200 is divided into the regions of the floorplan 200A.

Layout design 200 is a layout diagram of integrated circuit 100A of FIG. 1A.

Portion 200B includes one or more features of layout design 200 of a gate (POLY) level, a backside metal 0 (BMO) level and a via backside (VB) level.

Portion 200C includes one or more features of layout design 200 of an active level or an oxide diffusion (OD) level, the POLY level, a metal over diffusion (MD) level, a metal 0 (M0) level, a via over gate (VG) level and a via over diffusion (VD) level.

Portion 200D includes one or more features of layout design 200 of the POLY level, a metal 1 (M1) level and a via 0 (V0) level.

Figure 2E:
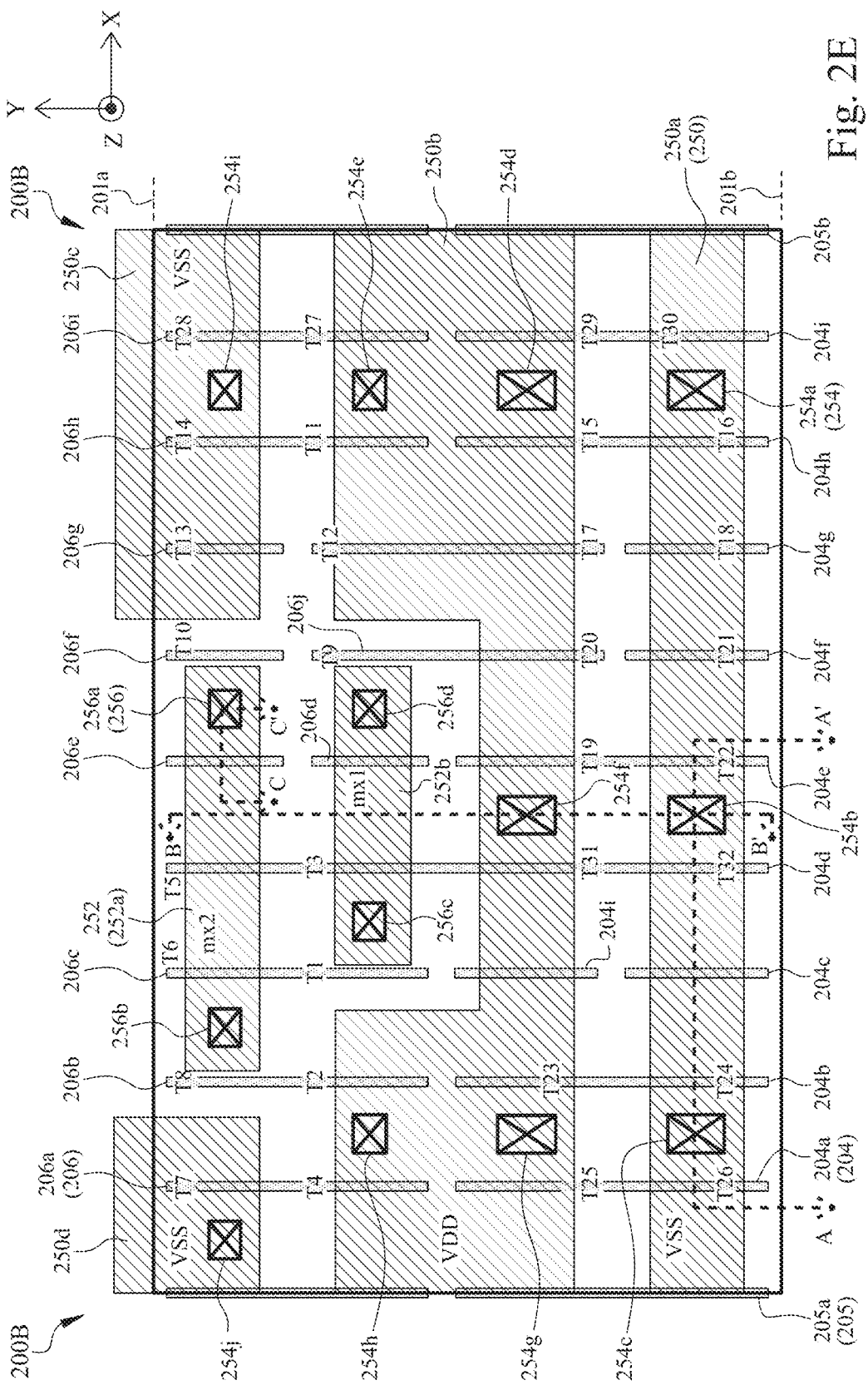
FIGS. 2E-2G are corresponding diagrams of corresponding portions of layout design, simplified for ease of illustration.
Figure 2F:
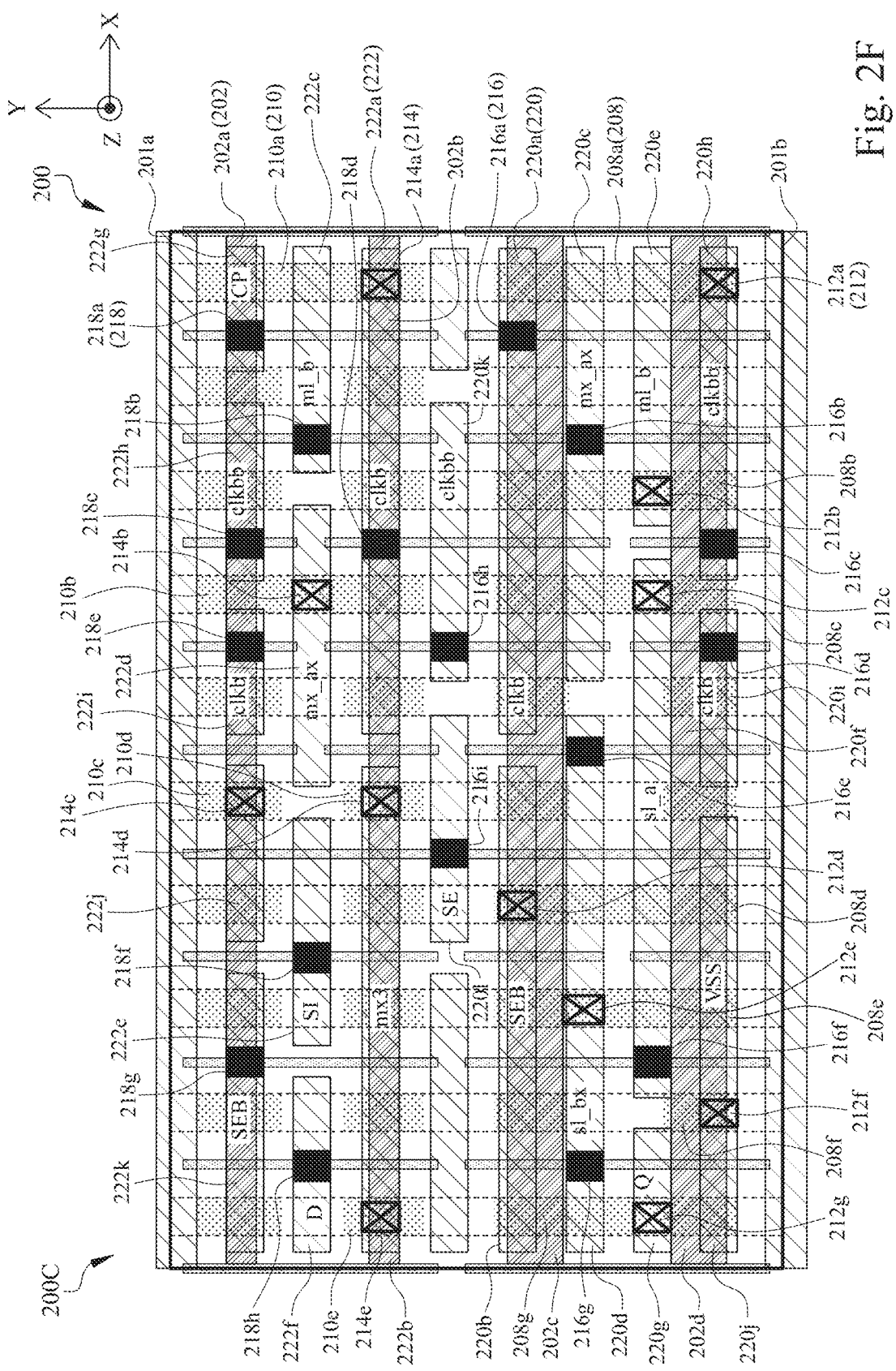
Figure 2G:
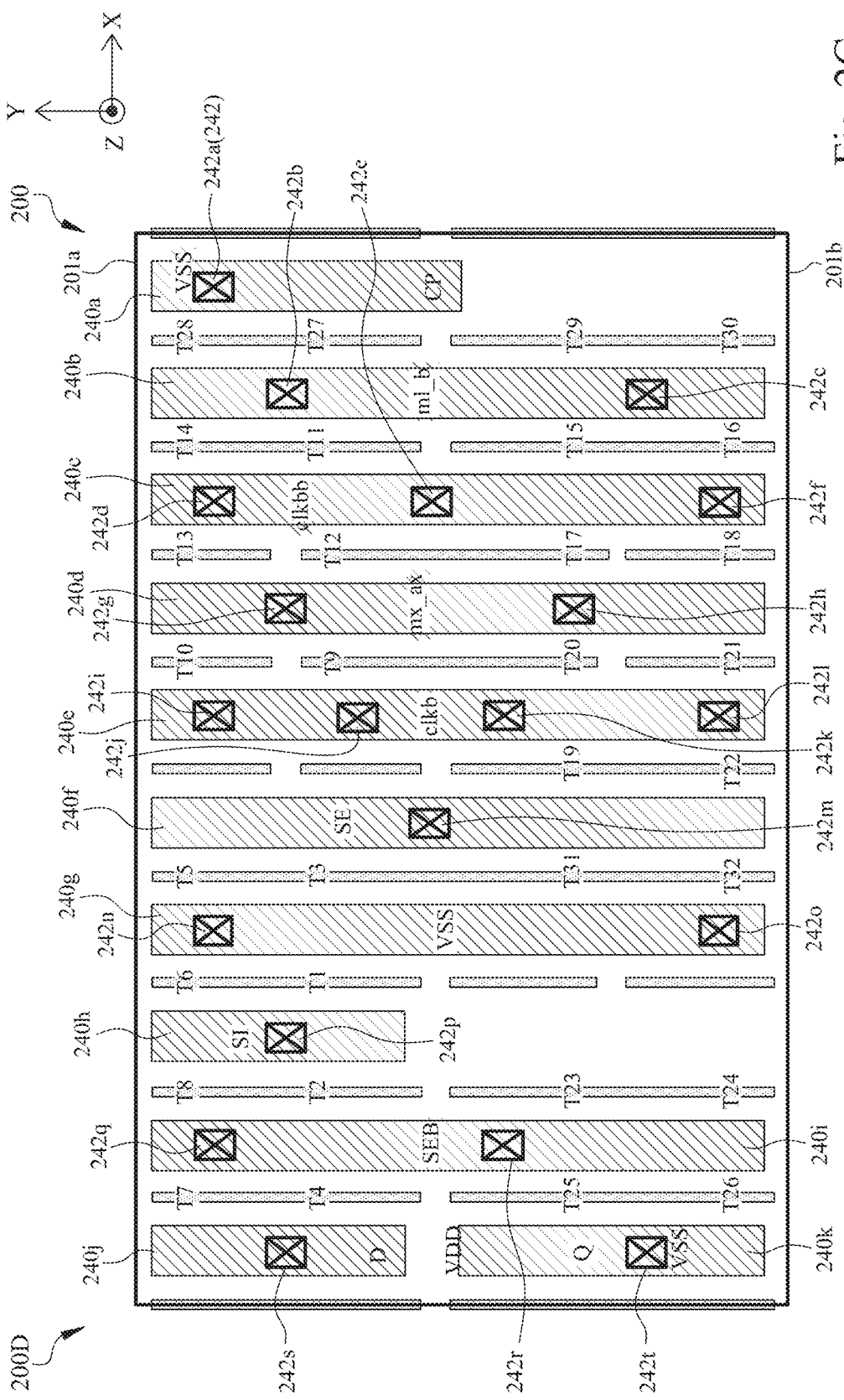

FIGS. 2E-2G are corresponding diagrams of corresponding portions 200B-200D of layout design 200, simplified for ease of illustration.

For ease of illustration, some of the labeled elements of one or more of FIGS. 1A-1B, 2A-2G, 3A-3F, 4A-4C, 5A-5B, 6A-6G, 7A-7C, 8A-8D, 9A-9B, 10A-10G, 11A-11C and 12A-12C are not shown.

Layout design 200 includes one or more features of the BM0 level, the VB level, the OD level, the POLY level, the MD level, the M0 level, the VG level, the VD level, the M1 level and the V0 level. In some embodiments, at least layout design 200, 600 or 1000 includes additional elements not shown in FIGS. 2A-2G, 6A-6G or 10A-10G.

Layout design 200 is usable to manufacture integrated circuit 300 of FIGS. 3A-3F.

Layout design 200 has a cell boundary 201a, a cell boundary 201b and a mid-point (not labelled) that extend in the first direction X. The mid-point is equidistant from cell boundary 201a and cell boundary 20 1b. In some embodiments, layout design 200 abuts other cell layout designs (not shown) along cell boundaries 201a and 201b, and along cell boundaries (not labelled) that extend in the second direction Y.

In some embodiments, at least layout design 200, 600 (FIGS. 6A-6G) or 1000 (FIGS. 10A-10G) is a standard cell layout design.

Layout design 200 includes one or more active region layout patterns 202a, 202b, 202c or 202d (collectively referred to as a "set of active region patterns 202") extending in the first direction X.

Embodiments of the present disclosure use the term "layout pattern" which is hereinafter also referred to as "patterns" in the remainder of the present disclosure for brevity.

Active region patterns 202a, 202b, 202c or 202d of the set of active region patterns 202 are separated from one another in the second direction Y.

The set of active region patterns 202 is usable to manufacture a corresponding set of active regions 302 of integrated circuit 300, 400, 700, 800, 1100 or 1200. In some embodiments, the set of active regions 302 are located on the front-side 303a of integrated circuit 300, 400, 700, 800, 1100 or 1200. In some embodiments, the set of active regions 302 correspond to source and drain regions of one or more finFET transistors, nanosheet transistors or nanowire transistors.

In some embodiments, active region patterns 202a, 202b, 202c, 202d are usable to manufacture corresponding active regions 302a, 302b, 302c, 302d of the set of active regions 302 of integrated circuit 300, 400, 700, 800, 1100 or 1200.

In some embodiments, the set of active region patterns 202 is referred to as an oxide diffusion (OD) region which defines the source or drain diffusion regions of at least integrated circuit 300, 400, 700, 800, 1100 or 1200 or layout design 200, 600 or 1000.

In some embodiments, active region patterns 202a and 202d are usable to manufacture source and drain regions of NMOS transistors of integrated circuits 300, 400, 700, 800, 1100 or 1200, and active region patterns 202b and 202c are usable to manufacture source and drain regions of PMOS transistors of integrated circuits 300, 400, 700, 800, 1100 or 1200.

In some embodiments, active region patterns 202a and 202d are usable to manufacture source and drain regions of PMOS transistors of integrated circuits 300, 400, 700, 800, 1100 or 1200, and active region patterns 202b and 202c are usable to manufacture source and drain regions of NMOS transistors of integrated circuits 300, 400, 700, 800, 1100 or 1200.

In some embodiments, the set of active region patterns 202 is located on a first layout level. In some embodiments, the first layout level corresponds to an active level or an OD level of one or more of layout designs 200, 600 or 1000 or integrated circuits 300, 400, 700, 800, 1100 or 1200. In some embodiments, the OD level is above the BM level.

Other configurations, arrangements on other layout levels or quantities of patterns in the set of active region patterns 202 are within the scope of the present disclosure.

Layout design 200 further includes one or more gate patterns 204a, 204b, 204c, 204d, 204e, 204f, 204g, 204h, 204i or 204j (collectively referred to as a "set of gate patterns 204"), one or more gate patterns 205a or 205b (collectively referred to as a "set of dummy gate patterns 205") or one or more gate patterns 206a, 206b, 206c, 206d, 206e, 206f, 206g, 206h, 206i or 206j (collectively referred to as a "set of gate patterns 204") extending in the second direction Y.

The set of dummy gate patterns 205 is usable to manufacture a corresponding set of dummy gates 305 of integrated circuit 300, 400, 700, 800, 1100 or 1200. The set of gate patterns 204 is usable to manufacture a corresponding set of gates 304 of integrated circuit 300, 400, 700, 800, 1100 or 1200. The set of gate patterns 206 is usable to manufacture a corresponding set of gates 306 of integrated circuit 300, 400, 700, 800, 1100 or 1200.

In some embodiments, dummy gate patterns 205a, 205b are usable to manufacture corresponding dummy gates 305a, 305b of the set of dummy gates 305 of integrated circuit 300, 400, 700, 800, 1100 or 1200.

In some embodiments, gate patterns 204a, 204b, 204c, 204d, 204e, 204f, 204g, 204h or 204i are usable to manufacture corresponding gates 304a, 304b, 304c, 304d, 304e, 304f, 304g, 304h or 304i of the set of gates 304 of integrated circuit 300, 400, 700, 800, 1100 or 1200.

In some embodiments, gate patterns 206a, 206b, 206c, 206d, 206e, 206f, 206g, 206h or 206i are usable to manufacture corresponding gates 306a, 306b, 306c, 306d, 306e, 306f, 306g, 306h or 306i of the set of gates 306 of integrated circuit 300, 400, 700, 800, 1100 or 1200.

In some embodiments, each of the gate patterns in the set of gate patterns 204 and 206 is shown in FIGS. 2B-2G with labels "T1-T32" that identify corresponding transistors of FIGS. 1A-1B manufactured by the corresponding gate pattern in FIGS. 2B-2G, and are omitted for brevity.

The set of gate patterns 204 is above the set of active region patterns 202, a set of conductive feature patterns 250 and a set of conductive feature patterns 252.

The set of gate patterns 204 is positioned on a second layout level different from the first layout level. In some embodiments, the second layout level is different from the first layout level. In some embodiments, the second layout level corresponds to the POLY level of one or more of layout designs 200, 600 or 1000 or integrated circuits 300, 400, 700, 800, 1100 or 1200. In some embodiments, the POLY level is above the OD level and the BM level.

Other configurations, arrangements on other layout levels or quantities of patterns in the set of gate patterns 204 are within the scope of the present disclosure.

Layout design 200 further includes one or more contact patterns 208a, 208b, 208c, . . . , 208f (collectively referred to as a "set of contact patterns 208") and one or more contact patterns 210a, 210b, 210c, . . . , 210e (collectively referred to as a "set of contact patterns 210") extending in the second direction Y.

Each of the contact patterns of the set of contact patterns 208 is separated from an adjacent contact pattern of the set of contact patterns 208 in at least the first direction X or the second direction Y. Each of the contact patterns of the set of contact patterns 210 is separated from an adjacent contact pattern of the set of contact patterns 210 in in at least the first direction X or the second direction Y. For ease of illustration, one or more contact patterns of the set of contact patterns 208 or contact patterns of the set of contact patterns 210 are not labelled.

The set of contact patterns 208 correspond to contact patterns between cell boundary 201b and the mid-point. The set of contact patterns 210 correspond to contact patterns between cell boundary 201a and the mid-point.

The set of contact patterns 208 is usable to manufacture a corresponding set of contacts 308 of integrated circuit 300, 400, 700, 800, 1100 or 1200. The set of contact patterns 210 is usable to manufacture a corresponding set of contacts 310 of integrated circuit 300, 400, 700, 800, 1100 or 1200.

In some embodiments, contact pattern 208a, 208b, 208c, ..., 208o of the set of contact patterns 208 is usable to manufacture corresponding contact 308a, 308b, 308c, ..., 308o of the set of contact patterns 308.

In some embodiments, contact pattern 210a, 210b, 210c, ..., 210u of the set of contact patterns 210 is usable to manufacture corresponding contact 310a, 310b, 310c, ..., 310u of the set of contact patterns 310. In some embodiments, the set of contact patterns 208 or 210 is also referred to as a set of metal over diffusion (MD) patterns.

In some embodiments, at least one of contact pattern 208a, 208b, 208c, ..., 208o of the set of contact patterns 208 is usable to manufacture source or drain terminals of one of the NMOS or PMOS transistors of integrated circuit 100A-100B, 300, 400, 500A-500B, 700, 800, 900A-900B, 1100 or 1200, at least one of contact pattern 210a, 210b, 210c, ..., 210u of the set of contact patterns 210 is usable to manufacture source or drain terminals of one of the NMOS or PMOS transistors of integrated circuit 100A-100B, 300, 400, 500A-500B, 700, 800, 900A-900B, 1100 or 1200.

In some embodiments, the set of contact patterns 208 and 210 overlap the set of active region patterns 202. The set of contact patterns is located on the second layout level. In some embodiments, the second layout level corresponds to the contact level or an MD level of one or more of layout designs 200, 600 or 1000 or integrated circuits 300, 400, 700, 800, 1100 or 1200.

Other configurations, arrangements on other layout levels or quantities of patterns in the set of contact patterns 208 or 210 are within the scope of the present disclosure.

Layout design 200 further includes one or more conductive feature patterns 220a, 220b, , ... 220l (collectively referred to as a "set of conductive feature patterns 220") or one or more conductive feature patterns 222a, 222b, , ... 222k (collectively referred to as a "set of conductive feature patterns 222") extending in the first direction X.

The set of conductive feature patterns 220 is usable to manufacture a corresponding set of conductors 320 of integrated circuit 300, 400, 700, 800, 1100 or 1200. The set of conductive feature patterns 222 is usable to manufacture a corresponding set of conductors 322 of integrated circuit 300, 400, 700, 800, 1100 or 1200.

Conductive feature patterns 220a, 220b, , ... 220l are usable to manufacture corresponding conductors 320a, 320b, , ... 320l of integrated circuit 300, 400, 700, 800, 1100 or 1200. Conductive feature patterns 222a, 222b, , ... 222l are usable to manufacture corresponding conductors 322a, 322b, , ... 322l of integrated circuit 300, 400, 700, 800, 1100 or 1200.

In some embodiments, the set of conductive feature patterns 220 or the set of conductive feature patterns 222 are located on a third layout level. In some embodiments, the third layout level is different from the first layout level and the second layout level. In some embodiments, the third layout level corresponds to the M0 level of one or more of layout designs 200, 600 or 1000 or integrated circuits 300, 400, 700, 800, 1100 or 1200. In some embodiments, the M0 level is above the OD level, the BPR level, the MD level and the POLY level.

In some embodiments, the set of conductive feature patterns 220 correspond to 4 M0 routing tracks and the set of conductive feature patterns 222 correspond to 3 M0 routing tracks. Other numbers of M0 routing tracks are within the scope of the present disclosure.

Other configurations, arrangements on other layout levels or quantities of patterns in the set of conductive feature patterns 220 are within the scope of the present disclosure.

Layout design 200 further includes one or more via patterns 212a, 212b, ... 212g (collectively referred to as a "set of via patterns 212") or one or more via patterns 214a, 214b, ... 214e (collectively referred to as a "set of via patterns 214").

The set of via patterns 212 is usable to manufacture a corresponding set of vias 312 of integrated circuit 300, 400, 700, 800, 1100 or 1200. The set of via patterns 214 is usable to manufacture a corresponding set of vias 314 of integrated circuit 300, 400, 700, 800, 1100 or 1200.

In some embodiments, via patterns 212a, 212b, ... 212g of the set of via patterns 212 are usable to manufacture corresponding vias 312a, 312b, ... 312g of the set of vias 312 of integrated circuit 300, 400, 700, 800, 1100 or 1200. In some embodiments, via patterns 214a, 214b, ... 214e of the set of via patterns 214 are usable to manufacture corresponding vias 314a, 314b, ... 314e of the set of vias 314 of integrated circuit 300, 400, 700, 800, 1100 or 1200.

In some embodiments, the set of via patterns 212 is between the set of active region patterns 202 and the set of contact patterns 208. In some embodiments, the set of via patterns 214 is between the set of active region patterns 202 and the set of contact patterns 210.

The set of via patterns 212 or 214 is positioned at a via over diffusion (VD) level of one or more of layout designs 200, 600 or 1000 or integrated circuits 300, 400, 700, 800, 1100 or 1200. In some embodiments, the VD level is above the MD, OD level and the BPR level. In some embodiments, the VD level is between the MD level and the M0 level. In some embodiments, the VD level is between the second layout level and the third layout level. Other layout levels are within the scope of the present disclosure.

Other configurations, arrangements on other layout levels or quantities of patterns in at least set of via patterns 212 or 214 are within the scope of the present disclosure.

Layout design 200 further includes one or more via patterns 216a, 216b, ... 216i (collectively referred to as a "set of via patterns 216") or one or more via patterns 218a, 218b, ... 218h (collectively referred to as a "set of via patterns 218").

The set of via patterns 216 is usable to manufacture a corresponding set of vias 316 of integrated circuit 300, 400, 700, 800, 1100 or 1200. The set of via patterns 218 is usable to manufacture a corresponding set of vias 318 of integrated circuit 300, 400, 700, 800, 1100 or 1200.

In some embodiments, via patterns 216a, 216b, ... 216i of the set of via patterns 216 are usable to manufacture corresponding vias 316a, 316b, ... 316i of the set of vias 316 of integrated circuit 300, 400, 700, 800, 1100 or 1200.

In some embodiments, via patterns 218a, 218b, . . . 218h of the set of via patterns 218 are usable to manufacture corresponding vias 318a, 318b, . . . 318h of the set of vias 318 of integrated circuit 300, 400, 700, 800, 1100 or 1200.

In some embodiments, the set of via patterns 216 are between the set of gate patterns 204 and the set of conductive feature patterns 220. In some embodiments, the set of via patterns 218 are between the set of gate patterns 206 and the set of conductive feature patterns 222.

The set of via patterns 216 or 218 is positioned at a via over gate (VG) level of one or more of layout designs 200, 600 or 1000 or integrated circuits 300, 400, 700, 800, 1100 or 1200. In some embodiments, the VG level is above the OD level, the BPR level, the MD level and the POLY level. In some embodiments, the VG level is between the POLY level and the M0 level. In some embodiments, the VG level is between the second layout level and the third layout level. Other layout levels are within the scope of the present disclosure.

Other configurations, arrangements on other layout levels or quantities of patterns in at least set of via patterns 216 or 218 are within the scope of the present disclosure.

Layout design 200 further includes one or more conductive feature patterns 240a, 240b, . . . 240k (collectively referred to as a "set of conductive feature patterns 240") extending in the second direction Y.

The set of conductive feature patterns 240 is usable to manufacture a corresponding set of conductors 340 of integrated circuit 300, 400, 700, 800, 1100 or 1200. Conductive feature patterns 240a, 240b, . . . 240k are usable to manufacture corresponding conductors 340a, 340b, . . . 340k of integrated circuit 300, 400, 700, 800, 1100 or 1200.

In some embodiments, the set of conductive feature patterns 240 overlap the set of conductive feature patterns 220. In some embodiments, the set of conductive feature patterns 240 or the set of conductive feature patterns 222 are located on a fourth layout level. In some embodiments, the fourth layout level is different from the first layout level, the second layout level and the third layout level. In some embodiments, the fourth layout level corresponds to the M1 level of one or more of layout designs 200, 600 or 1000 or integrated circuits 300, 400, 700, 800, 1100 or 1200. In some embodiments, the M1 level is above the M0 level, the OD level, the BPR level, the MD level and the POLY level.

Other configurations, arrangements on other layout levels or quantities of patterns in the set of conductive feature patterns 240 are within the scope of the present disclosure.

Layout design 200 further includes one or more via patterns 242a, 242b, . . . 242t (collectively referred to as a "set of via patterns 242").

The set of via patterns 242 is usable to manufacture a corresponding set of vias 342 of integrated circuit 300, 400, 700, 800, 1100 or 1200. In some embodiments, via patterns 242a, 242b, . . . 242t of the set of via patterns 242 are usable to manufacture corresponding vias 342a, 342b, . . . 342t of the set of vias 342 of integrated circuit 300, 400, 700, 800, 1100 or 1200.

In some embodiments, the set of via patterns 242 are between the set of conductive feature patterns 240 and at least the set of conductive feature patterns 220 or the set of conductive feature patterns 222.

The set of via patterns 242 is positioned at a V0 level of one or more of layout designs 200, 600 or 1000 or integrated circuits 300, 400, 700, 800, 1100 or 1200. In some embodiments, the V0 level is above the M0 level, the OD level, the BPR level, the MD level and the POLY level. In some embodiments, the V0 level is between the M0 level and the M1 level. In some embodiments, the V0 level is between the third layout level and the fourth layout level. Other layout levels are within the scope of the present disclosure.

Other configurations, arrangements on other layout levels or quantities of patterns in at least set of via patterns 242 are within the scope of the present disclosure.

Layout design 200 further includes one or more conductive feature patterns 250a, 250b, 250c or 250d (collectively referred to as a "set of conductive feature patterns 250") extending in at least the second direction Y or the first direction X.

Each of conductive feature patterns 250a, 250b, 250c and 250d of the set of conductive feature patterns 250 are separated from each other in at least the second direction Y or the first direction X.

In some embodiments, the set of conductive feature patterns 250 are referred to as a "set of power rail patterns 250." In some embodiments, conductive feature pattern 250a, 250b, 250c or 250d are referred to as corresponding power rail pattern 250a, 250b, 250c or 250d.

The set of conductive feature patterns 250 is usable to manufacture a corresponding set of conductors 350 of integrated circuit 300, 400, 700, 800, 1100 or 1200. In some embodiments, the set of conductors 350 are referred to as a "set of power rails 350." In some embodiments, conductive feature pattern 250a, 250b, 250c or 250d is usable to manufacture corresponding conductor 350a, 350b, 350c or 350d of the set of conductors 350 of integrated circuit 300, 400, 700, 800, 1100 or 1200. In some embodiments, conductors 350a, 350b, 350c or 350d are referred to as corresponding power rails 350a, 350b, 350c or 350d. In some embodiments, the set of conductors 350 are located on the back-side 303b of integrated circuit 300.

The set of conductive feature patterns 250 is overlapped by the set of gate patterns 204 or 206 and the set of active region patterns 202. In some embodiments, the set of conductive feature patterns 250 is on a fifth layout level. In some embodiments, the fifth layout level is different from the first layout level, the second layout level, the third layout level and the fourth layout level. In some embodiments, the fifth layout level corresponds to a backside metal (BM) level of one or more of layout designs 200, 600 or 1000 or integrated circuits 300, 400, 700, 800, 1100 or 1200. In some embodiments, the BM level is below OD level, the POLY level, the MD level, the M0 level and the M1 level.

Other configurations, arrangements on other layout levels or quantities of patterns in the set of conductive feature patterns 250 are within the scope of the present disclosure.

Layout design 200 further includes one or more conductive feature patterns 252a or 252b (collectively referred to as a "set of conductive feature patterns 252") extending in the first direction X. Each of conductive feature patterns 252a, 252b of the set of conductive feature patterns 252 is separated from each other in at least the second direction Y.

In some embodiments, the set of conductive feature patterns 252 is referred to as a "set of signal line patterns 252." In some embodiments, conductive feature pattern 252a or 252b are referred to as corresponding signal line pattern 252a or 252b.

The set of conductive feature patterns 252 is usable to manufacture a corresponding set of conductors 352 of integrated circuit 300, 400, 700, 800, 1100 or 1200. In some embodiments, the set of conductors 352 are referred to as a "set of signal lines 352." In some embodiments, conductive feature pattern 252a or 252b is usable to manufacture corresponding conductor 352a or 352b of the set of conductors 352 of integrated circuit 300, 400, 700, 800, 1100 or

1200. In some embodiments, conductors 352*a* or 352*b* are referred to as corresponding signal lines 352*a* or 352*b*. In some embodiments, the set of conductors 352 is located on the back-side 303*b* of integrated circuit 300.

The set of conductive feature patterns 252 is overlapped by the set of gate patterns 204 or 206 and the set of active region patterns 202. In some embodiments, the set of conductive feature patterns 252 is on the fifth layout level.

Other configurations, arrangements on other layout levels or quantities of patterns in the set of conductive feature patterns 252 are within the scope of the present disclosure.

Layout design 200 further includes one or more via patterns 254*a*, 254*b*, . . . 254*j* (collectively referred to as a "set of via patterns 254") or one or more via patterns 256*a*, 256*b*, . . . 256*d* (collectively referred to as a "set of via patterns 256").

The set of via patterns 254 is usable to manufacture a corresponding set of vias 354 of integrated circuit 300, 400, 700, 800, 1100 or 1200. The set of via patterns 256 is usable to manufacture a corresponding set of vias 356 of integrated circuit 300, 400, 700, 800, 1100 or 1200.

In some embodiments, via patterns 254*a*, 254*b*, . . . 254*j* of the set of via patterns 254 are usable to manufacture corresponding vias 354*a*, 354*b*, . . . 354*j* of the set of vias 354 of integrated circuit 300, 400, 700, 800, 1100 or 1200.

In some embodiments, via patterns 256*a*, 256*b*, . . . 256*d* of the set of via patterns 256 are usable to manufacture corresponding vias 356*a*, 356*b*, . . . 356*d* of the set of vias 356 of integrated circuit 300, 400, 700, 800, 1100 or 1200.

In some embodiments, the set of via patterns 254 is between the set of active region patterns 202 and the set of conductive feature patterns 250. In some embodiments, the set of via patterns 256 is between the set of active region patterns 202 and the set of conductive feature patterns 252.

The set of via patterns 254 or 256 is positioned at a via backside (VB) level of one or more of layout designs 200, 600 or 1000 or integrated circuits 300, 400, 700, 800, 1100 or 1200. In some embodiments, the VB level is below the MD, OD level, and above the BM level. In some embodiments, the VB level is between the OD level and the BM level. In some embodiments, the VB level is between the first layout level and the fifth layout level. Other layout levels are within the scope of the present disclosure.

Other configurations, arrangements on other layout levels or quantities of patterns in at least set of via patterns 254 or 256 are within the scope of the present disclosure.

Other configurations, arrangements on other layout levels or quantities of patterns in layout design 200 are within the scope of the present disclosure.

FIGS. 3A-3F are diagrams of an integrated circuit 300, in accordance with some embodiments.

Figure 3A:
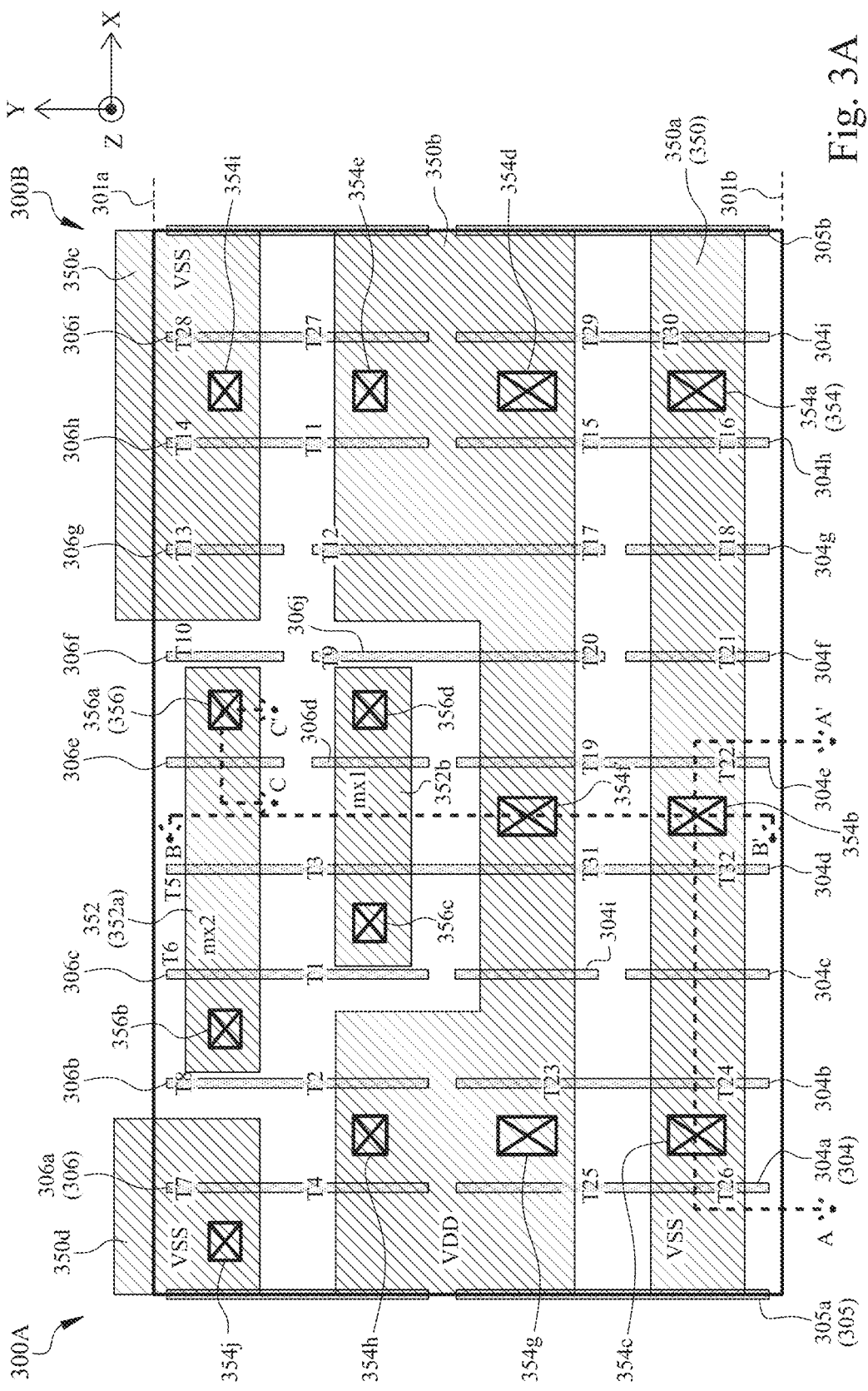
FIGS. 3A-3F are diagrams of an integrated circuit, in accordance with some embodiments.
Figure 3B:
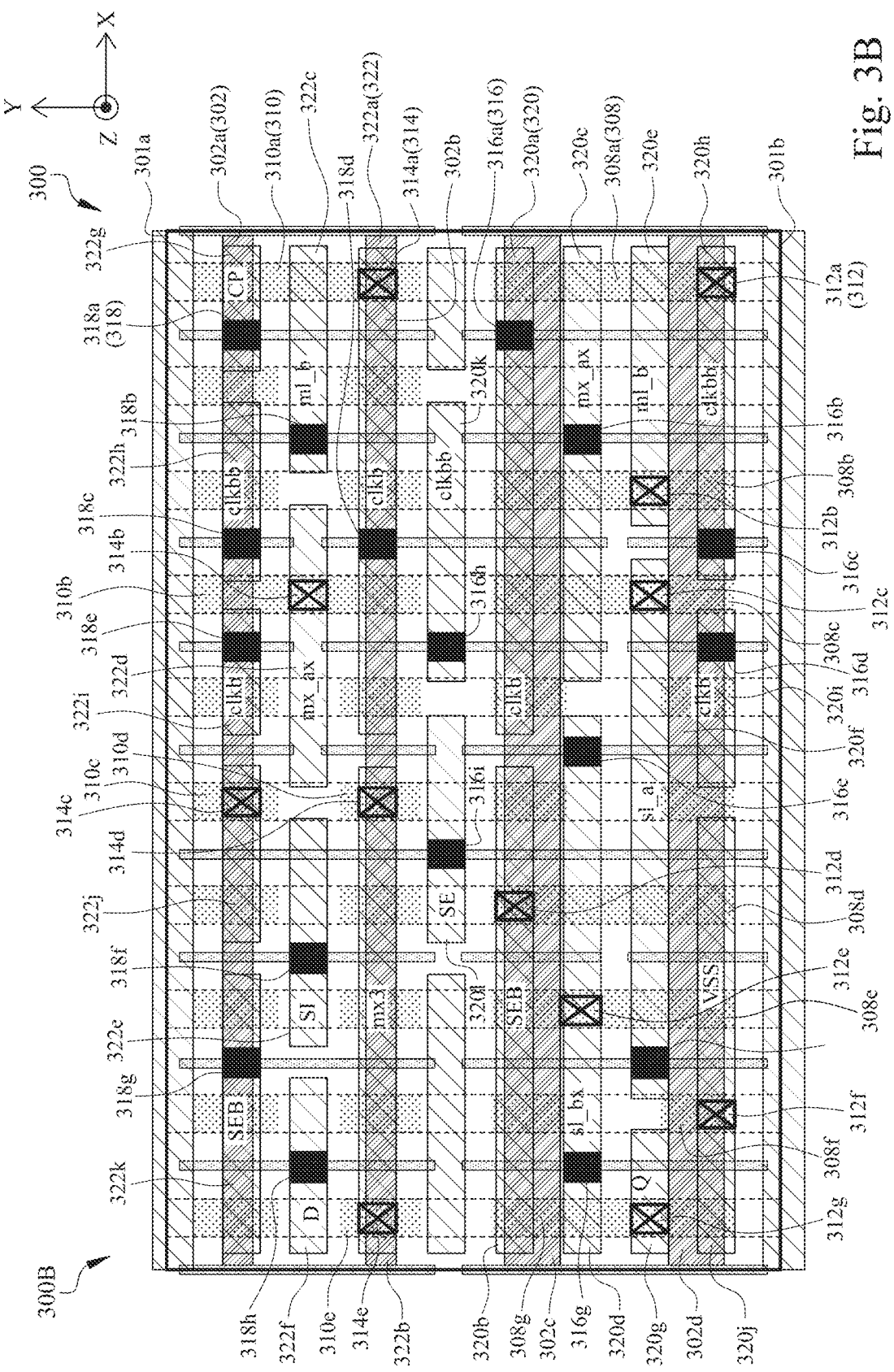
Figure 3C:
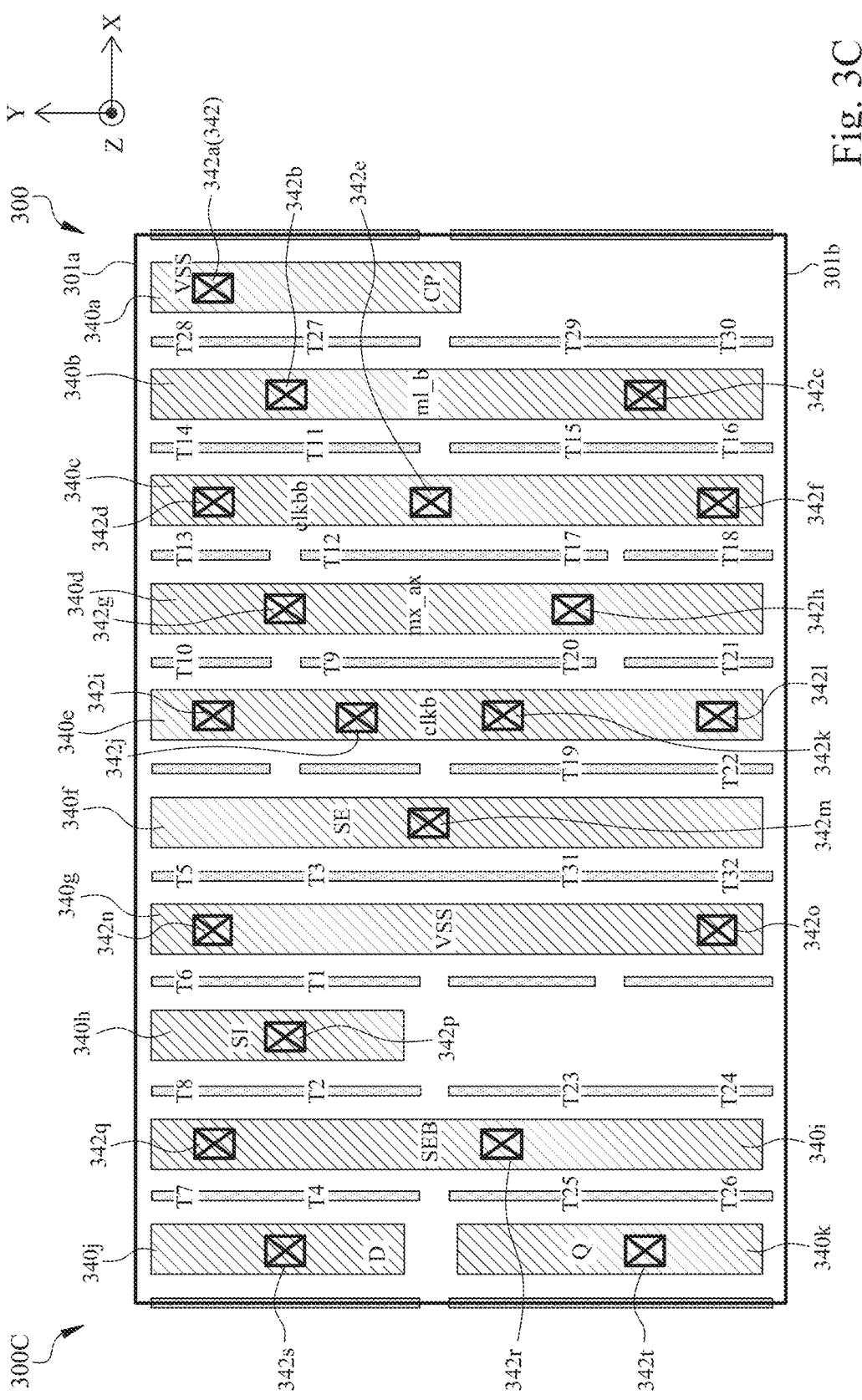

FIGS. 3A-3C are corresponding diagrams of corresponding portions 300A-300C of an integrated circuit 300, simplified for ease of illustration.

Portion 300A includes one or more features of integrated circuit 300 of the POLY level, the BMO level and the VB level. Portion 300A is manufactured by portion 200B.

Portion 300B includes one or more features of integrated circuit 300 of the OD level, the POLY level, the MD level, the M0 level, the VG level and the VD level. Portion 300B is manufactured by portion 200C.

Portion 300C includes one or more features of integrated circuit 300 of the POLY level, the M1 level and the V0 level. Portion 300C is manufactured by portion 200D.

Figure 3D:
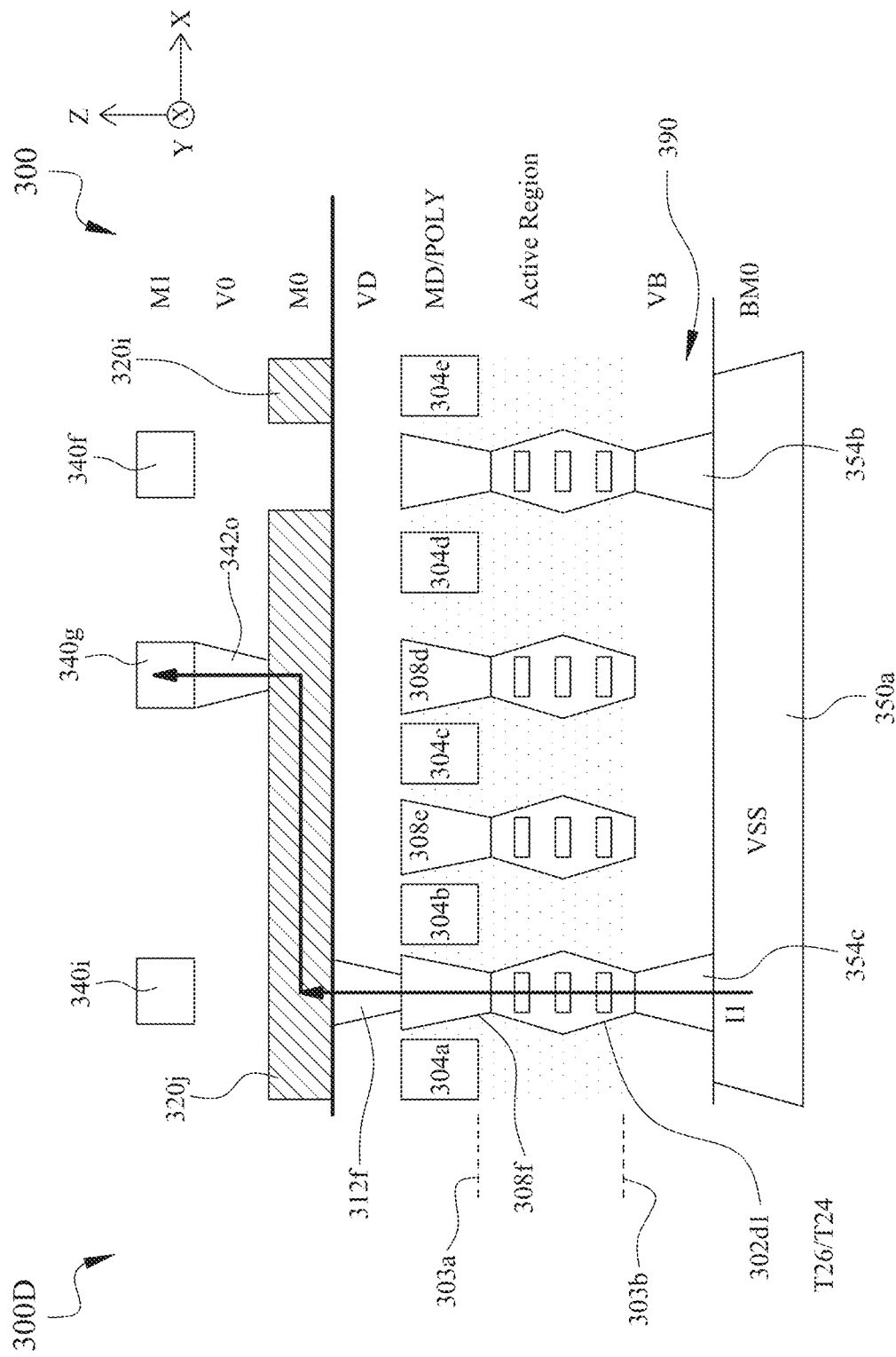
Figure 3E:
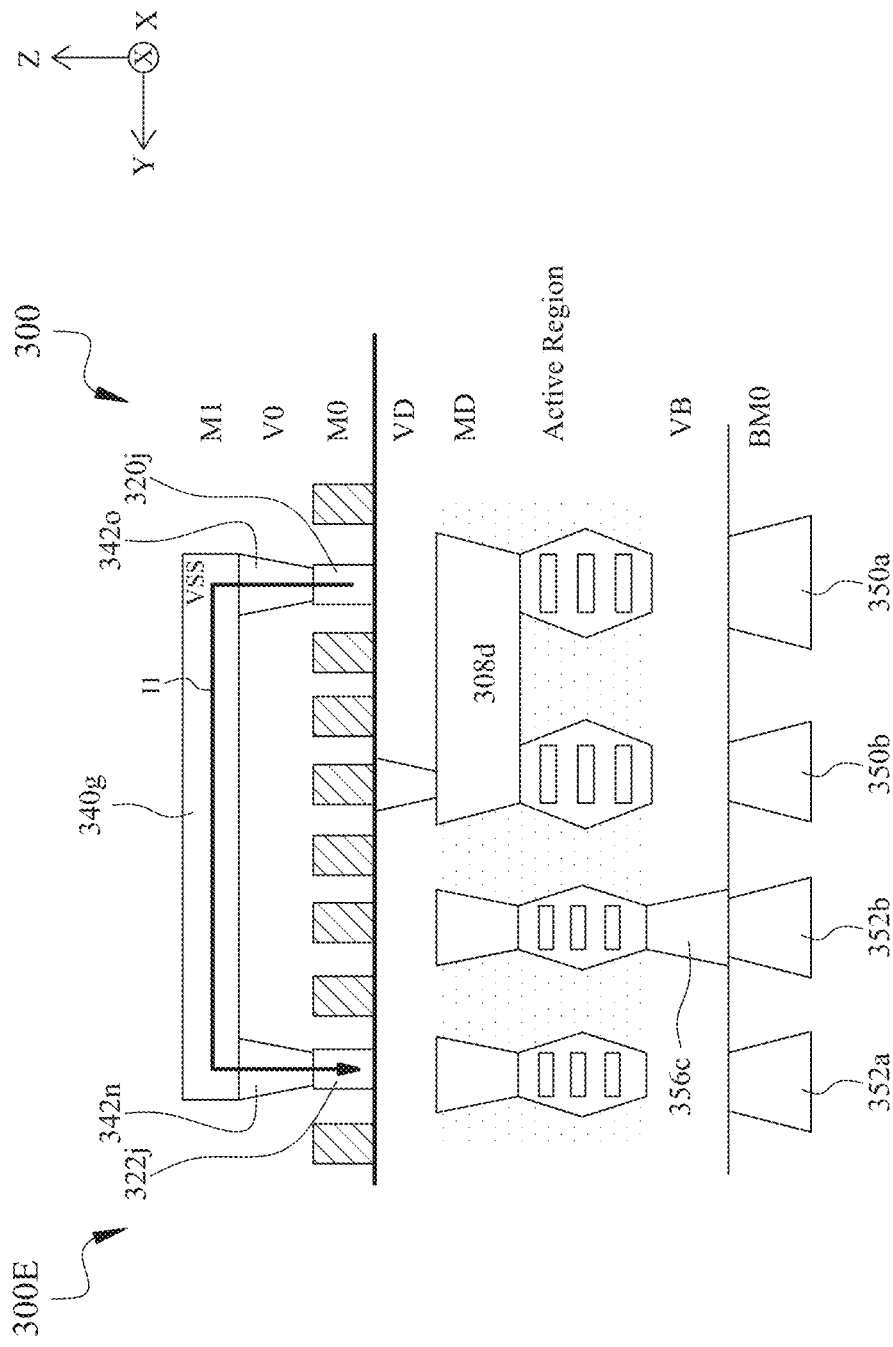
Figure 3F:
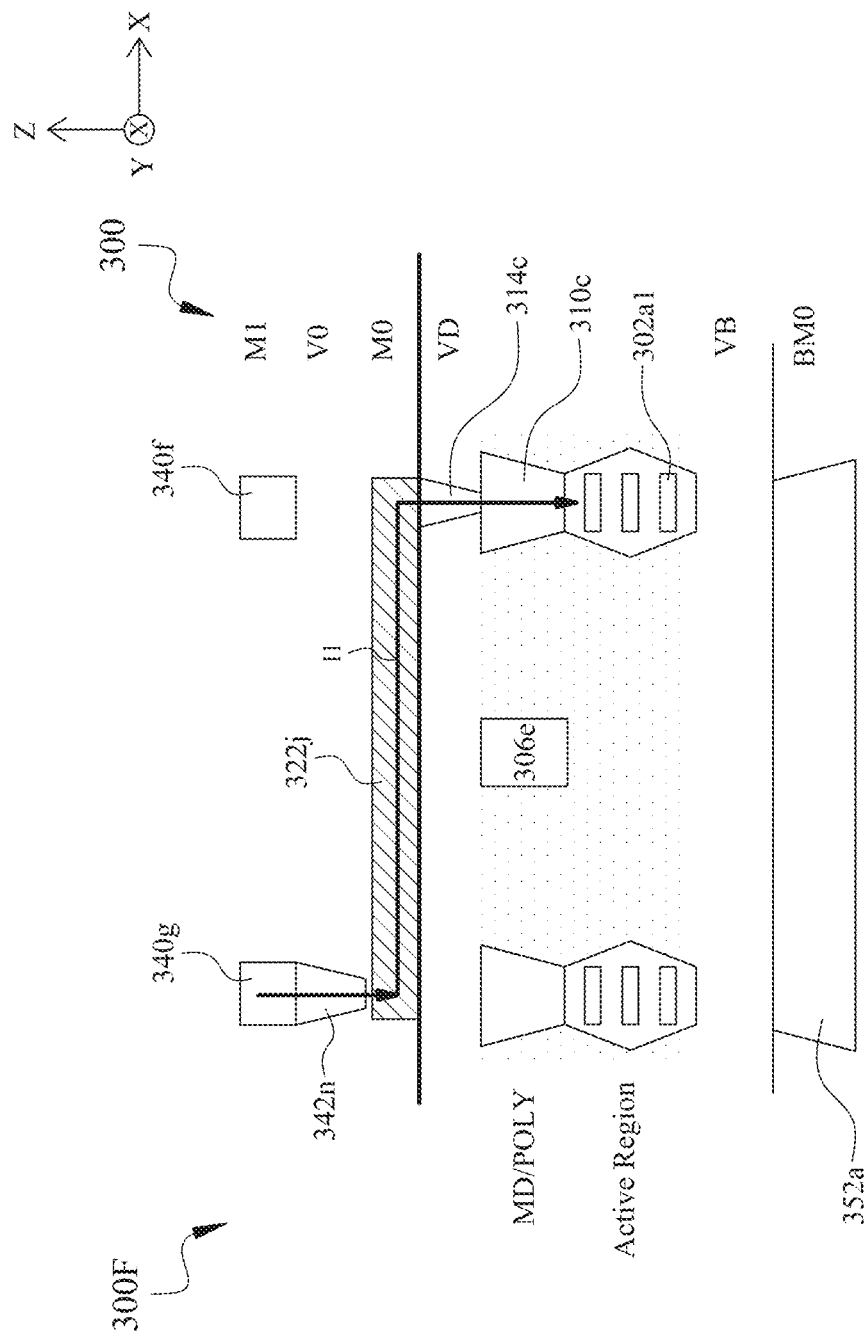

FIGS. 3D-3F are corresponding cross-sectional views of integrated circuit 300, in accordance with some embodiments. FIG. 3D is a cross-sectional view 300D of integrated circuit 300 as intersected by plane A-A', in accordance with some embodiments. FIG. 3E is a cross-sectional view 300E of integrated circuit 300 as intersected by plane B-B', in accordance with some embodiments.

FIG. 3F is a cross-sectional view 300F of integrated circuit 300 as intersected by plane C-C', in accordance with some embodiments. Components that are the same or similar to those in one or more of FIGS. 1A-1B, 2A-2G, 3A-3F, 4A-4C, 5A-5B, 6A-6G, 7A-7C, 8A-8D, 9A-9B, 10A-10G, 11A-11C and 12A-12C are given the same reference numbers, and detailed description thereof is thus omitted.

Integrated circuit 300 is manufactured by layout design 200. Structural relationships including alignment, lengths and widths, as well as configurations and layers of integrated circuit 300 are similar to the structural relationships and configurations and layers of layout design 200 of FIGS. 2B-2G, and similar detailed description will not be described in at least FIGS. 3A-3F, for brevity. For example, in some embodiments, at least one or more widths, lengths or pitches of layout design 200 is similar to corresponding widths, lengths or pitches of integrated circuit 300, and similar detailed description is omitted for brevity. For example, in some embodiments, at least cell boundary 201*a* or 201*b* or the mid-point of layout design 200 is similar to at least corresponding cell boundary 301*a* or 301*b* or the mid-point of integrated circuit 300, and similar detailed description is omitted for brevity.

Integrated circuit 300 includes at least the set of active regions 302, the set of dummy gates 305, the set of gates 304 and 306, the set of contacts 308, the set of contacts 310, the set of conductors 320, the set of conductors 322, the set of vias 312, the set of vias 314, the set of vias 316, the set of vias 318, the set of conductors 340, the set of vias 342, the set of conductors 350, the set of conductors 352, the set of vias 354, the set of vias 356, a substrate 390 and an insulating region 392.

The set of active regions 302 are embedded in substrate 390. Substrate 390 has a front-side 303*a* and a back-side 303*b* opposite from the front-side 303*a*. In some embodiments, at least the set of active regions 302, the set of gates 304 and 306 or the set of contacts 308 and 310 are formed in the front-side 303*a* of substrate 390.

In some embodiments, the set of active regions 302 corresponds to nanosheet structures (not labelled) of nanosheet transistors. In some embodiments, the set of active regions 302 include drain regions and source regions grown by an epitaxial growth process. In some embodiments, the set of active regions 302 include drain regions and source regions that are grown with an epitaxial material at the corresponding drain regions and source regions.

Other transistor types are within the scope of the present disclosure. For example, in some embodiments, the set of active regions 302 corresponds to nanowire structures (not shown) of nanowire transistors. In some embodiments, the set of active regions 302 corresponds to planar structures (not shown) of planar transistors. In some embodiments, the set of active regions 302 corresponds to fin structures (not shown) of finFETs.

In some embodiments, active regions 302*a* and 302*d* correspond to source and drain regions of NMOS transistors of integrated circuit 100A-100B, 300, 400, 500A-500B, 700, 800, 900A-900B, 1100 or 1200, and active regions 302*b* and 302*c* correspond to source and drain regions of PMOS transistors of integrated circuit 100A-100B, 300, 400, 500A-500B, 700, 800, 900A-900B, 1100 or 1200.

In some embodiments, active regions 302*a* and 302*d* correspond to source and drain regions of PMOS transistors of integrated circuit 100A-100B, 300, 400, 500A-500B, 700, 800, 900A-900B, 1100 or 1200, and active regions 302b and 302c correspond to source and drain regions of NMOS transistors of integrated circuit 100A-100B, 300, 400, 500A-500B, 700, 800, 900A-900B, 1100 or 1200.

In some embodiments, at least active region 302a or 302d is an N-type doped S/D region, and at least active region 302b or 302c is a P-type doped S/D region embedded in a dielectric material of substrate 390. In some embodiments, at least active region 302a or 302d is a P-type doped S/D region, and at least active region 302b or 302c is an N-type doped S/D region embedded in a dielectric material of substrate 390.

Other configurations, arrangements on other layout levels or quantities of structures in the set of active regions 302 are within the scope of the present disclosure.

Figure 13:
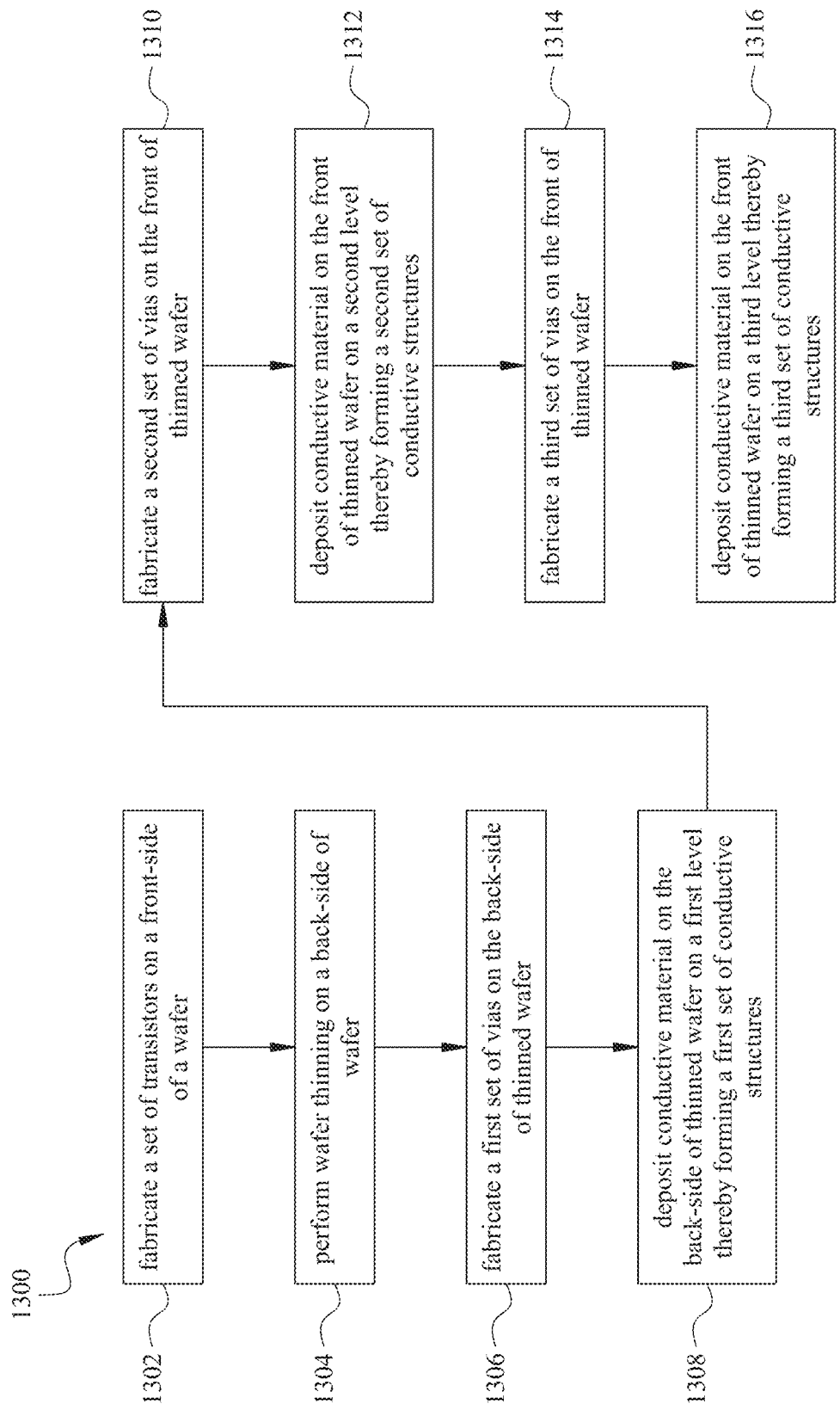
FIG. 13 is a flow chart of a method of forming or manufacturing an integrated circuit in accordance with some embodiments.

Insulating region 392 is configured to electrically isolate one or more elements of the set of active regions 302, the set of dummy gates 305, the set of gates 304 or 306, the set of contacts 308, the set of contacts 310, the set of conductors 320, the set of conductors 322, the set of vias 312, the set of vias 314, the set of vias 316, the set of vias 318, the set of conductors 340, the set of vias 342, the set of conductors 350, the set of conductors 352, the set of vias 354, the set of vias 356 from one another. In some embodiments, insulating region 392 includes multiple insulating regions deposited at different times from each other during method 1300 (FIG. 13). In some embodiments, insulating region is a dielectric material. In some embodiments, the dielectric material includes silicon dioxide, silicon oxy-nitride, or the like.

Other configurations, arrangements on other layout levels or other numbers of portions in insulating region 392 are within the scope of the present disclosure.

The set of gates 304 and 306 correspond to one or more gates of transistors T1-T42 of integrated circuits 100A-100B, 300, 400, 500A-500B, 700, 800, 900A-900B, 1100 or 1200. In some embodiments, each of the gates in the set of gates 304 and 306 are shown in FIGS. 3A-3F with labels "T1-T32" that identify corresponding transistors of FIGS. 1A-1B having corresponding gates in FIGS. 3A-3F, and are omitted for brevity.

In some embodiments, gate 304a is a gate of transistors T26 and T25, gate 304b is a gate of transistors T24 and T23, gate 304d is a gate of transistors T32, T31, T3 and T5, gate 304e is a gate of transistors T22 and T19, gate 304f is a gate of transistor T21, gate 304g is a gate of transistor T18, gate 304h is a gate of transistors T16 and T15 and gate 304i is a gate of transistors T30 and T29.

In some embodiments, gate 306a is a gate of transistors T7 and T4, gate 306b is a gate of transistors T8 and T2, gate 306c is a gate of transistors T6 and T1, gate 306f is a gate of transistor T10, gate 306g is a gate of transistor T13, gate 306h is a gate of transistors T14 and T11, gate 306i is a gate of transistors T28 and T27.

In some embodiments, at least gate 304c, 304j, 306d, and 306e are dummy gates. In some embodiments, a dummy gate is a gate of a non-functional transistor.

In some embodiments, at least gate 305a or 305b corresponds to a dummy gate. In some embodiments, at least gate 305a or 305b corresponds to a continuous poly on OD edge (CPODE) region or a poly on OD edge (PODE) region.

Other configurations, arrangements on other layout levels or quantities of gates in the set of gates 304, 305 and 306 are within the scope of the present disclosure.

Each contact of the set of contacts 308 or 310 corresponds to one or more drain or source terminals of transistors T1-T42 of integrated circuits 100A-100B, 300, 400, 500A-500B, 700, 800, 900A-900B, 1100 or 1200. In some embodiments, one or more contacts of the set of contacts 308 or 310 overlaps a pair of active regions of the set of active regions 302, thereby electrically coupling the pair of active regions of the set of active regions 302 and the source or drain of the corresponding transistors.

In some embodiments, contact 308a corresponds to the drain terminals of transistors T29 and T30, and electrically couples the drains of transistors T29 and T30 together.

In some embodiments, contact 308b corresponds to the drain terminals of transistors T15 and T16, and the source terminals of transistors T17 and T18, and electrically couples the drains of transistors T15 and T16 and the sources of transistors T17 and T18 together.

In some embodiments, contact 308c corresponds to the drain terminals of transistors T20, T21, T17 and T18, and electrically couples the drains of transistors T20, T21, T17 and T18 together.

In some embodiments, contact 308d corresponds to the drain terminals of transistors T31 and T32, and electrically couples the drains of transistors T31 and T32 together.

In some embodiments, contact 308e corresponds to the drain terminals of transistors T23 and T24, and electrically couples the drains of transistors T23 and T24 together.

In some embodiments, contact 308f corresponds to the source terminal of transistor T23.

In some embodiments, contact 308g corresponds to the drain terminals of transistors T25 and T26, and electrically couples the drains of transistors T25 and T26 together.

In some embodiments, contact 310a corresponds to the drain terminals of transistors T28 and T27, and electrically couples the drains of transistors T28 and T27 together.

In some embodiments, contact 310b corresponds to the drain terminals of transistors T9, T10, T12 and T13, and electrically couples the drains of transistors T9, T10, T12 and T13 together.

In some embodiments, contact 310c corresponds to the source terminal of transistor T5.

In some embodiments, contact 310d corresponds to the drain terminal of transistor T3.

In some embodiments, contact 310d corresponds to the source terminal of transistor T4.

The set of conductors 320 and 322 are M0 routing tracks. In some embodiments, the set of conductors 320 and 322 are routing tracks in other layers. In some embodiments, the set of conductors 322 corresponds to 3 M0 routing tracks, and conductors 320a-320j of the set of conductors 320 correspond to 4 M0 routing tracks. In some embodiments, conductors 320k and 320l are part of a shared M0 track shared between the set of conductors 320 and 322.

The set of vias 312 and 314 are configured to electrically couple a corresponding source or drain region of the set of active regions 302 to the set of conductors 320 or 322 by the set of contacts 308 or 310, and vice versa. The set of vias 312 and 314 are between the set of contacts 308 or 310 and the set of conductors 320 or 322.

The set of vias 316 and 318 are configured to electrically couple one or more gates of the set of gates 304 or 306 to the set of conductors 320 or 322, and vice versa. The set of vias 316 and 318 are between the set of gates 304 or 306 and the set of conductors 320 or 322.

The set of conductors 340 are M1 routing tracks. In some embodiments, the set of conductors 340 are routing tracks in other metal layers.

In some embodiments, conductor 340a is an input pin configured to receive clock signal CP, conductor 340f is an input pin configured to receive scan enable signal SE, conductor 340*h* is an input pin configured to receive scan in signal SI, conductor 340*j* is an input pin configured to receive data signal D, and conductor 340*k* is an output pin configured to output signal Q.

In some embodiments, conductor 340*b* is configured to route signal ml_B, conductor 340*c* is configured to route clock signal CLKBB, conductor 340*d* is configured to route signal mx_ax, conductor 340*e* is configured to route clock signal CLKB, conductor 340*i* is configured to route inverted scan enable signal SEB.

In some embodiments, conductor 340*g* is configured to route reference voltage VSS.

The set of vias 342 are configured to electrically couple one or more conductors of the set of conductors 340 to the set of conductors 320 or 322, and vice versa. The set of vias 342 are between the set of conductors 340 and the set of conductors 320 or 322.

The set of conductors 350 are configured to provide power to the set of active regions 302 from the back-side 303*b* of integrated circuits 300, 400, 700, 800, 1100 and 1200.

In some embodiments, the set of conductors 350 is configured to provide a first supply voltage of a voltage supply VDD or a second supply voltage of a reference voltage supply VSS to integrated circuit 300, 400, 700, 800, 1100 and 1200. In some embodiments, the first supply voltage is different from the second supply voltage.

In some embodiments, at least conductor 350*a*, 350*c* or 350*d* is configured to provide the second supply voltage of reference voltage supply VSS to active regions 302*a* and 302*d*, and conductor 350*b* is configured to provide the first supply voltage of voltage supply VDD to active regions 302*b* and 302*c*.

In some embodiments, at least conductor 350*a*, 350*c* or 350*d* is configured to provide the first supply voltage of voltage supply VDD to active regions 302*a* and 302*d*, and conductor 350*b* is configured to provide the second supply voltage of reference voltage supply VSS to active regions 302*b* and 302*c*.

The set of conductors 350 is configured to deliver power from the back-side 303*b* of integrated circuits 300, 400, 700, 800, 1100 and 1200 to one or more devices formed on the front-side 303*a* of integrated circuits 300, 400, 700, 800, 1100 and 1200. In some embodiments, when viewed from the bottom/backside (e.g., in the positive Z-direction) of integrated circuits 300, 400, 700, 800, 1100 and 1200, one or more transistor devices are covered by the set of conductors 350, and power is delivered to the one or more covered transistors from the front-side 303*a* of integrated circuit 300 by at least the set of conductors 340.

The set of vias 354 is configured to electrically couple one or more sources or drains of the set of active regions 302 to the set of conductors 350, and vice versa. The set of vias 354 are between the set of active regions 302 and the set of conductors 350.

In some embodiments, the set of conductors 350 is electrically coupled to the set of active regions 302 by the set of vias 354, thereby delivering power to the set of active regions 302 from the back-side 303*b* of integrated circuit 300 thereby freeing up resources on the front-side 303*a* of integrated circuit 300 resulting in more routing flexibility and additional routing resources compared to other approaches.

In some embodiments, conductor 350*a* is electrically coupled to active region 302*d* by vias 354*a*, 354*b* and 354*c*, thereby providing the first supply voltage of voltage supply VDD or the second supply voltage of reference voltage supply VSS to the sources or drains of the corresponding active region 302*d*.

In some embodiments, conductor 350*b* is electrically coupled to active regions 302*c* and 302*b* by vias 354*d*, 354*e*, 354*f*, 354*g* and 354*h*, thereby providing the first supply voltage of voltage supply VDD or the second supply voltage of reference voltage supply VSS to the sources or drains of the corresponding active regions 302*c* and 302*b*.

In some embodiments, conductor 350*c* is electrically coupled to active region 302*a* by via 354*i*, thereby providing the first supply voltage of voltage supply VDD or the second supply voltage of reference voltage supply VSS to the sources or drains of the corresponding active region 302*a*.

In some embodiments, conductor 350*d* is electrically coupled to active region 302*a* by via 354*j*, thereby providing the first supply voltage of voltage supply VDD or the second supply voltage of reference voltage supply VSS to the sources or drains of the corresponding active region 302*a*.

Conductors 350*a*, 350*c* and 350*d* are the VSS power rail, and conductor 350*b* the VDD power rail.

Conductor 350*a* is electrically coupled to and configured to provide voltage VSS to the source of transistors T24 and T26, the source of transistors T32 and T22, and the source of transistors T16 and T30. For example, conductor 350*a* is electrically coupled to the source of transistors T25 and T26 by via 354*c*, conductor 350*a* is electrically coupled to the source of transistors T32 and T22 by via 354*b*, and conductor 350*a* is electrically coupled to the source of transistors T16 and T30 by via 354*a*.

Conductor 350*b* is electrically coupled to and configured to provide voltage VDD to the source of transistors T15 and T29, the source of transistors T11 and T17, the source of transistors T31 and T19, the source of transistors T25 and T23, and the source of transistors T4 and T2. For example, conductor 350*b* is electrically coupled to the source of transistors T15 and T29 by via 354*d*, conductor 350*b* is electrically coupled to the source of transistors T11 and T17 by via 354*e*, conductor 350*b* is electrically coupled to the source of transistors T31 and T19 by via 354*f*, conductor 350*b* is electrically coupled to the source of transistors T25 and T23 by via 354*g*, conductor 350*b* is electrically coupled to the source of transistors T4 and T2 by via 354*h*.

Conductor 350*c* is electrically coupled to and configured to provide voltage VSS to the source of transistors T14 and T28. For example, conductor 350*c* is electrically coupled to the source of transistors T14 and T28 by via 354*i*.

Conductor 350*d* is electrically coupled to and configured to provide voltage VSS to the source of transistor T7. For example, conductor 350*d* is electrically coupled to the source of transistor T7 by via 354*j*.

Other configurations, arrangements on other layout levels or quantities of structures in the set of conductors 350 are within the scope of the present disclosure.

The set of conductors 352 are configured to electrically couple at least a source or drain of the set of active regions 302 to at least another source or drain of the set of active regions 302 by the set of vias 356. In some embodiments, the set of conductors 352 are useable to route one or more signals between transistors in the set of active regions 302. In some embodiments, the set of conductors 352 are additional routing tracks.

The set of vias 356 are configured to electrically couple one or more sources or drains of the set of active regions 302 to the set of conductors 350, and vice versa. The set of vias 356 are between the set of active regions 302 and the set of conductors 352.

Conductor 352a electrically couples the drains of transistors T6 and T8, and the source of transistor T10 together. For example, the drains of transistor T6 and T8 are electrically coupled to conductor 352a by via 356b, and conductor 352a is electrically coupled to the source of transistor T10 by via 356a.

Conductor 352b electrically couples the drains of transistors T1 and T3, and the source of transistor T9 together. For example, the drains of transistor T1 and T3 are electrically coupled to conductor 352b by via 356c, and conductor 352b is electrically coupled to the source of transistor T9 by via 356d.

In some embodiments, by moving at least a signal line and a power rail of the set of conductors 350 or 352 from the front-side 303a of integrated circuit 300, 400, 700, 800, 1100 and 1200 to the back-side 303b of integrated circuit 300, 400, 700, 800, 1100 and 1200, results in integrated circuit 300, 400, 700, 800, 1100 and 1200 using at least one less upper metal layer track in the set of conductors 320 or 322 or 340, resulting in an integrated circuit with a smaller height, smaller area, more routing flexibility and additional routing resources compared to other approaches.

The drains of transistor T3 and T4 (have signal mx3) are electrically coupled together by at least conductor 322b. For example, contact 310e is electrically coupled to conductor 322b by via 314e, and conductor 322b is electrically coupled to contact 310d by via 314e.

Clock signal CLKB is generated by transistors T27 and T28 and is output to conductor 322a by via 314a, and conductor 322a is further electrically coupled to gate 306j of transistors T12 and T17 by via 318d, and conductor 340e by via 342j.

Conductor 340e is configured to route clock signal CLKB to the gate 306f of transistor T10 by being electrically coupled to conductor 322i by via 342i, and conductor 322i is coupled to gate 306f by via 318e.

Conductor 340e is configured to route clock signal CLKB to the gate 304f of transistor T21 by being electrically coupled to conductor 320i by via 342l, and conductor 320i is coupled to gate 304f by via 316d.

Conductor 340e is configured to route clock signal CLKB to the gate 304i of transistors T29 and T30 by being electrically coupled to conductor 320a by via 342k, and conductor 320a is coupled to gate 304i by via 316a.

Clock signal CLKBB is generated by transistors T29 and T30 and is output to conductor 320h by via 312a, and conductor 320h is further electrically coupled to gate 304g of transistor T18 by via 316c, and conductor 340c by via 342f.

Conductor 340c is configured to route clock signal CLKBB to the gate 306g of transistor T13 by being electrically coupled to conductor 322h by via 342d, and conductor 322h is coupled to gate 306g by via 318c.

Conductor 340c is configured to route clock signal CLKBB to conductor 320k by via 342e. In some embodiments, conductors 320k and 320l are part of a shared M0 track. In some embodiments, at least conductor 320k or 320l is configured to carry clock signal CLKB as part of a shared M0 track. Conductor 320k is configured to route clock signal CLKBB to the gate 306j of transistors T9 and T20 by being electrically coupled to gate 306j by via 316h.

In some embodiments, integrated circuit 300 includes a hybrid power rail structure where one or more transistor devices are configured to receive power (VDD and VSS) from the back-side 303b of integrated circuit 300 by the set of conductors 350, and one or more transistor devices are configured to receive power (at least VDD or VSS) from the front-side 303a of integrated circuit 300 by at least the set of conductors 320, the set of conductors 322 or the set of conductors 340.

In some embodiments, when viewed from the bottom/backside (e.g., in the positive Z-direction) of integrated circuit 300, one or more transistor devices are covered by the set of conductors 356, and power is delivered to the one or more covered transistors from the front-side 303a of integrated circuit 300 by at least the set of conductors 320, 322 or 340. For example, when viewed from the bottom/backside (e.g., in the positive Z-direction) of integrated circuit 300, transistor T5 is covered by conductor 352a thereby preventing via landing spots from the back-side 203b of integrated circuit 300, and therefore power is delivered to transistor T5 from the front-side 303a of integrated circuit 300 by at least conductor 320j or 322j or conductor 34g.

As shown in FIGS. 3D-3F, transistor T5 is configured to receive current I1 of reference voltage VSS from the front-side 303a of integrated circuit 300. The source 302a1 of transistor T5 is electrically coupled to conductor 350a, and thus receives supply voltage VSS or current I1 from conductor 350a. For example, conductor 350a is electrically coupled to the source 302d1 of transistors T26 and T24 by via 354c. The source 302d1 of transistors T26 and T24 is configured to receive current I1 from conductor 350a. The source 302d1 of transistors T26 and T24 are further electrically coupled to contact 308f on the front-side 303a of integrated circuit 300. Contact 308f is electrically coupled to conductor 320j by via 312f. Conductor 320j is electrically coupled to conductor 340g by via 342o. Conductor 340g is electrically coupled to conductor 322j by via 342n. Conductor 322j is electrically coupled to contact 310c by via 314c. The contact 310c is electrically coupled to the source 302a1 of transistor T5. Thus, the source 302a1 of transistor T5 is configured to receive current I1 of reference voltage VSS from conductor 322j.

In some embodiments, by having transistor T5 receive power from the front-side 303a of integrated circuit 300 through the active region 302d1 of transistors T26 or T24, current I1 may encounter increased resistance by flowing through one or more epitaxial layers in the active region 302d1 of transistors T26 or T24. However, since transistor T5 does not affect the timing of integrated circuit 300, the increased resistance from the active region 302d1 of transistors T26 or T24 does not affect the performance of integrated circuit 300 and integrated circuit 300 occupies less area than other approaches. In some embodiments, by having the set of conductors 352 on the back-side 303b of integrated circuit 300, the set of conductors 352 provide additional routing resources thereby reducing the area of integrated circuit 300 compared to other approaches.

In some embodiments, while integrated circuit 300 included one transistor configured to receive power (voltage VDD or VSS) from the front-side 303a and the other transistors configured to receive power (voltage VDD or VSS) from the back-side 303b, other numbers of transistors configured to receive power (voltage VDD or VSS) from the front-side 303a are within the scope of the present disclosure.

In some embodiments, at least one gate of the set of dummy gates 305 or the set of gates 304 or 306 are formed using a doped or non-doped polycrystalline silicon (or polysilicon). In some embodiments, at least one gate of the set of dummy gates 305 or the set of gates 304 or 306 include a metal, such as Al, Cu, W, Ti, Ta, TiN, TaN, NiSi, CoSi, other suitable conductive materials, or combinations thereof.

In some embodiments, at least one contact of the set of contacts 308 or the set of contacts 310, or at least one conductor of the set of conductors 320, the set of conductors 322, the set of conductors 340, the set of conductors 350, the set of conductors 352, or at least one via of the set of vias 312, the set of vias 314, the set of vias 316, the set of vias 318, the set of vias 342, the set of vias 354, the set of vias 356 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W-TiN, TiSix, NiSix, TiN, TaN, or the like. In some embodiments, a doped semiconductor includes at least doped silicon, or the like.

Other configurations or arrangements of integrated circuit 300 are within the scope of the present disclosure.

Figure 4A:
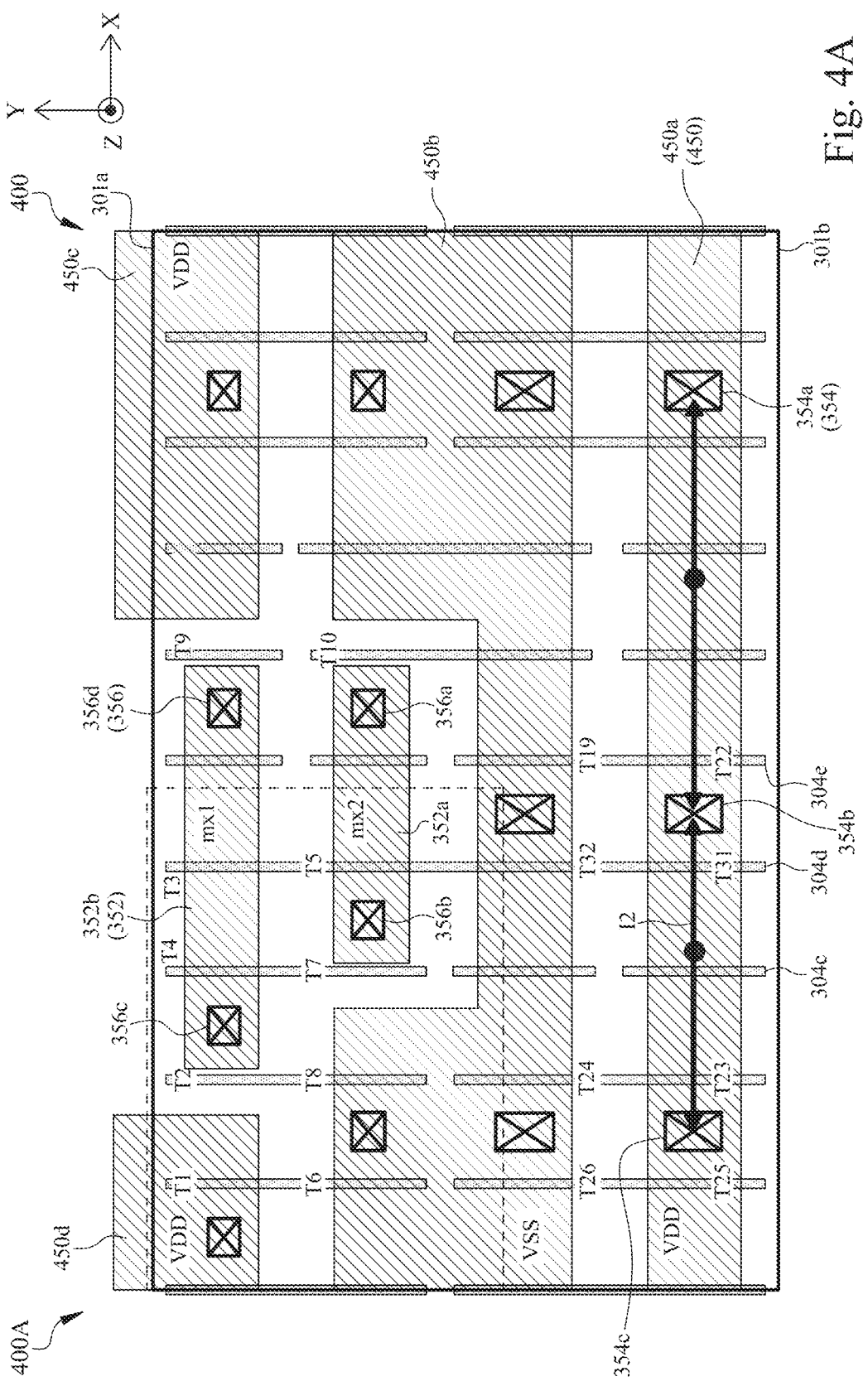
Figure 4B:
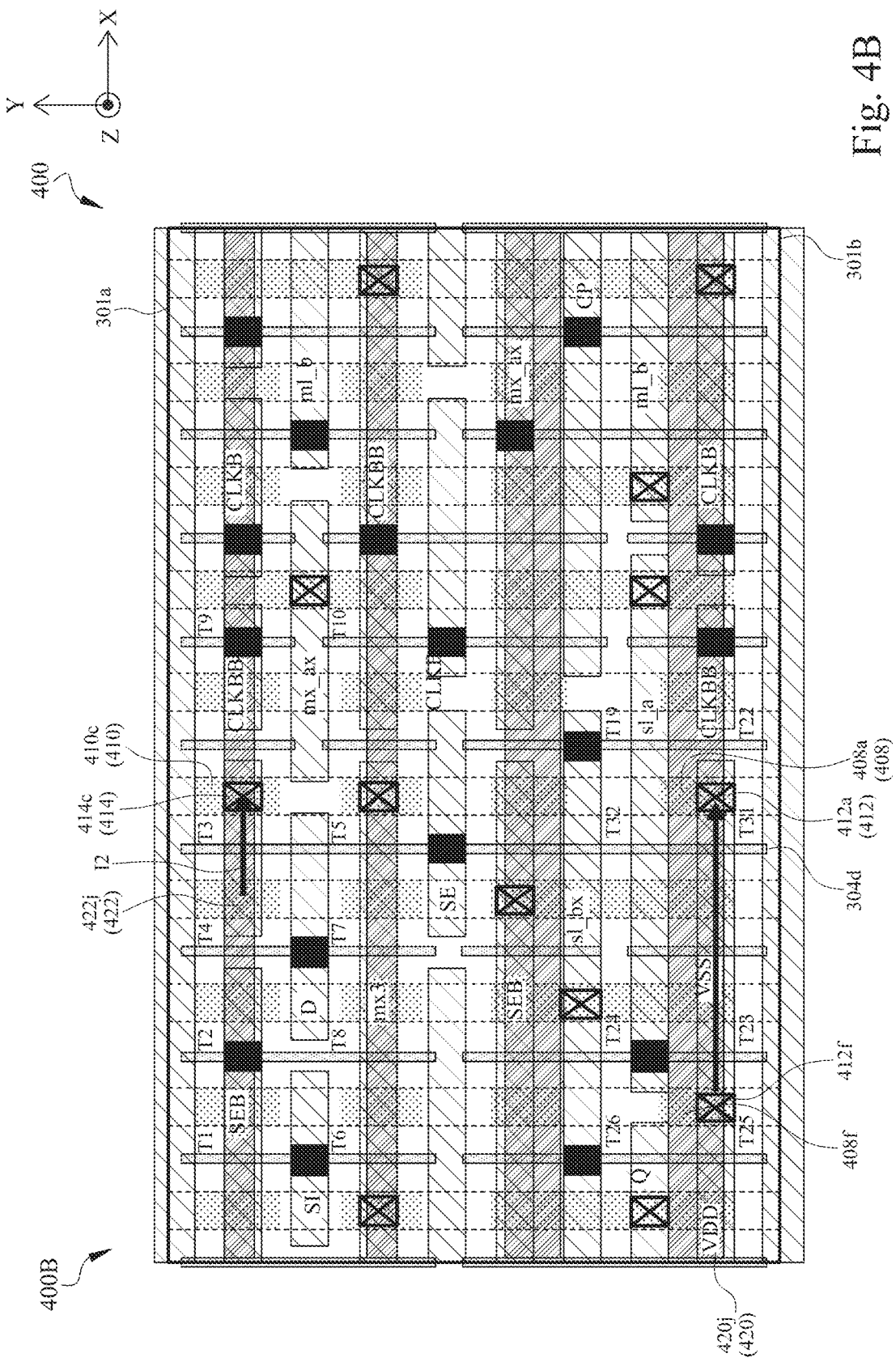

FIGS. 4A-4C are diagrams of an integrated circuit 400, in accordance with some embodiments.

Integrated circuit 400 is an embodiment of integrated circuit 100B of FIG. 1B.

FIGS. 4A-4C are corresponding diagrams of corresponding portions 400A-400C of an integrated circuit 400, simplified for ease of illustration.

Portion 400A includes one or more features of integrated circuit 400 of the POLY level, the BMO level and the VB level. Portion 400A is similar to portion 300A of FIGS. 3A-3F, and similar detailed description is omitted.

Portion 400B includes one or more features of integrated circuit 400 of the OD level, the POLY level, the MD level, the M0 level, the VG level and the VD level. Portion 400B is similar to portion 300B of FIGS. 3A-3F, and similar detailed description is omitted.

Portion 400C includes one or more features of integrated circuit 400 of the POLY level, the M1 level and the V0 level. Portion 400C is similar to portion 300C of FIGS. 3A-3F, and similar detailed description is omitted.

Integrated circuit 400 is manufactured by a corresponding layout design similar to integrated circuit 400. Integrated circuit 400 is an embodiment of integrated circuit 100B, and similar detailed description is omitted. For brevity FIGS. 4A-4C are described as a corresponding integrated circuit 400, but in some embodiments, FIGS. 4A-4C also correspond to layout designs similar to layout design 200, structural elements of integrated circuit 400 also correspond to layout patterns, and structural relationships including alignment, lengths and widths, as well as configurations and layers of a corresponding layout design of integrated circuit 400 are similar to the structural relationships and configurations and layers of integrated circuit 400, and similar detailed description will not be described for brevity.

In some embodiments, integrated circuit 400 is manufactured by a layout design similar to layout design 200, and similar detailed description is omitted for brevity.

Integrated circuit 400 is a variation of integrated circuit 300 (FIGS. 3A-3F). For example, integrated circuit 400 illustrates an example of where parallel conductors 440*a* and 440*b* of the set of conductors 440 are used to supply power from the front-side of integrated circuit 400 to at least an active region of one or more transistors.

In some embodiments, each of the gates in the set of gates 304 and 306 are shown in FIGS. 3A-3F with labels "T1-T32" that identify corresponding transistors of FIGS. 1A-1B having corresponding gates in FIGS. 4A-4C, and are omitted for brevity.

Integrated circuit 400 includes at least the set of active regions 302, the set of dummy gates 305, the set of gates 304 and 306, the set of contacts 308, the set of contacts 310, the set of conductors 320, the set of conductors 322, the set of vias 312, the set of vias 314, the set of vias 316, the set of vias 318, the set of conductors 440, the set of vias 442, the set of conductors 450, the set of conductors 352, the set of vias 354, the set of vias 356, a substrate 390 and an insulating region 392.

In comparison with integrated circuit 300 of FIGS. 3A-3F, set of conductors 440 of integrated circuit 400 replaces the set of conductors 340, set of vias 442 of integrated circuit 400 replaces the set of vias 342, and set of conductors 450 of integrated circuit 400 replaces the set of conductors 350, and similar detailed description is therefore omitted.

In comparison with conductors 350*a*, 350*c* and 350*d* of FIGS. 3A-3F, conductors 450*a*, 450*c* and 450*d* of FIGS. 4A-4C are configured to supply voltage VDD, and similar detailed description is therefore omitted. In comparison with conductors 350*b* of FIGS. 3A-3F, conductor 450*b* of FIGS. 4A-4C is configured to supply voltage VSS, and similar detailed description is therefore omitted.

Set of conductors 440 includes at least conductor 340*a*, ..., 340*e*, 340*h*, ..., 340*k*, 440*a* or 440*b*. In comparison with integrated circuit 300 of FIGS. 3A-3F, conductors 440*a* and 440*b* replace conductor 340*g*, and similar detailed description is therefore omitted.

Set of vias 442 includes at least via 342*a*, ..., 342*m*, 342*p*, 342*q*, 342*r*, 442*a*, 442*b*, 442*c* or 442*d*. In comparison with integrated circuit 300 of FIGS. 3A-3F, vias 442*a* and 442*b* replaces via 342*o*, and vias 442*c* and 442*d* replaces via 342*n*, and similar detailed description is therefore omitted.

In comparison with integrated circuit 300 of FIGS. 3A-3F, contact 408*f* replaces contact 308*f*, contact 410*c* replaces contact 310*c*, and the set of contacts 408 of FIGS. 4A-4C further includes contact 408*a*, and similar detailed description is therefore omitted. In some embodiments, contact 408*a* is similar to contact 308*f*, and similar detailed description is therefore omitted.

In comparison with integrated circuit 300 of FIGS. 3A-3F, via 412*f* replaces via 312*f*, via 414*c* replaces via 314*c*, and the set of vias 412 of FIGS. 4A-4C further includes via 412*a*, and similar detailed description is therefore omitted. In some embodiments, via 412*a* is similar to via 312*f*, and similar detailed description is therefore omitted.

In comparison with integrated circuit 300 of FIGS. 3A-3F, conductor 420*j* replaces conductor 320*j*, and conductor 422*j* replaces conductor 322*j*, and similar detailed description is therefore omitted.

In some embodiments, integrated circuit 400 includes a hybrid power rail structure where one or more transistor devices are configured to receive power (VDD and VSS) from the back-side 303*b* of integrated circuit 400 by the set of conductors 450, and one or more transistor devices are configured to receive power (at least VDD or VSS) from the front-side 303*a* of integrated circuit 400 by at least the set of conductors 420, the set of conductors 422 or the set of conductors 440.

In some embodiments, when viewed from the bottom/backside (e.g., in the positive Z-direction) of integrated circuit 400, one or more transistor devices are covered by the set of conductors 356, and power is delivered to the one or more covered transistors from the front-side 303*a* of integrated circuit 400 by at least the set of conductors 420, 422 or 440. For example, when viewed from the bottom/backside (e.g., in the positive Z-direction) of integrated circuit 400, transistor T3 is covered by conductor 352*b* thereby preventing via landing spots from the back-side 303b of integrated circuit 400, and therefore power is delivered to transistor T3 from the front-side 303a of integrated circuit 400 by at least conductor 420j or 422j or conductor 440a or 440b.

As shown in FIGS. 4A-4C, transistor T3 is configured to receive current I2 of voltage VDD from the front-side 303a of integrated circuit 400. The source of transistor T3 is electrically coupled to conductor 450a, and thus receives supply voltage VDD or current I2 from conductor 450a. For example, conductor 450a is electrically coupled to the source of transistors T25 and T23 by via 354c, and conductor 450a is electrically coupled to the source of transistors T31 and T22 by via 354b, and conductor 450a is electrically coupled to the source of transistors T27 and T11 by via 354a. The source of transistors T25 and T23 and the source transistors T31 and T22 is configured to receive current I2 from conductor 450a. The source of transistors T25 and T23 are further electrically coupled to contact 408f on the front-side 303a of integrated circuit 400. Contact 408f is electrically coupled to conductor 420j by via 412f. The source of transistors T31 and T22 are further electrically coupled to contact 408a on the front-side 303a of integrated circuit 400. Contact 408a is electrically coupled to conductor 420j by via 412a. Conductor 420j is configured to carry current I2. In some embodiments, current I2 is divided into current I2a and I2b. In some embodiments, current I2 is the sum of current I2a and I2b. In some embodiments, at least conductors 440a and 440b are coupled in parallel, and are configured as a current divider. In some embodiments, conductor 440a is configured to carry current I2a, and conductor 440b is configured to carry current I2b.

Conductor 420j is electrically coupled to conductor 440a by via 442a. Conductor 440a is electrically coupled to conductor 422j by via 442c. Conductor 420j is electrically coupled to conductor 440b by via 442b. Conductor 440b is electrically coupled to conductor 422j by via 442d. Conductor 422j is configured to receive currents I2a and I2b. Conductor 422j is configured to carry current I2 as currents I1a and I2b are summed together at conductor 422j. Conductor 422j is electrically coupled to contact 410c by via 414c. The contact 410c is electrically coupled to the source of transistor T3. Thus, the source of transistor T3 is configured to receive current I2 of reference voltage VSS from conductor 422j.

In some embodiments, the active region of transistor T3 and conductor 420a are electrically coupled together by parallel paths thereby lowering the resistance from routing the supply voltage from the front-side of integrated circuit 400 to at least an active region of one or more transistors. In some embodiments, the parallel paths include at least conductors 440a, 440b, 420j, 422j, vias, 442a, 442b, 442c, 442d, vias 354a, 354b and 354c.

In some embodiments, by having transistor T3 receive power from the front-side 303a of integrated circuit 400 through the active region of transistors T25, T23, T31 or T22, resistance from at least one or more epitaxial layers in the active regions of transistors T25, T23, T31 or T22 is reduced by the one or more parallel paths between the active region of transistor T3 and conductor 420a thereby causing integrated circuit 400 to have better performance than other approaches. In some embodiments, by having the set of conductors 352 on the back-side 303b of integrated circuit 400, the set of conductors 352 provide additional routing resources thereby reducing the area of integrated circuit 400 compared to other approaches.

Other configurations or arrangements of integrated circuit 400 are within the scope of the present disclosure.

Figure 5A:
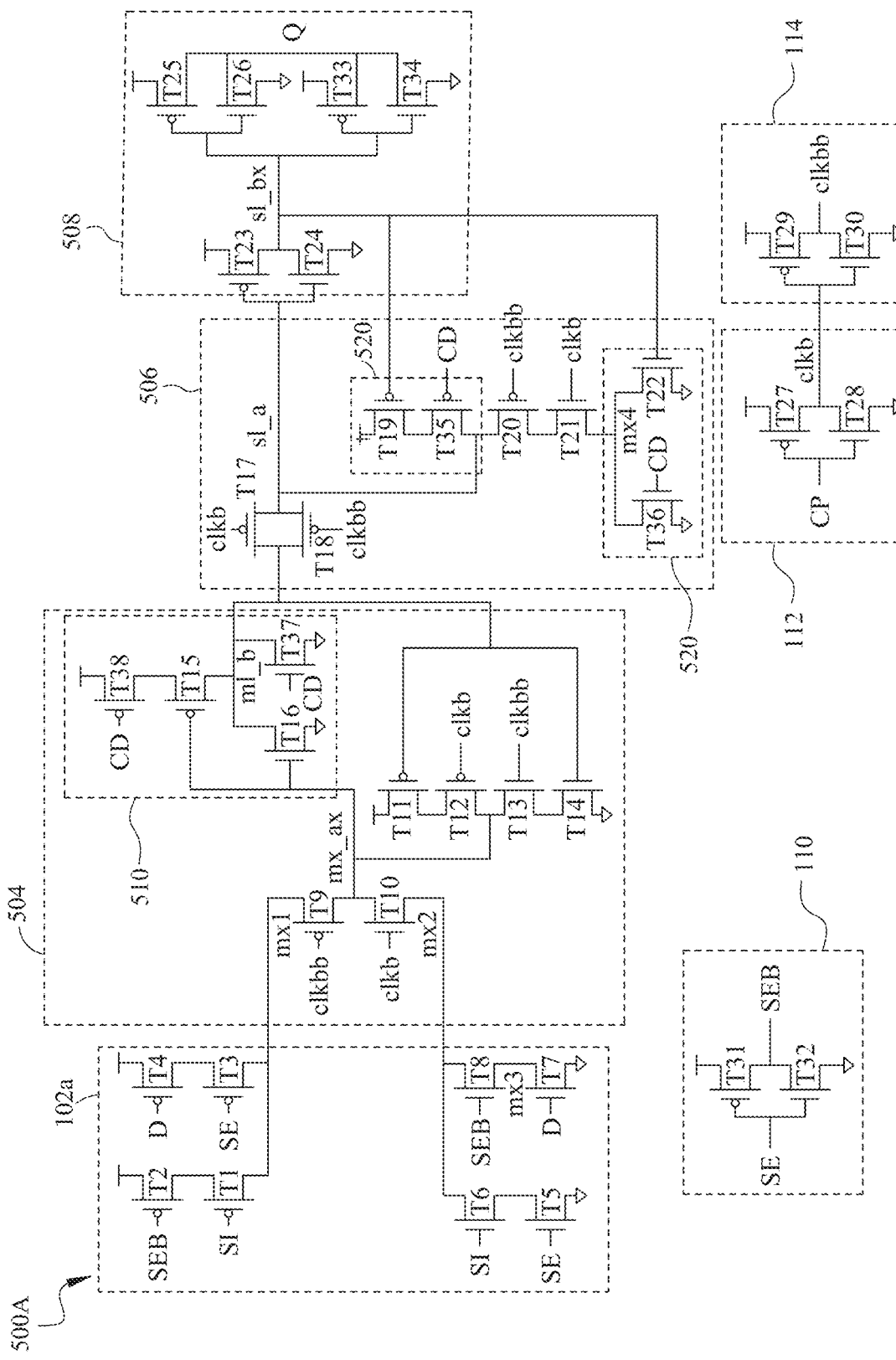
FIG. 5A is a circuit diagram of an integrated circuit, in accordance with some embodiments.

FIG. 5A is a circuit diagram of an integrated circuit 500A, in accordance with some embodiments.

Integrated circuit 500A is a variation of integrated circuit 100A, and similar detailed description is therefore omitted. In comparison with integrated circuit 100A, a latch 504 of FIG. 5A replaces latch 104, a latch 506 of FIG. 5A replaces latch 106, and an output circuit 508 of FIG. 5A replaces output circuit 108, and similar detailed description is therefore omitted. For example, in comparison with integrated circuit 100A of FIG. 1A, latch 504 includes a NOR logic circuit 510, and latch 506 includes a NOR logic circuit 520.

In comparison with latch 104, latch 504 further includes a NOR logic circuit 510, and similar detailed description is therefore omitted.

NOR logic circuit 510 includes transistors T37, T38, T15 and T16. Similar details from FIG. 1A for transistors T15 and T16 will not be described for brevity. In some embodiments, NOR logic circuit 510 adds a clear function to latch 504 based on a signal CD.

A source terminal of transistor T38 is coupled to the voltage supply VDD. A drain terminal of transistor T38 is coupled to a source terminal of transistor T15.

Each of a drain terminal of transistor T15, a drain terminal of transistor T37, a drain terminal of transistor T16, a source/drain terminal of transistor T17, a source/drain terminal of transistor T18, the gate terminal of transistor T11 and the gate terminal of transistor T14 are coupled together, and correspond to signal ml_b.

A source terminal of transistor T16 is coupled to the reference voltage supply VSS. A source terminal of transistor T37 is coupled to the reference voltage supply VSS. In some embodiments, source terminal of transistor T37 is coupled to the source terminal of transistor T16.

Each of a gate terminal of transistor T38 and a gate terminal of transistor T37 are configured to receive signal CD. In some embodiments, the gate terminal of transistor T38 is coupled to the gate terminal of transistor T37.

In comparison with latch 106, latch 506 does not include transistors T15 and T16 (e.g., transistors T15 and T16 are part of NOR logic circuit 510), but further includes transistors T35 and T36, and similar detailed description is therefore omitted. In some embodiments, transistors T19, T22, T35 and T36 are configured as a NOR logic circuit 520. In some embodiments, NOR logic circuit 520 adds a clear function to latch 506 based on signal CD.

In comparison with latch 106, transistor T35 is between transistors T19 and T20, and similar detailed description is therefore omitted.

The drain terminal of transistor T19 is coupled to a source terminal of transistor T35. A drain terminal of transistor T35 is coupled to the source terminal of transistor T20.

Each of the drain terminal of transistor T21, a drain terminal of transistor T36 and a source terminal of transistor T22 are coupled together. A source terminal of transistor T36 is coupled to the reference voltage supply VSS. A source terminal of transistor T22 is coupled to the reference voltage supply VSS. In some embodiments, source terminal of transistor T36 is coupled to the source terminal of transistor T22.

Each of a gate terminal of transistor T35 and a gate terminal of transistor T36 are configured to receive signal CD. In some embodiments, the gate terminal of transistor T35 is coupled to the gate terminal of transistor T36.

In comparison with output circuit 108, output circuit 508 further includes transistors T33 and T34, and similar detailed description is therefore omitted. In some embodiments, transistors T33 and T34 are an inverter coupled in parallel with another inverter that includes transistors T25 and T26.

Each of a gate terminal of transistor T33, a gate terminal of transistor T34, a gate terminal of transistor T19, a gate terminal of transistor T22, a drain terminal of transistor T23, a drain terminal of transistor T24, a gate terminal of transistor T25 and a gate terminal of transistor T26 are coupled together.

Transistors T33 and T34 are configured as an inverter (not labelled) configured to receive signal sl_bx, and to generate signal Q. The gate terminals of transistors T33 and T34 are configured to receive signal sl_bx. A source terminal of transistor T33 is coupled to the voltage supply VDD. A source terminal of transistor T34 is coupled to the reference voltage supply VSS. Each of the drain terminals of transistors T33, T34, T25 and T26 are coupled together, and configured to output the signal Q.

Other configurations, arrangements or other circuits in integrated circuit 500A are within the scope of the present disclosure.

Figure 5B:
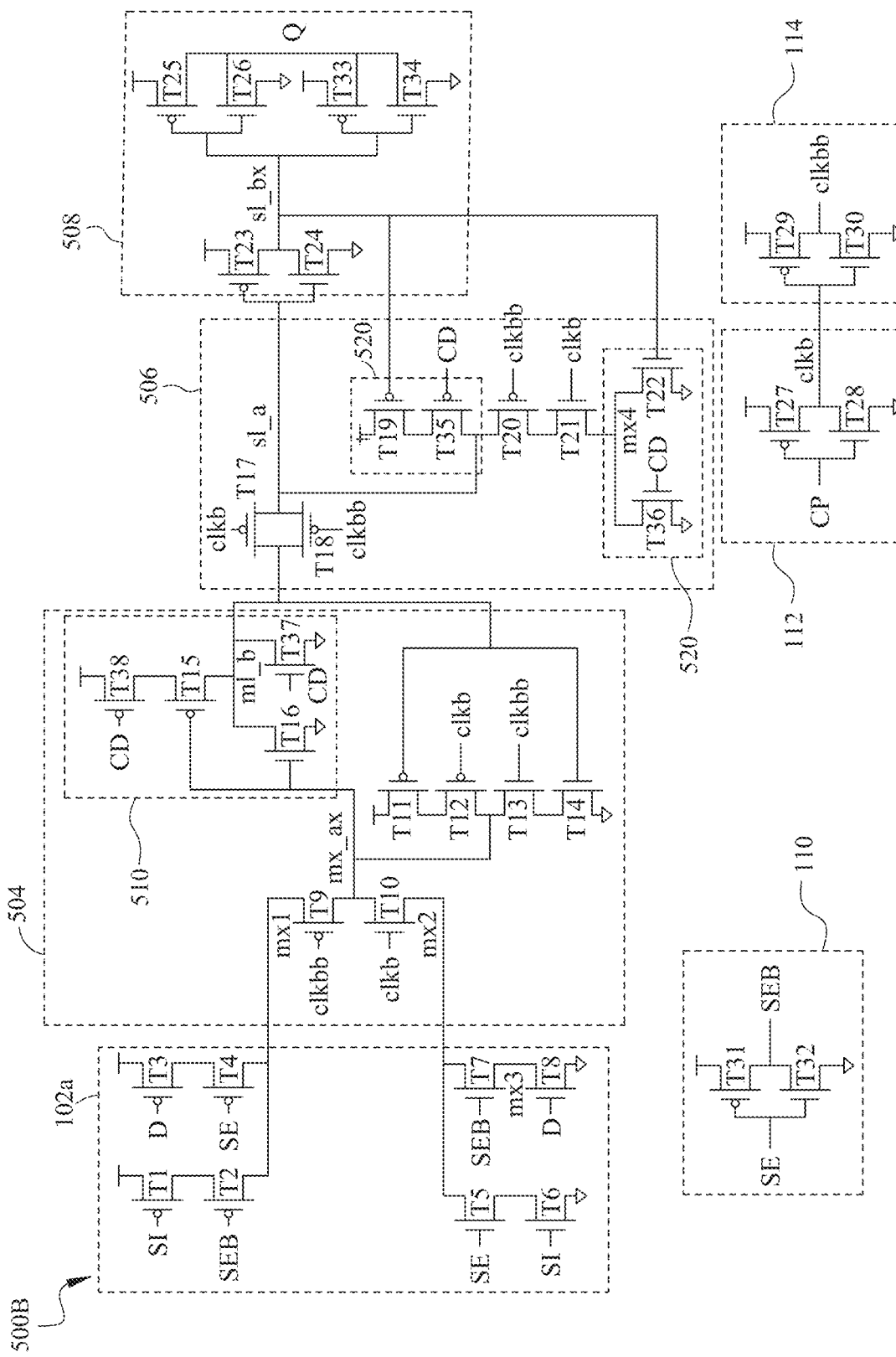
FIG. 5B is a circuit diagram of an integrated circuit, in accordance with some embodiments.

FIG. 5B is a circuit diagram of an integrated circuit 500B, in accordance with some embodiments.

Integrated circuit 500B is a variation of integrated circuit 100B and integrated circuit 500A and similar detailed description is therefore omitted. For example, integrated circuit 500B combines the features of integrated circuit 500A and integrated circuit 100B.

In comparison with integrated circuit 500A, multiplexer 102b of FIG. 5B replaces multiplexer 102a of FIG. 5A, and similar detailed description is therefore omitted.

Other configurations, arrangements or other circuits in integrated circuit 500B are within the scope of the present disclosure.

Figure 6A:
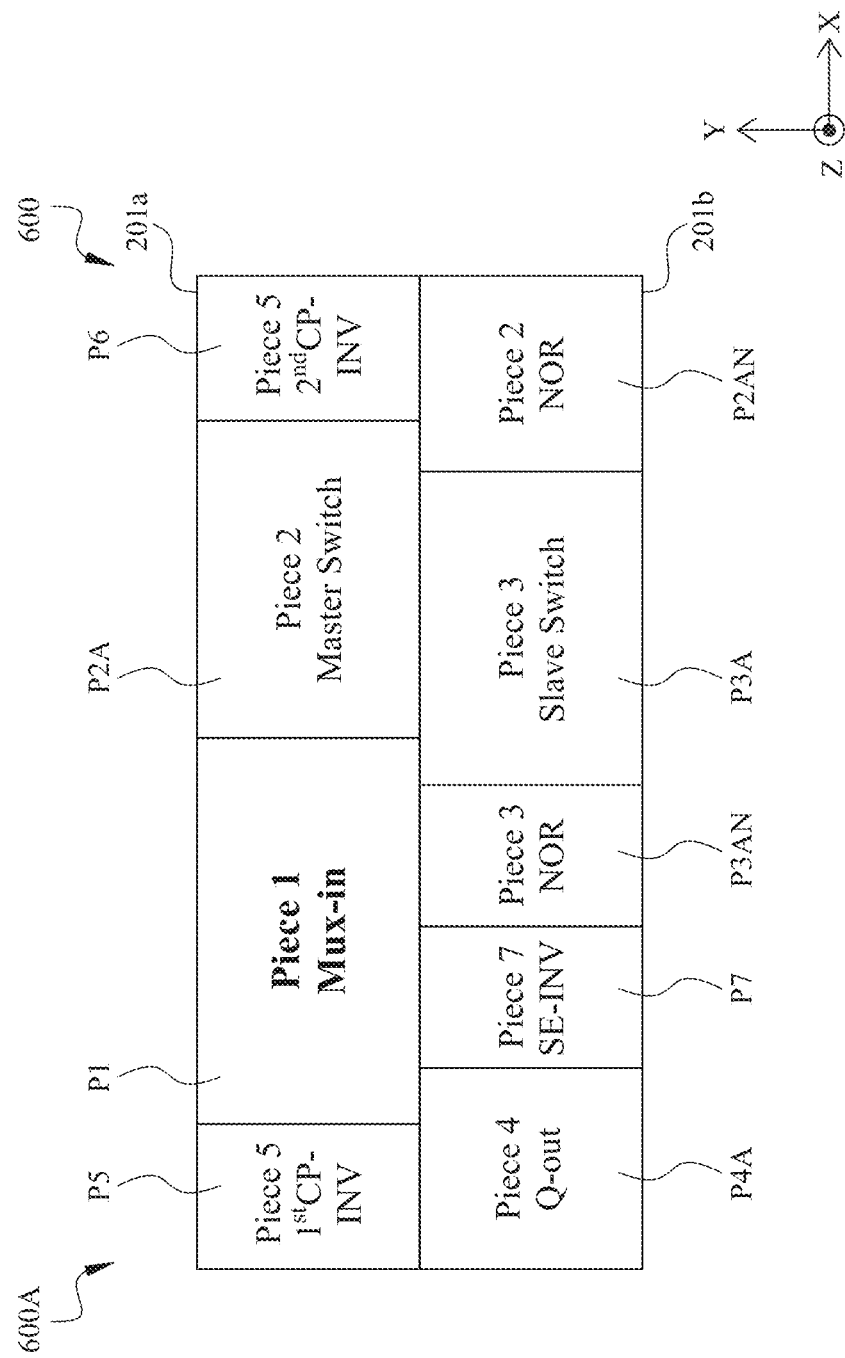
FIG. 6A is a diagram of a floorplan of an integrated circuit, in accordance with some embodiments.

FIG. 6A is a diagram of a floorplan 600A of an integrated circuit, in accordance with some embodiments.

In some embodiments, floorplan 600A is a floorplan of integrated circuit 500A of FIG. 5A or integrated circuit 500B of FIG. 5B. In some embodiments, floorplan 600A corresponds to the layout diagram 600 shown in FIGS. 6B-6G.

Floorplan 600A is a variation of floorplan 600A, and similar detailed description is therefore omitted. In comparison with floorplan 600A, latch region P2A of FIG. 6A replaces latch region P2, a latch region P3A of FIG. 6A replaces latch region P3, an output region P4A of FIG. 6A replaces output region P4, and similar detailed description is therefore omitted. In comparison with floorplan 200A, floorplan 200A further includes a NOR region P2AN and a NOR region P3AN.

Floorplan 600A includes multiplexer region P1, latch region P2A, latch region P3A, output region P4A, NOR region P2AN, a NOR region P3AN and inverter regions P5-P7.

In some embodiments, latch region P2A corresponds to latch 504, latch region P3A corresponds to latch 506, output region P4A corresponds to output circuit 508, NOR region P2AN corresponds to NOR logic circuit 510, and NOR region P3AN corresponds to NOR logic circuit 520, and similar detailed description is therefore omitted.

Each of multiplexer region P1, latch region P2A, inverter region P5 and inverter region P6 are in a first row. Latch region P2A and multiplexer region P1 are between inverter regions P5 and P6. Multiplexer region P1 is between inverter region P5 and latch region P2A. Latch region P2A is between multiplexer region P1 and inverter region P6.

Each of output region P4A, inverter region P7, NOR region P3AN, latch region P3A and NOR region P2AN are in a second row. Inverter region P7, NOR region P3AN and latch region P3A are between output region P4A and NOR region P2AN. Inverter region P7 is between output region P4A and NOR region P3AN. NOR region P3AN is between inverter region P7 and latch region P3A. Latch region P3A is between NOR region P3AN and NOR region P2AN.

FIGS. 6B-6D are corresponding diagrams of corresponding portions 600B-600D of a layout design 600 divided into the regions of floorplan 600A, simplified for ease of illustration.

The layout design 600 is divided into the regions of the floorplan 600A.

Layout design 600 is a layout diagram of integrated circuit 500A of FIG. 5A.

Portion 600B includes one or more features of layout design 600 of the POLY level, the BMO level and the VB level.

Portion 600C includes one or more features of layout design 600 of the active level or the OD level, the POLY level, the MD level, the M0 level, the VG level and the VD level.

Portion 600D includes one or more features of layout design 600 of the POLY level, the M1 level and the V0 level.

Figure 6E:
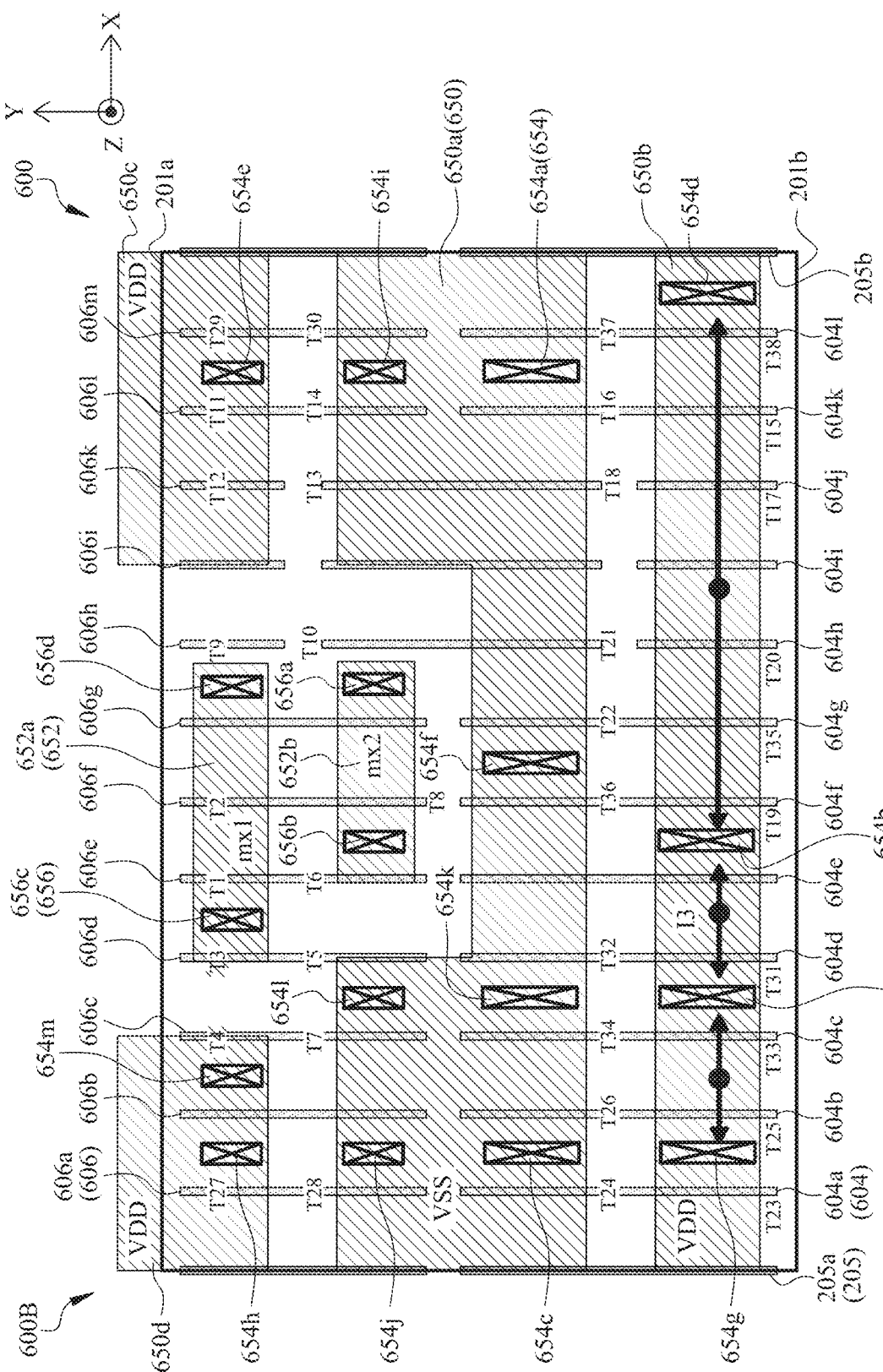
FIGS. 6E-6G are corresponding diagrams of corresponding portions of layout design, simplified for ease of illustration.
Figure 6F:
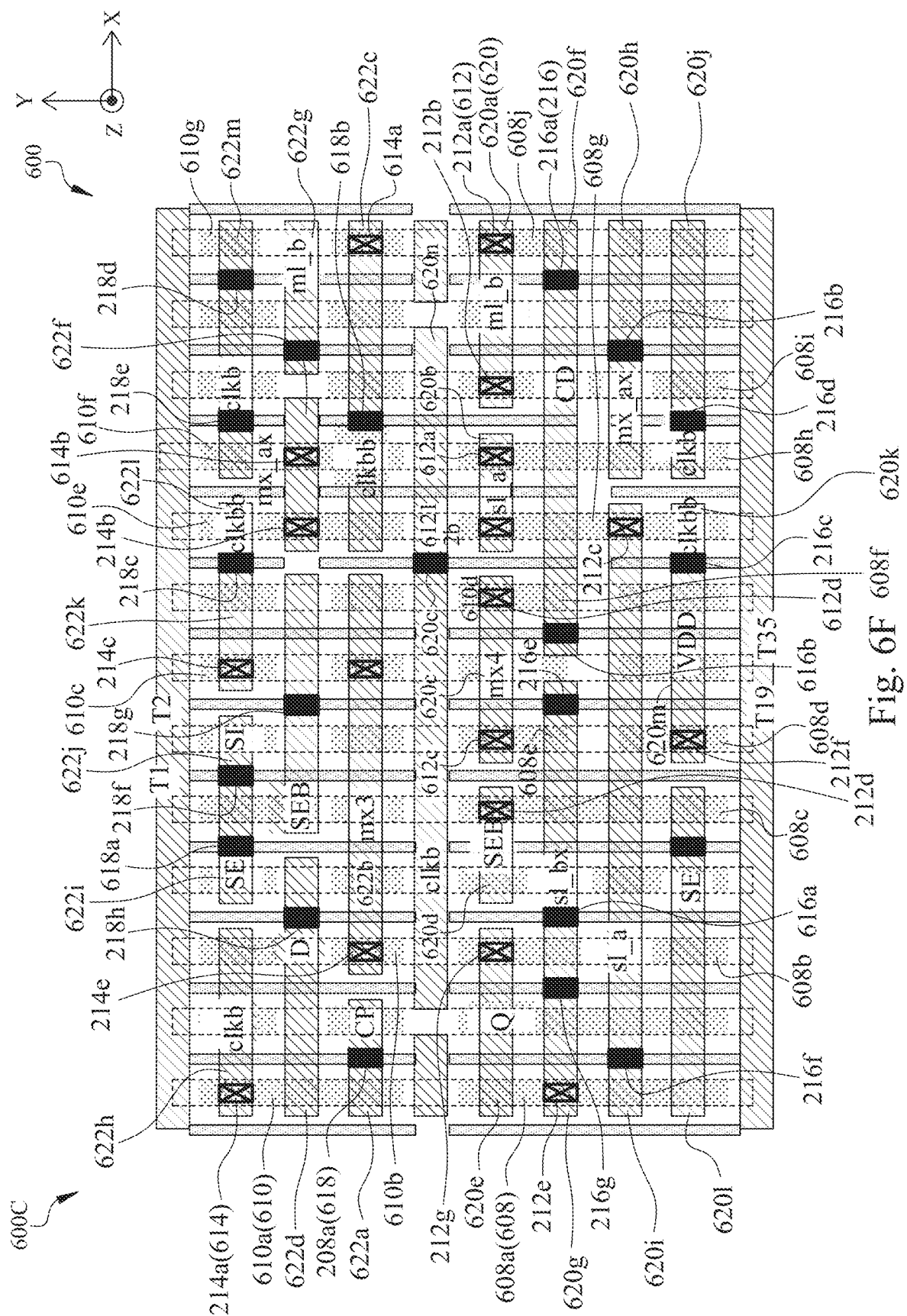
Figure 6G:
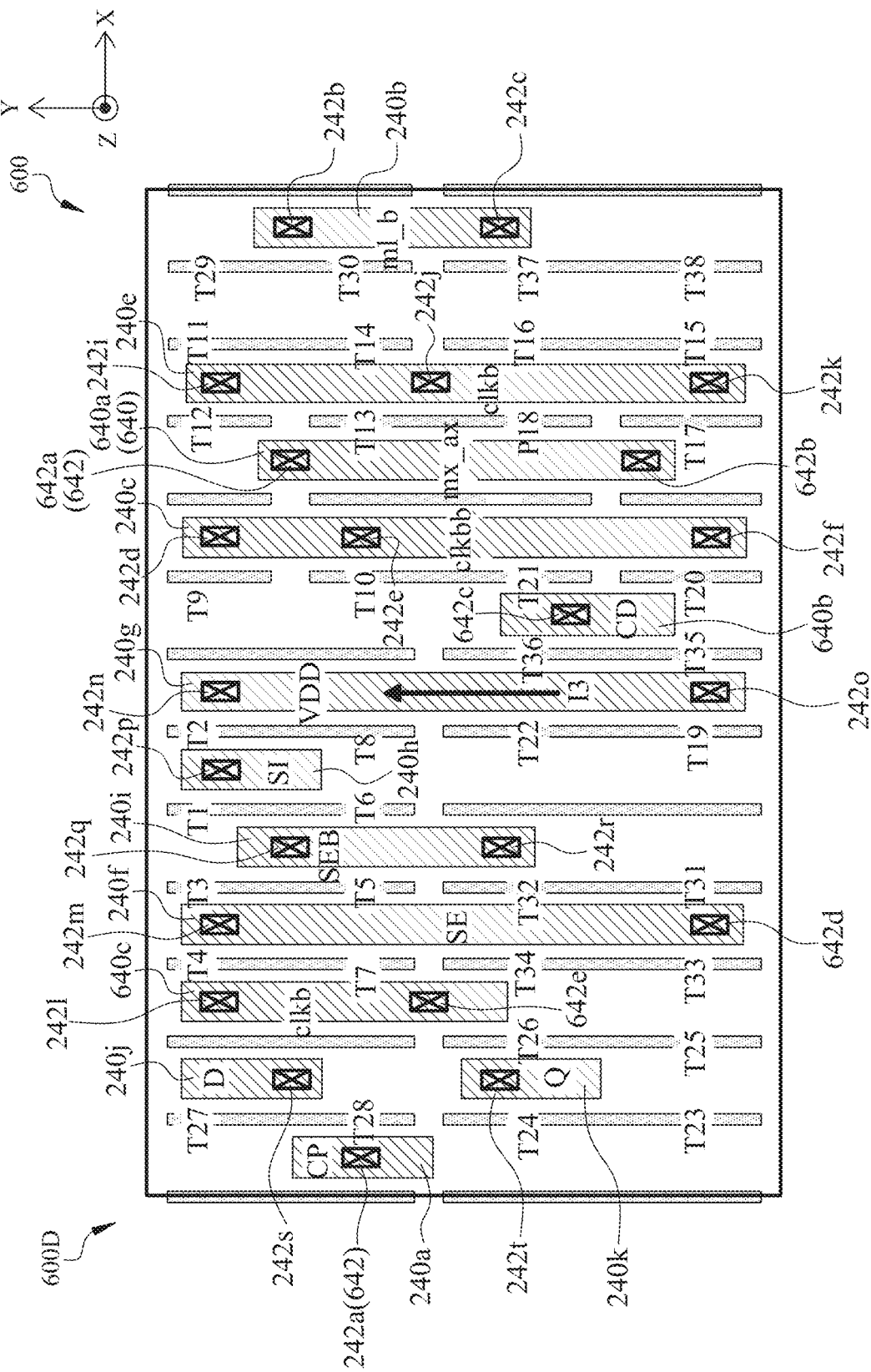

FIGS. 6E-6G are corresponding diagrams of corresponding portions 600B-600D of layout design 600, simplified for ease of illustration.

Layout design 600 includes one or more features of the BMO level, the VB level, the OD level, the POLY level, the MD level, the M0 level, the VG level, the VD level, the M1 level and the V0 level.

Figure 7A:
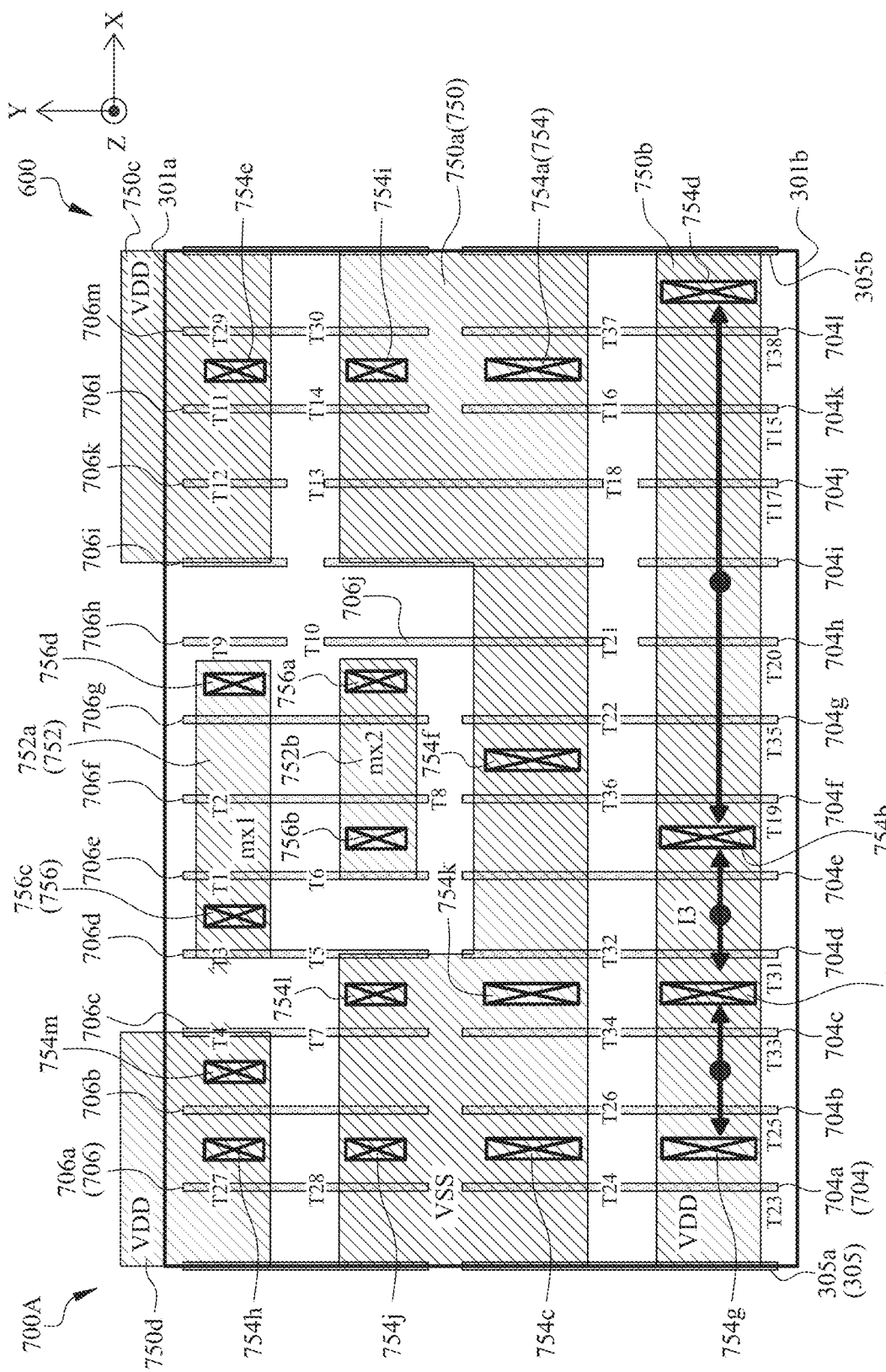
FIGS. 7A-7C are diagrams of an integrated circuit, in accordance with some embodiments.
Figure 7B:
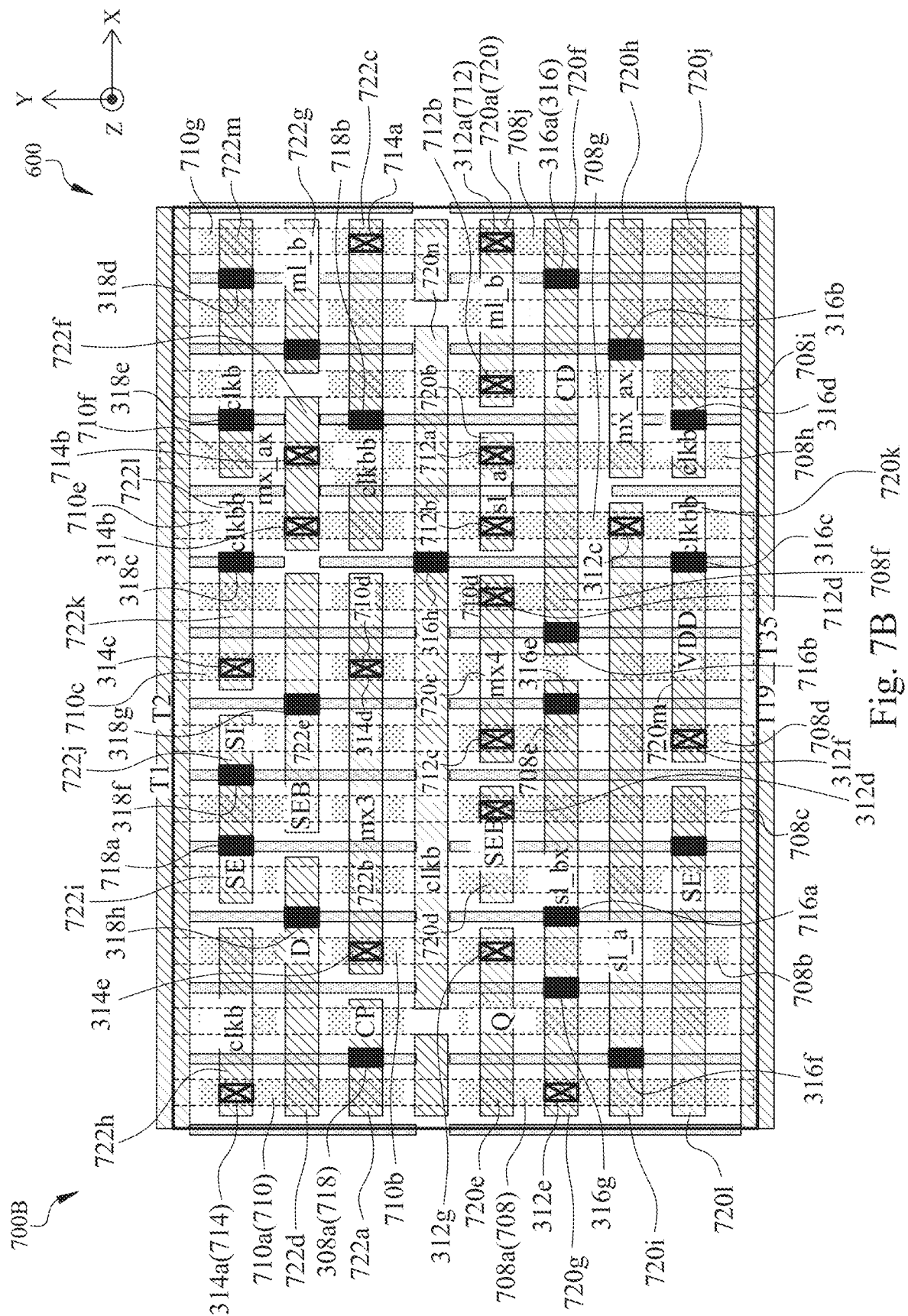
Figure 7C:
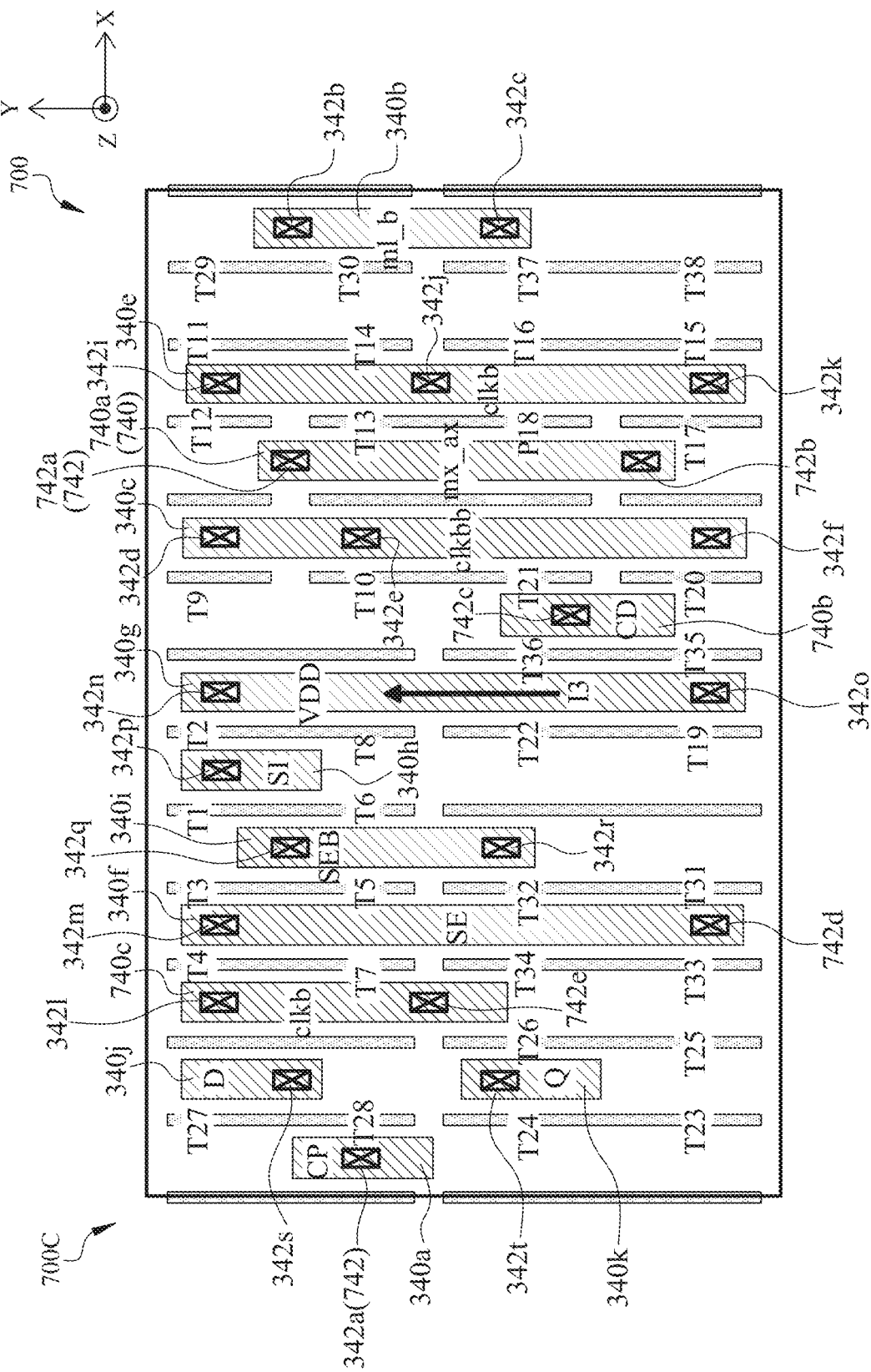

Layout design 600 is usable to manufacture integrated circuit 700 of FIGS. 7A-7C.

Layout design 600 is a variation of layout design 200, and similar detailed description is therefore omitted.

Layout design 600 includes a set of active region patterns (not shown), a set of gate patterns 604, the set of dummy gate patterns 205, a set of gate patterns 606, a set of contact patterns 608, a set of contact patterns 610, a set of conductive feature patterns 620, a set of conductive feature patterns 622, a set of via patterns 612, a set of via patterns 614, a set of via patterns 616, a set of via patterns 618, a set of conductive feature patterns 640, a set of via patterns 642, a set of conductive feature patterns 650, a set of conductive feature patterns 652, a set of via patterns 654, a set of via patterns 656.

In some embodiments, the set of active region patterns (not shown) of layout design 600 are similar to the set of active region patterns 202 of layout design 200, and similar detailed description is therefore omitted.

In comparison with layout design 200 of FIGS. 2B-2G, the set of gate patterns 604 replaces the set of gate patterns 204, the set of gate patterns 606 replaces the set of gate patterns 206, the set of contact patterns 608 replaces the set of contact patterns 208, and the set of contact patterns 610 replaces the set of contact patterns 210, and similar detailed description is therefore omitted.

In comparison with layout design 200 of FIGS. 2B-2G, the set of conductive feature patterns 620, 622, 640, 650 and 652 replaces the corresponding set of conductive feature patterns 220, 222, 240, 250 and 252, and similar detailed description is therefore omitted.

In comparison with layout design 200 of FIGS. 2B-2G, the set of via patterns 612, 614, 616, 618, 642, 654 and 656 replaces the corresponding set of via patterns 212, 214, 216, 218, 242, 254 and 256, and similar detailed description is therefore omitted.

The set of gate patterns 604 or 606 is usable to manufacture a corresponding set of gates 704 or 706 of integrated circuit 700 or 800.

In some embodiments, each of the gate patterns in the set of gate patterns 604 and 606 are shown in FIGS. 6B-6G with labels "T1-T38" that identify corresponding transistors of FIGS. 5A-5B manufactured by the corresponding gate pattern in FIGS. 6B-6G, and are omitted for brevity.

The set of contact patterns 608 or 610 is usable to manufacture a corresponding set of contacts 708 or 710 of integrated circuit 700 or 800.

The set of conductive feature patterns 620, 622, 640, 650 and 652 is usable to manufacture a corresponding set of conductors 720, 722, 740, 750 and 752 of integrated circuit 700 or 800.

The set of via patterns 612, 614, 616, 618, 642, 654 and 656 is usable to manufacture a corresponding set of vias 712, 714, 716, 718, 742, 754 and 756 of integrated circuit 700 or 800.

In some embodiments, layout design 600 achieves one or more of the benefits discussed above in FIGS. 2A-2G, FIGS. 3A-3F and FIGS. 4A-4C.

Other configurations, arrangements on other layout levels or quantities of patterns in layout design 600 are within the scope of the present disclosure.

FIGS. 7A-7C are diagrams of an integrated circuit 700, in accordance with some embodiments.

Integrated circuit 700 is an embodiment of floorplan 600A of FIG. 6A.

FIGS. 7A-7C are corresponding diagrams of corresponding portions 700A-700C of an integrated circuit 700, simplified for ease of illustration.

Portion 700A includes one or more features of integrated circuit 700 of the POLY level, the BMO level and the VB level. Portion 700A is manufactured by portion 600B.

Portion 700B includes one or more features of integrated circuit 700 of the OD level, the POLY level, the MD level, the M0 level, the VG level and the VD level. Portion 700B is manufactured by portion 600C.

Portion 700C includes one or more features of integrated circuit 700 of the POLY level, the M1 level and the V0 level. Portion 700C is manufactured by portion 600D.

Integrated circuit 700 is manufactured by layout design 600. Structural relationships including alignment, lengths and widths, as well as configurations and layers of integrated circuit 700 are similar to the structural relationships and configurations and layers of layout design 600 of FIGS. 6B-6G, and similar detailed description will not be described in at least FIGS. 7A-7C, for brevity. For example, in some embodiments, at least one or more widths, lengths or pitches of layout design 600 is similar to corresponding widths, lengths or pitches of integrated circuit 700, and similar detailed description is omitted for brevity.

Integrated circuit 700 includes at least a set of active regions (not shown, but similar to the set of active regions 302), the set of dummy gates 305, the set of gates 704 and 706, the set of contacts 708, the set of contacts 710, the set of conductors 720, the set of conductors 722, the set of vias 712, the set of vias 714, the set of vias 716, the set of vias 718, the set of conductors 740, the set of vias 742, the set of conductors 750, the set of conductors 752, the set of vias 754, the set of vias 756, substrate 390 and insulating region 392.

In some embodiments, the set of active region patterns (not shown) of integrated circuit 700 are similar to the set of active regions 302 of integrated circuit 300, and similar detailed description is therefore omitted.

In comparison with integrated circuit 300 of FIGS. 3A-3F, the set of gates 704 replaces the set of gates 304, the set of gates 706 replaces the set of gates 306, the set of contacts 708 replaces the set of contacts 308, and the set of contacts 710 replaces the set of contacts 310, and similar detailed description is therefore omitted.

In comparison with integrated circuit 300 of FIGS. 3A-3F, the set of conductors 720, 722, 740, 750 and 752 replaces the corresponding set of conductors 320, 322, 340, 350 and 352, and similar detailed description is therefore omitted.

In comparison with integrated circuit 300 of FIGS. 3A-3F, the set of vias 712, 714, 716, 718, 742, 754 and 756 replaces the corresponding set of vias 312, 314, 316, 318, 342, 354 and 356, and similar detailed description is therefore omitted.

In some embodiments, each of the gates in the set of gates 704 and 706 are shown in FIGS. 7A-7C with labels "T1-T38" that identify corresponding transistors of FIGS. 5A-5B having corresponding gates in FIGS. 7A-7C, and are omitted for brevity.

The set of gates 704 includes at least gate 704a, . . . , 704n. In some embodiments, gate 704a, . . . , 704n is manufactured by corresponding gate pattern 604a, . . . , 604n of the set of gate patterns 604.

The set of gates 706 includes at least gate 706a, . . . , 706l. In some embodiments, gate 706a, . . . , 706l is manufactured by corresponding gate pattern 606a, . . . , 606l of the set of gate patterns 606.

In some embodiments, gate 704a is a gate of transistors T24 and T23, gate 704b is a gate of transistors T26 and T25, gate 704c is a gate of transistors T33 and T34, gate 704d is a gate of transistors T32 and T31, gate 704f is a gate of transistors T36 and T19, gate 704g is a gate of transistors T35 and T22, gate 704h is a gate of transistors T21 and T20, gate 704j is a gate of transistor T17, gate 704k is a gate of transistors T16 and T15 and gate 704l is a gate of transistors T37 and T38.

In some embodiments, gate 706a is a gate of transistors T28 and T27, gate 706c is a gate of transistors T7 and T4, gate 706d is a gate of transistors T5 and T3, gate 706e is a gate of transistors T6 and T1, gate 706f is a gate of transistors T8 and T2, gate 706h is a gate of transistor T9, gate 706j is a gate of transistors T10 and T21, gate 706k is a gate of transistor T12, gate 706l is a gate of transistors T14 and T11, gate 706m is a gate of transistors T29 and T30, gate 706n is a gate of transistors T13 and T18.

In some embodiments, at least gate 704e, 704i, 706b, 706g and 706i are dummy gates.

Other configurations, arrangements on other layout levels or quantities of gates in the set of gates 704, 305 and 706 are within the scope of the present disclosure.

Each contact of the set of contacts 708 or 710 corresponds to one or more drain or source terminals of transistors T1-T38 of integrated circuits 500A-500B or 700-800.

The set of contacts 708 includes at least contact 708a, . . . , 708j. In some embodiments, contact 708a, . . . , 708j is manufactured by corresponding contact pattern 608a, . . . , 608j of the set of contact patterns 608.

The set of contacts 710 includes at least contact 710a, . . . , 710g. In some embodiments, contact 710a, . . . , 710g is manufactured by corresponding contact pattern 610a, . . . , 610g of the set of contact patterns 610.

In some embodiments, contact 708*a* corresponds to the drain terminals of transistors T23 and T24, and electrically couples the drains of transistors T23 and T24 together.

In some embodiments, contact 708*b* corresponds to the drain terminals of transistors T25, T26, T33 and T34, and electrically couples the drains of transistors T25, T26, T33 and T34 together.

In some embodiments, contact 708*c* corresponds to the drain terminals of transistors T31 and T32, and electrically couples the drains of transistors T31 and T32 together.

In some embodiments, contact 708*g* corresponds to the drain terminals of transistors T20 and T21, and electrically couples the drains of transistors T20 and T21 together.

In some embodiments, contact 708*h* corresponds to the source terminals of transistors T17 and T18, and electrically couples the sources of transistors T17 and T18 together.

The set of vias 712 includes at least via 712*a*, . . . , 712*d* and the set of vias 312. In some embodiments, via 712*a*, . . . , 712*d* is manufactured by corresponding via pattern 612*a*, . . . , 612*d* of the set of via patterns 612. The set of via patterns 612 includes at least via patterns 612*a*, . . . , 612*d* and the set of via patterns 312.

The set of vias 714 includes at least via 714*a*, . . . , 714*b* and the set of vias 314. In some embodiments, via 714*a*, . . . , 714*b* is manufactured by corresponding via pattern 614*a*, . . . , 614*b* of the set of via patterns 614. The set of via patterns 614 includes at least via patterns 614*a*, . . . , 614*b* and the set of via patterns 214.

The set of vias 716 includes at least via 716*a*, . . . , 716*b* and the set of vias 316. In some embodiments, via 716*a*, . . . , 716*b* is manufactured by corresponding via pattern 616*a*, . . . , 616*b* of the set of via patterns 616. The set of via patterns 616 includes at least via patterns 616*a*, . . . , 616*b* and the set of via patterns 216.

The set of vias 718 includes at least via 718*a*, . . . , 718*b* and the set of vias 318. In some embodiments, via 718*a*, . . . , 718*b* is manufactured by corresponding via pattern 618*a*, . . . , 618*b* of the set of via patterns 618. The set of via patterns 618 includes at least via patterns 618*a*, . . . , 618*b* and the set of via patterns 218.

The set of conductors 720 includes at least conductor 720*a*, . . . , 720*n*. In some embodiments, conductor 720*a*, . . . , 720*n* is manufactured by corresponding conductive feature pattern 620*a*, . . . , 620*n* of the set of conductive feature patterns 620.

The set of conductors 722 includes at least conductor 722*a*, . . . , 722*m*. In some embodiments, conductor 722*a*, . . . , 722*m* is manufactured by corresponding conductive feature pattern 622*a*, ..., 622*m* of the set of conductive feature patterns 622.

The set of conductors 740 includes at least conductor 740*a*, . . . , 740*c* and the set of conductors 340. In some embodiments, conductor 740*a*, . . . , 740*c* is manufactured by corresponding conductive feature pattern 640*a*, . . . , 640*c* of the set of conductive feature patterns 640. The set of conductive feature patterns 640 includes at least conductive feature patterns 640*a*, . . . , 640*b* and the set of conductive feature patterns 240.

In some embodiments, conductor 740*a* is configured to route signal mx_ax, conductor 740*b* is configured to route signal CD, and conductor 740*c* is configured to route clock signal CLKB. In some embodiments, conductor 740*b* is an input pin of signal CD.

The set of vias 742 includes at least via 742*a*, . . . , 742*e* and the set of vias 342. In some embodiments, via 742*a*, . . . , 742*e* is manufactured by corresponding via pattern 642*a*, . . . , 642*e* of the set of via patterns 642. The set of via patterns 642 includes at least via patterns 642*a*, . . . , 642*e* and the set of via patterns 242.

The set of conductors 750 includes at least conductor 750*a*, . . . , 750*d*. In some embodiments, conductor 750*a*, . . . , 750*d* is manufactured by corresponding conductive feature pattern 650*a*, . . . , 650*d* of the set of conductive feature patterns 650.

The set of conductors 752 includes at least conductor 752*a*, . . . , 752*b*. In some embodiments, conductor 752*a*, . . . , 752*b* is manufactured by corresponding conductive feature pattern 652*a*, . . . , 652*b* of the set of conductive feature patterns 652.

The set of vias 754 includes at least via 754*a*, . . . , 754*n*. In some embodiments, via 754*a*, ..., 754*n* is manufactured by corresponding via pattern 654*a*, . . . , 654*n* of the set of via patterns 654. The set of via patterns 654 includes at least via patterns 654*a*, . . . , 654*n*.

The set of vias 756 includes at least via 756*a*, . . . , 756*d*. In some embodiments, via 756*a*, . . . , 756*d* is manufactured by corresponding via pattern 656*a*, . . . , 656*d* of the set of via patterns 656. The set of via patterns 656 includes at least via patterns 656*a*, . . . , 656*d*.

Conductors 750*a*, 750*c* and 750*d* are the VDD power rail, and conductor 750*b* the VSS power rail.

Conductor 750*a* is electrically coupled to and configured to provide voltage VDD to the source of transistors T23 and T25 by via 754*g*, the source of transistors T33 and T31 by via 754*b*, and the source of transistor T19 by via 754*b*.

Conductor 750*c* is electrically coupled to and configured to provide voltage VDD to the source of transistors T11 and T29 by via 754*e*.

Conductor 750*d* is electrically coupled to and configured to provide voltage VDD to the source of transistors T27 and T4 by corresponding vias 754*h* and 754*m*.

Conductor 750*b* is electrically coupled to and configured to provide voltage VSS to the source of transistors T24 and T26 by via 754*c*, the source of transistors T34 and T32 by via 754*k*, the source of transistors T36 and T22 by via 754*f*, the source of transistors T16 and T37 by via 754*a*, the source of transistors T7 and T5 by via 754*l*, the source of transistors T14 and T30 by via 754*i*, and the source of transistor T28 by via 754*j*.

In some embodiments, integrated circuit 700 includes a hybrid power rail structure where one or more transistor devices are configured to receive power (VDD and VSS) from the back-side 303*b* of integrated circuit 700 by the set of conductors 750, and one or more transistor devices are configured to receive power (at least VDD or VSS) from the front-side 303*a* of integrated circuit 700 by at least the set of conductors 720, the set of conductors 722 or the set of conductors 740.

In some embodiments, when viewed from the bottom/backside (e.g., in the positive Z-direction) of integrated circuit 700, one or more transistor devices are covered by the set of conductors 752, and power is delivered to the one or more covered transistors from the front-side 303*a* of integrated circuit 700 by at least the set of conductors 720, 722 or 740. For example, when viewed from the bottom/backside (e.g., in the positive Z-direction) of integrated circuit 700, transistor T2 is covered by conductor 752*a* thereby preventing via landing spots from the back-side 303*b* of integrated circuit 700, and therefore power is delivered to transistor T2 from the front-side 303*a* of integrated circuit 700 by at least conductor 720*m* or 722*k* or conductor 340*g*.

As shown in FIGS. 7A-7C, transistor T2 is configured to receive current I3 of supply voltage VDD from the front-side 303*a* of integrated circuit 700. The source of transistor T2 is electrically coupled to conductor 750b, and thus receives supply voltage VDD or current I3 from conductor 750b. For example, conductor 750b is electrically coupled to the source of transistor T19 by via 754b. The source of transistor T19 is configured to receive current I3 from conductor 750b. The source of transistor T19 is further electrically coupled to contact 708d on the front-side 303a of integrated circuit 700. Contact 708d is electrically coupled to conductor 720m by via 312f. Conductor 720m is electrically coupled to conductor 340g by via 342o. Conductor 340g is electrically coupled to conductor 722k by via 342n. Conductor 722k is electrically coupled to contact 710c by via 314c. The contact 710c is electrically coupled to the source of transistor T2. Thus, the source of transistor T2 is configured to receive current I3 of supply voltage VDD from conductor 722k.

In some embodiments, by having transistor T2 receive power from the front-side 303a of integrated circuit 700 through the active region of transistor T19, current I3 may encounter increased resistance by flowing through one or more epitaxial layers in the active region of transistors T19. However, since transistor T2 does not affect the timing of integrated circuit 700, the increased resistance from the active region of transistor T19 does not affect the performance of integrated circuit 700 and integrated circuit 700 occupies less area than other approaches. In some embodiments, by having the set of conductors 752 on the back-side 303b of integrated circuit 700, the set of conductors 752 provide additional routing resources thereby reducing the area of integrated circuit 700 compared to other approaches.

In some embodiments, while integrated circuit 700 included one transistor configured to receive power (voltage VDD or VSS) from the front-side 303a and the other transistors configured to receive power (voltage VDD or VSS) from the back-side 303b, other numbers of transistors configured to receive power (voltage VDD or VSS) from the front-side 303a are within the scope of the present disclosure.

Other configurations or arrangements of integrated circuit 700 are within the scope of the present disclosure.

FIGS. 8A-8D are diagrams of an integrated circuit 800, in accordance with some embodiments.

Integrated circuit 800 is an embodiment of integrated circuit 500B of FIG. 5B.

Figure 8A:
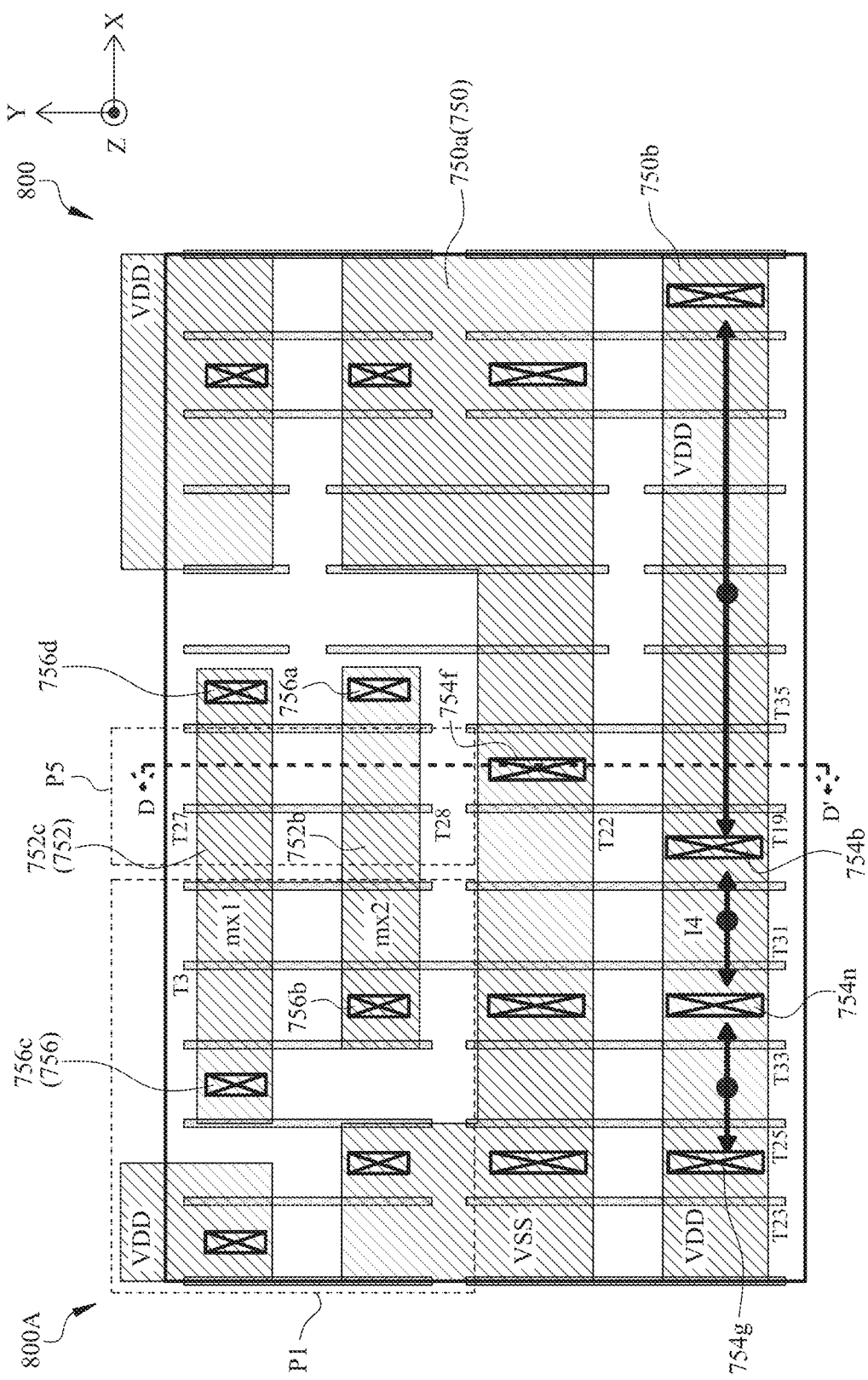
FIGS. 8A-8D are diagrams of an integrated circuit, in accordance with some embodiments.
Figure 8B:
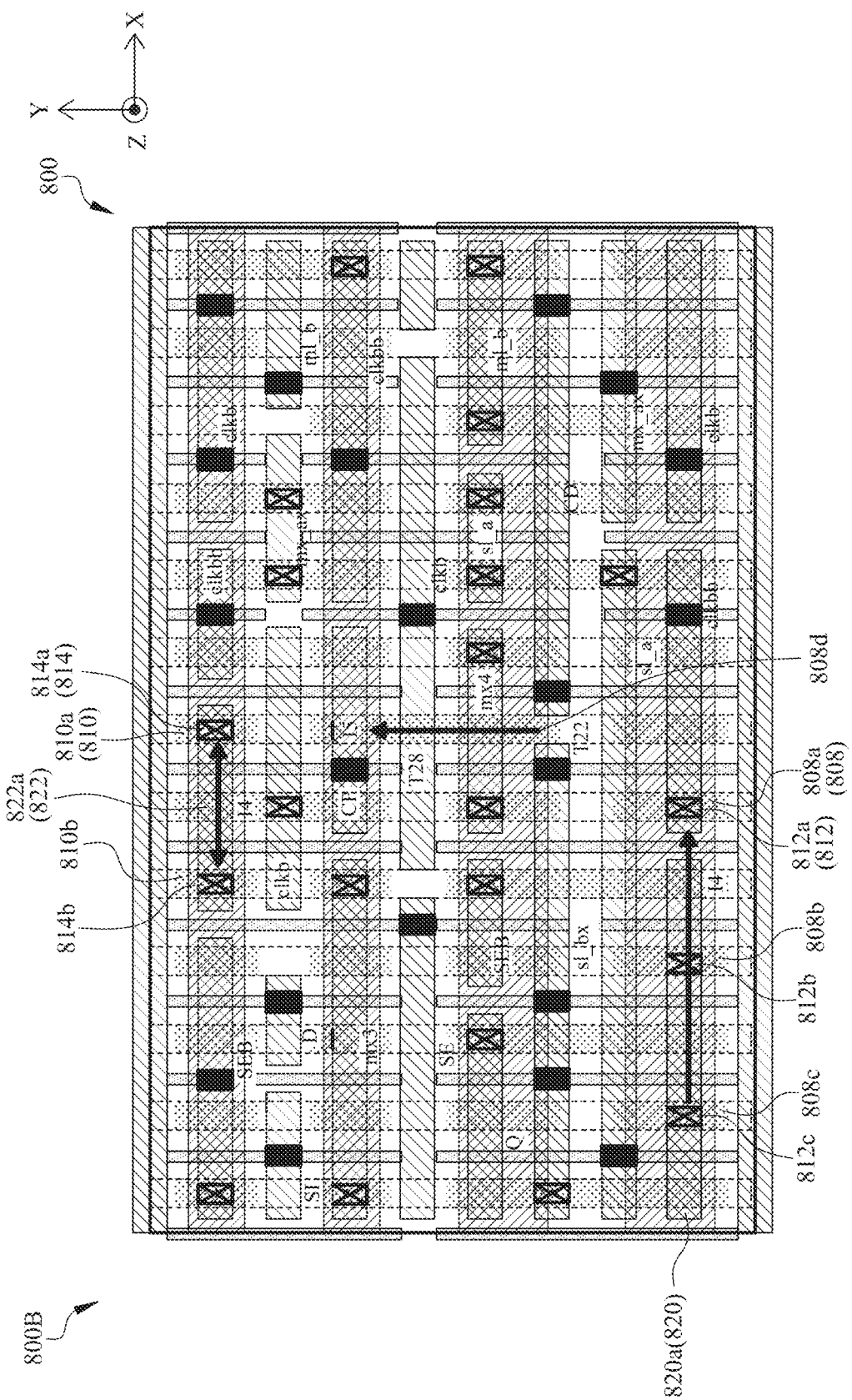
Figure 8C:
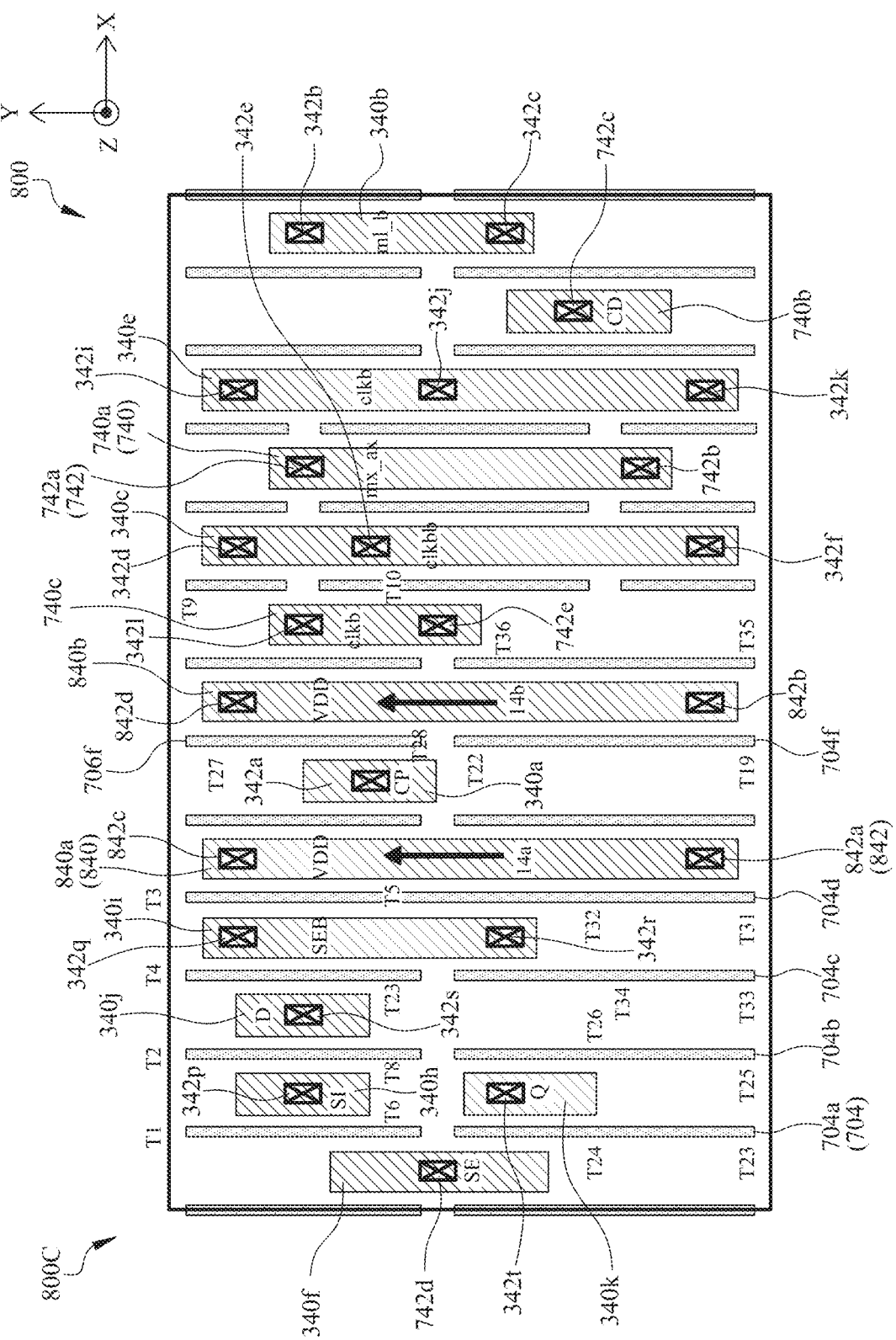
Figure 8D:
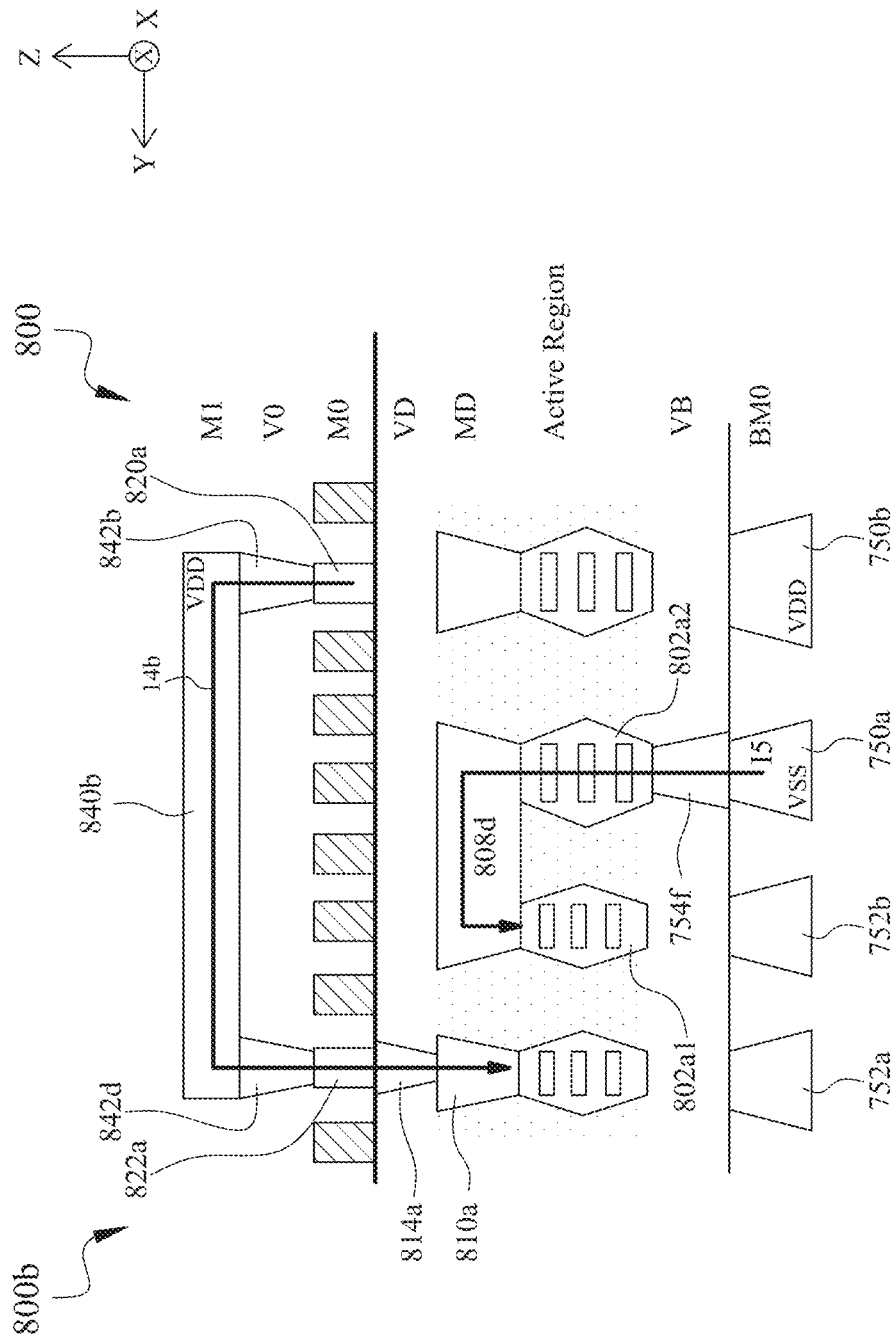

FIGS. 8A-8C are corresponding diagrams of corresponding portions 800A-800C of an integrated circuit 800, simplified for ease of illustration. FIG. 8D is a cross-sectional view of integrated circuit 800 as intersected by plane D-D', in accordance with some embodiments.

Portion 800A is similar to portion 700A of FIGS. 7A-7C, and similar detailed description is omitted. Portion 800B is similar to portion 700B of FIGS. 7A-7C, and similar detailed description is omitted. Portion 800C is similar to portion 700C of FIGS. 7A-7C, and similar detailed description is omitted.

Integrated circuit 800 is manufactured by a corresponding layout design similar to integrated circuit 700. Integrated circuit 800 is an embodiment of integrated circuit 500B, and similar detailed description is omitted. For brevity FIGS. 8A-8D are described as a corresponding integrated circuit 800, but in some embodiments, FIGS. 8A-8D also correspond to layout designs similar to layout design 600, structural elements of integrated circuit 800 also correspond to layout patterns, and structural relationships including alignment, lengths and widths, as well as configurations and layers of a corresponding layout design of integrated circuit 800 are similar to the structural relationships and configurations and layers of integrated circuit 800, and similar detailed description will not be described for brevity.

In some embodiments, integrated circuit 800 is manufactured by a layout design similar to layout design 600, and similar detailed description is omitted for brevity.

Integrated circuit 800 is a variation of integrated circuit 300 (FIGS. 3A-3F) and integrated circuit 700 (FIGS. 7A-7C). For example, integrated circuit 800 illustrates an example of where parallel conductors 440a and 440b of the set of conductors 440 are used to supply power from the front-side of integrated circuit 800 to at least an active region of one or more transistors.

In some embodiments, each of the gates in the set of gates 704 and 706 are shown in FIGS. 8A-8D with labels "T1-T38" that identify corresponding transistors of FIGS. 5A-5B having corresponding gates in FIGS. 8A-8D, and are omitted for brevity.

Integrated circuit 800 includes at least the set of active regions 302, the set of dummy gates 305, the set of gates 704 and 706, the set of contacts 808, the set of contacts 810, the set of conductors 820, the set of conductors 822, the set of vias 812, the set of vias 814, the set of vias 716, the set of vias 718, the set of conductors 840, the set of vias 842, the set of conductors 750, the set of conductors 752, the set of vias 754, the set of vias 756, substrate 390 and insulating region 392.

In comparison with integrated circuit 700 of FIGS. 7A-7C, set of vias 754 does not include via 754m and 754l, and similar detailed description is therefore omitted.

In comparison with integrated circuit 700 of FIGS. 7A-7C, set of conductors 840 of integrated circuit 800 replaces the set of conductors 740, set of vias 842 of integrated circuit 800 replaces the set of vias 742, set of conductors 820 of integrated circuit 800 replaces the set of conductors 720, and set of conductors 822 of integrated circuit 800 replaces the set of conductors 722, and similar detailed description is therefore omitted.

In comparison with integrated circuit 700 of FIGS. 7A-7C, set of contacts 808 of integrated circuit 800 replaces the set of contacts 708, set of contacts 810 of integrated circuit 800 replaces the set of contacts 710, set of vias 812 of integrated circuit 800 replaces the set of vias 712, set of vias 814 of integrated circuit 800 replaces the set of vias 714, and similar detailed description is therefore omitted.

Set of conductors 840 includes at least conductor 840a or 840b, set of conductors 740 of FIGS. 7A-7C or set of conductors 340 of FIGS. 3A-3F. In comparison with integrated circuit 700 of FIGS. 7A-7C, conductors 840a and 840b replace conductor 340g, and similar detailed description is therefore omitted.

Set of vias 842 includes at least set of vias 742, 842a, 842b, 842c or 842d. In comparison with integrated circuit 700 of FIGS. 7A-7C, set of vias 842 does not include via 742d, vias 842a and 842b replaces via 342o, and vias 842c and 842d replaces via 342n, and similar detailed description is therefore omitted.

In comparison with integrated circuit 700 of FIGS. 7A-7C, set of contacts 808 include set of contacts 708, contact 808a, 808b, 808c or 808d, and similar detailed description is therefore omitted. In some embodiments, contact 808a, 808b, 808c or 808d is similar to contact 708a, and similar detailed description is therefore omitted.

In comparison with integrated circuit 700 of FIGS. 7A-7C, set of contacts 810 include set of contacts 710, contact 810a or 810b, and similar detailed description is therefore omitted. In some embodiments, contact 810a or 810b is similar to contact 710a, and similar detailed description is therefore omitted.

Set of conductors 820 includes at least conductor 820a or set of conductors 720 of FIG. 7. In comparison with integrated circuit 700 of FIGS. 7A-7C, conductor 820a replaces conductor 720l, and similar detailed description is therefore omitted.

Set of conductors 822 includes at least conductor 822a or set of conductors 722 of FIG. 7. In comparison with integrated circuit 700 of FIGS. 7A-7C, conductor 822a replaces conductor 722j, and similar detailed description is therefore omitted.

Set of vias 812 includes at least set of vias 712, 812a, 812b or 812c. In some embodiments, at least via 812a, 812b or 812c is similar to via 712a, and similar detailed description is therefore omitted.

Set of vias 814 includes at least set of vias 714, 814a or 814b. In some embodiments, at least via 814a or 814b is similar to via 714a, and similar detailed description is therefore omitted.

In some embodiments, integrated circuit 800 includes a hybrid power rail structure where one or more transistor devices are configured to receive power (VDD and VSS) from the back-side 303b of integrated circuit 800 by the set of conductors 850, and one or more transistor devices are configured to receive power (at least VDD or VSS) from the front-side 303a of integrated circuit 800 by at least the set of contacts 808, the set of contacts 810, the set of conductors 820, the set of conductors 822 or the set of conductors 840.

In some embodiments, when viewed from the bottom/backside (e.g., in the positive Z-direction) of integrated circuit 800, one or more transistor devices are covered by the set of conductors 752, and power is delivered to the one or more covered transistors from the front-side 303a of integrated circuit 800 by at least the set of contacts 808, the set of contacts 810, the set of conductors 820, 822 or 840.

For example, when viewed from the bottom/backside (e.g., in the positive Z-direction) of integrated circuit 800, transistor T28 is covered by conductor 752b thereby preventing via landing spots from the back-side 303b of integrated circuit 800, and therefore power is delivered to transistor T28 from the front-side 303a of integrated circuit 800 by at least contact 808d. As shown in FIGS. 8A-8D, transistor T28 is configured to receive current I5 of reference voltage VSS from the front-side 303a of integrated circuit 800. The source 802a1 of transistor T28 is electrically coupled to conductor 750a, and thus receives reference voltage VSS or current I5 from conductor 750a. For example, conductor 750a is electrically coupled to the source 802a2 of transistor T22 by via 754f. The source 802a2 of transistor T22 is configured to receive current I5 from conductor 750a. The source 802a2 of transistor T22 is further electrically coupled to contact 808d on the front-side 303a of integrated circuit 800. Contact 808d is electrically coupled to the source 802a1 of transistor T28. Thus, the source 802a1 of transistor T28 is configured to receive current IS of reference voltage VSS from conductor 750a by at least the source 802a2 of transistor T22 and contact 808d.

In some embodiments, by having transistor T28 receive power from the front-side 303a of integrated circuit 800 through the active region of transistor T22, power is still able to be delivered to transistor T28, even though transistor T28 is covered by conductor 752b, thus allowing the set of conductors 752 to provide additional routing resources thereby reducing the area of integrated circuit 800 compared to other approaches.

In yet another example, when viewed from the bottom/backside (e.g., in the positive Z-direction) of integrated circuit 800, transistors T3 and T27 are covered by conductor 752a thereby preventing via landing spots from the back-side 303b of integrated circuit 800, and therefore power is delivered to transistors T3 and T27 from the front-side 303a of integrated circuit 800 by at least conductor 820a or 822a or at least conductor 840a or 840b.

As shown in FIGS. 8A-8D, transistors T3 and T27 are configured to receive current I4 of voltage VDD from the front-side 303a of integrated circuit 800. The source of transistors T3 and T27 is electrically coupled to conductor 750b, and thus receives supply voltage VDD or current I4 from conductor 750b. For example, conductor 750b is electrically coupled to the source of transistors T25 and T23 by via 754g, and conductor 750b is electrically coupled to the source of transistors T31 and T33 by via 754n, and conductor 750b is electrically coupled to the source of transistor T19 by via 754b. The source of transistors T25 and T23, the source of transistors T31 and T33, and the source of transistor T19 are configured to receive current I4 from conductor 750b. The source of transistors T25 and T23 is further electrically coupled to contact 808c on the front-side 303a of integrated circuit 800. Contact 808c is electrically coupled to conductor 820a by via 812c. The source of transistors T31 and T33 are further electrically coupled to contact 808b on the front-side 303a of integrated circuit 800. Contact 808b is electrically coupled to conductor 820a by via 812b. The source of transistor T19 is further electrically coupled to contact 808a on the front-side 303a of integrated circuit 800. Contact 808a is electrically coupled to conductor 820a by via 812a. Conductor 820a is electrically coupled to conductor 840a by via 842a. Conductor 820a is configured to carry current I4. In some embodiments, current I4 is divided into current I4a and I4b. In some embodiments, current I4 is the sum of current I4a and I4b. In some embodiments, at least conductors 840a and 840b are coupled in parallel, and are configured as a current divider. In some embodiments, conductor 840a is configured to carry current I4a, and conductor 840b is configured to carry current I4b. Conductor 840a is electrically coupled to conductor 822a by via 842c. Conductor 820a is electrically coupled to conductor 840b by via 842b. Conductor 840b is electrically coupled to conductor 822a by via 842d. Conductor 822a is configured to receive currents I4a and I4b. Conductor 822a is configured to carry current I4 as currents I4a and I4b are summed together at conductor 822a. Conductor 822a is electrically coupled to contact 810b by via 814b, and to contact 810a by via 814a. The contact 810b is electrically coupled to the source of transistor T3. The contact 810a is electrically coupled to the source of transistor T27. Thus, the sources of corresponding transistors T3 and T27 are configured to receive current I4 of supply voltage VDD from conductor 822a.

In some embodiments, the active region of transistors T3 and T27 and conductor 820a are electrically coupled together by parallel paths thereby lowering the resistance from routing the supply voltage from the front-side of integrated circuit 800 to at least an active region of one or more transistors. In some embodiments, the parallel paths include at least conductors 840a, 840b, 820a, 822a, vias, 842a, 842b, 842c, 842d, vias 754a, 754n and 754g.

In some embodiments, by having transistors T3 and T27 receive power from the front-side 303a of integrated circuit 800 through the active region of transistors T25, T23, T31, T33 or T19, resistance from at least one or more epitaxial layers in the active regions of transistors T25, T23, T31, T33 or T19 is reduced by the one or more parallel paths between the active region of transistors T3 and T27 and conductor 750b thereby causing integrated circuit 800 to have better performance than other approaches. In some embodiments, by having the set of conductors 752 on the back-side 303b of integrated circuit 800, the set of conductors 752 provide additional routing resources thereby reducing the area of integrated circuit 800 compared to other approaches.

Other configurations or arrangements of integrated circuit 800 are within the scope of the present disclosure.

Figure 9A:
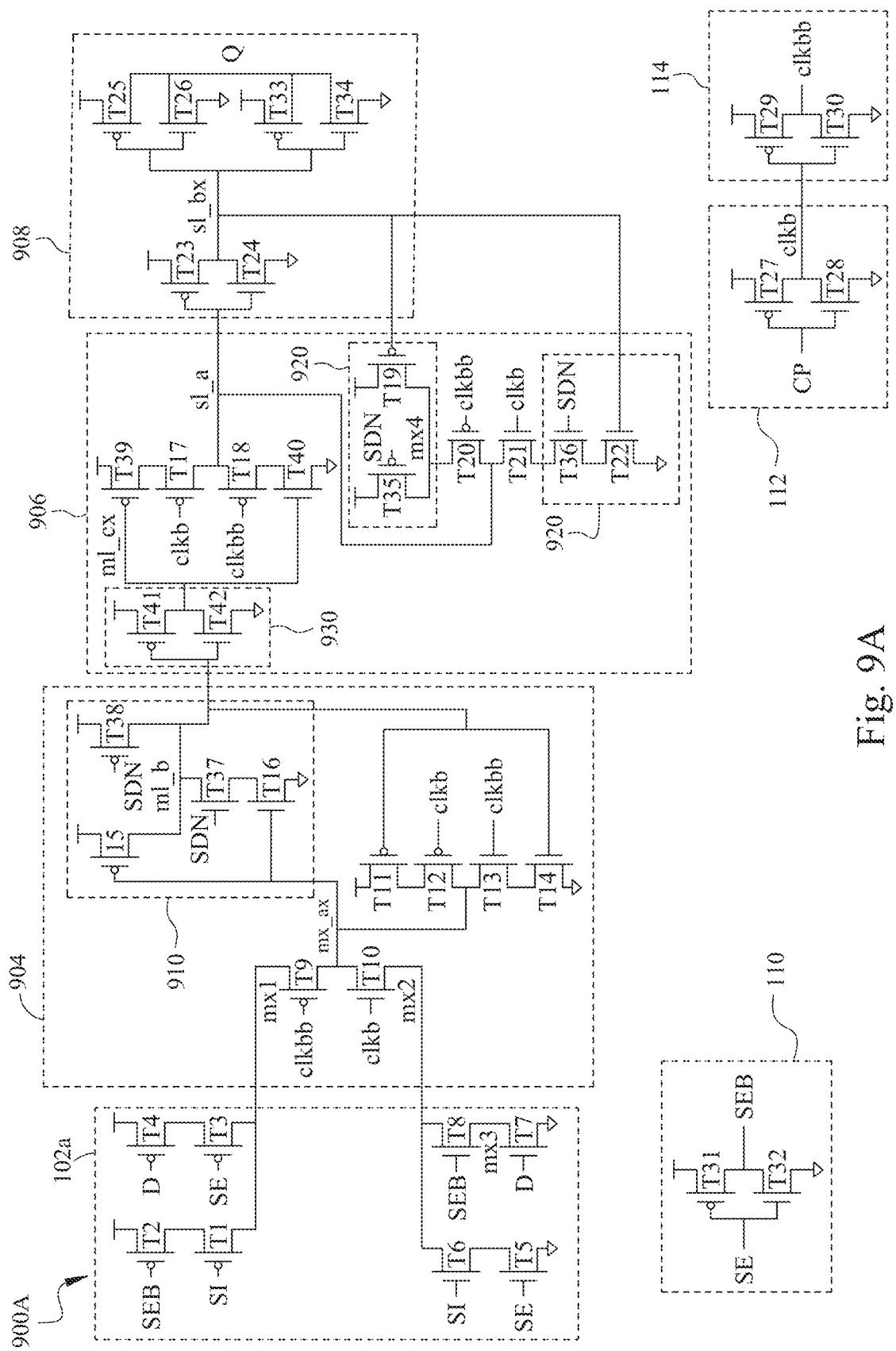
FIG. 9A is a circuit diagram of an integrated circuit, in accordance with some embodiments.

FIG. 9A is a circuit diagram of an integrated circuit 900A, in accordance with some embodiments.

Integrated circuit 900A is a variation of integrated circuit 100A and integrated circuit 500A, and similar detailed description is therefore omitted. In comparison with integrated circuit 100A, a latch 904 of FIG. 9A replaces latch 104, a latch 906 of FIG. 9A replaces latch 106, and output circuit 908 from FIG. 9A replaces output circuit 508, and similar detailed description is therefore omitted.

For example, in comparison with integrated circuit 100A of FIG. 1A, latch 904 includes a NAND logic circuit 910, and latch 906 includes a NAND logic circuit 920 and an inverter 930.

In comparison with latch 104, latch 904 further includes a NAND logic circuit 910, and similar detailed description is therefore omitted.

NAND logic circuit 910 includes transistors T37, T38, T15 and T16. Similar details from FIGS. 1A and 5A will not be described for brevity. In some embodiments, NAND logic circuit 910 adds a reset function to latch 904 based on a signal SDN.

A source terminal of transistor T38 is coupled to the voltage supply VDD. In some embodiments, the source terminal of transistor T38 is coupled to the source terminal of transistor T15.

Each of the drain terminal of transistor T15, the drain terminal of transistor T38, the drain terminal of transistor T37, a gate terminal of transistor T41, a gate terminal of transistor T42, the gate terminal of transistor T11 and the gate terminal of transistor T14 are coupled together, and correspond to signal ml_b.

The source terminal of transistor T37 is coupled to the drain terminal of transistor T16.

Each of a gate terminal of transistor T38 and a gate terminal of transistor T37 are configured to receive signal SDN. In some embodiments, the gate terminal of transistor T38 is coupled to the gate terminal of transistor T37.

In comparison with latch 106, latch 906 does not include transistors T15 and T16 (e.g., transistors T15 and T16 are part of NAND logic circuit 910), but further includes transistors T35, T36, T39 and T40, and inverter 930, and similar detailed description is therefore omitted. In some embodiments, transistors T19, T22, T35 and T36 are configured as a NAND logic circuit 920. In some embodiments, NAND logic circuit 920 adds a reset function to latch 906 based on signal SDN.

A source terminal of transistor T35 is coupled to the voltage supply VDD. In some embodiments, the source terminal of transistor T35 is coupled to the source terminal of transistor T19. Each of the drain terminal of transistor T19, the drain terminal of transistor T35 and the source terminal of transistor T20 are coupled together.

A drain terminal of transistor T21 is coupled to the drain terminal of transistor T36. A source terminal of transistor T36 is coupled to the drain terminal of transistor T22.

Each of a gate terminal of transistor T35 and a gate terminal of transistor T36 are configured to receive signal SDN. In some embodiments, the gate terminal of transistor T35 is coupled to the gate terminal of transistor T36.

Inverter 930 includes transistors T41 and T42, and is configured to receive signal ml_b, and to generate signal ml_cx. The gate terminals of transistors T41 and T42 are configured to receive signal ml_b. A source terminal of transistor T41 is coupled to the voltage supply VDD. A source terminal of transistor T42 is coupled to the reference voltage supply VSS. Each of the drain terminal of transistor T41, the drain terminal of transistor T42, the gate terminal of transistor T39 and the gate terminal of transistor T40 are coupled together.

A source terminal of transistor T39 is coupled to the voltage supply VDD. A source terminal of transistor T40 is coupled to the reference voltage supply VSS.

A drain terminal of transistor T39 is coupled to the source/drain terminal of transistor T17. The drain/source terminal of transistor T18 is coupled to a drain terminal of transistor T40. In some embodiments, signal sl_a is output by transistors T17 and T18.

Other configurations, arrangements or other circuits in integrated circuit 900A are within the scope of the present disclosure.

Figure 9B:
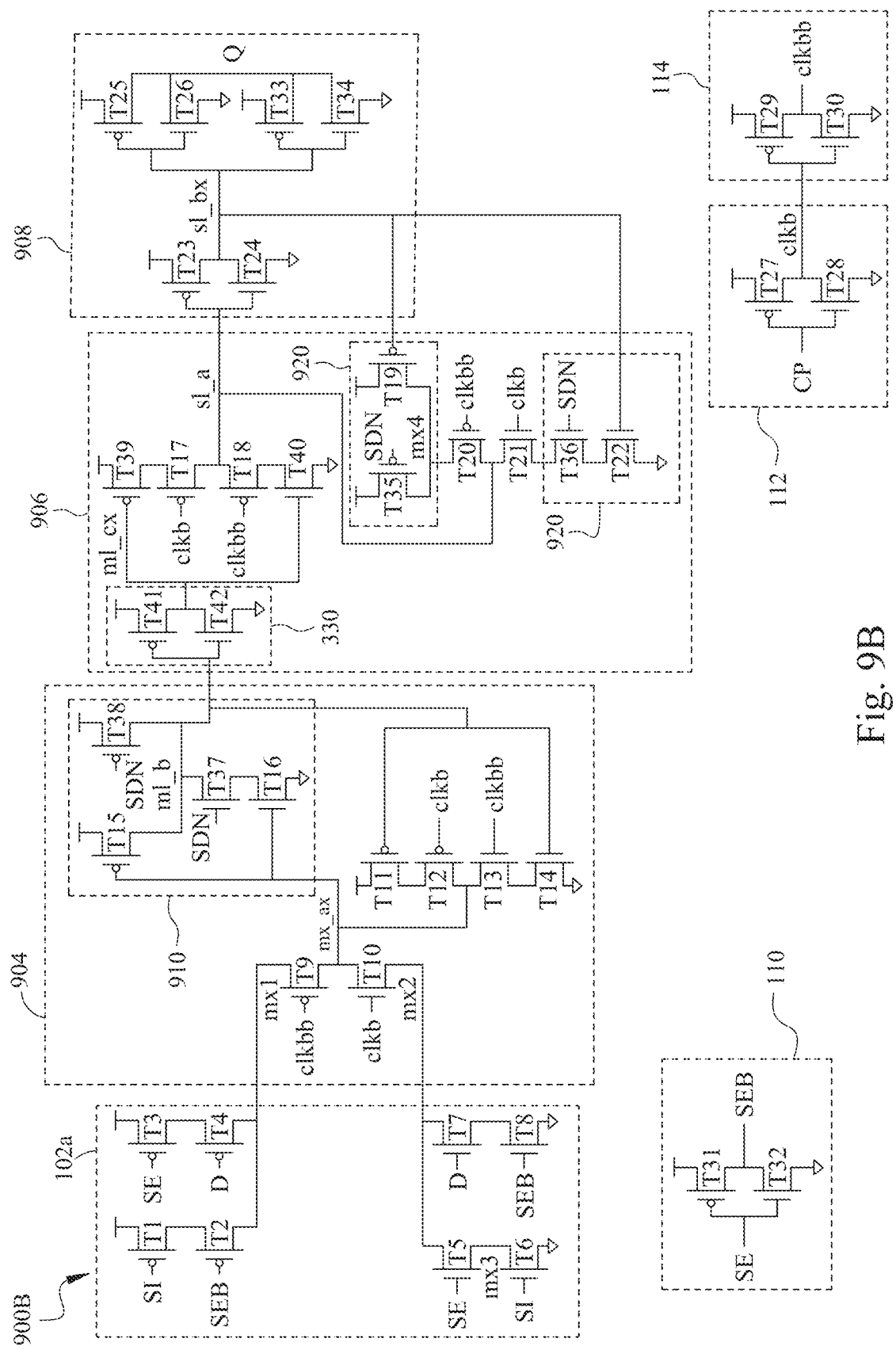
FIG. 9B is a circuit diagram of an integrated circuit, in accordance with some embodiments.

FIG. 9B is a circuit diagram of an integrated circuit 900B, in accordance with some embodiments.

Integrated circuit 900B is a variation of integrated circuit 100B and integrated circuit 900A and similar detailed description is therefore omitted. For example, integrated circuit 900B combines the features of integrated circuit 900A and integrated circuit 100B.

In comparison with integrated circuit 900A, multiplexer 102b of FIG. 9B replaces multiplexer 102a of FIG. 9A, and similar detailed description is therefore omitted.

In comparison with integrated circuit 900A, signal mx3 corresponds to a signal where the drain of transistor T6 and the source of transistor T5 are coupled together.

Other configurations, arrangements or other circuits in integrated circuit 900B are within the scope of the present disclosure.

Figure 10A:
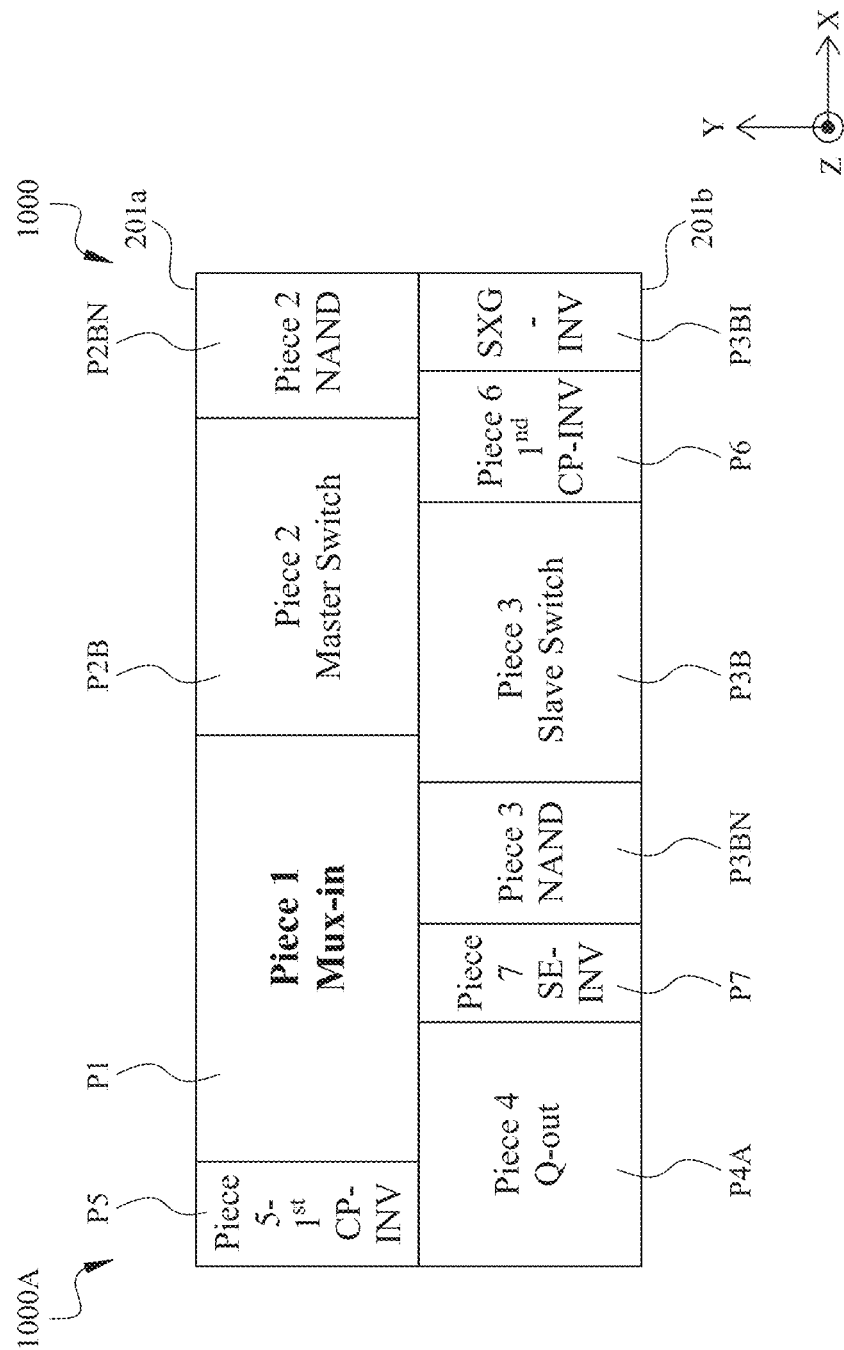
FIG. 10A is a diagram of a floorplan of an integrated circuit, in accordance with some embodiments.

FIG. 10A is a diagram of a floorplan 1000A of an integrated circuit, in accordance with some embodiments.

In some embodiments, floorplan 1000A is a floorplan of integrated circuit 900A of FIG. 9A or integrated circuit 900B of FIG. 9B. In some embodiments, floorplan 1000A corresponds to the layout diagram 1000 shown in FIGS. 10B-10G.

Floorplan 1000A is a variation of floorplan 200A or 600A, and similar detailed description is therefore omitted.

In comparison with floorplan 200A, latch region P2B of FIG. 10A replaces latch region P2, a latch region P3B of FIG. 10A replaces latch region P3, output region P4A of FIG. 10A replaces output region P4, and similar detailed description is therefore omitted. In comparison with floorplan 200A, floorplan 1000A further includes a NAND region P2BN, a NAND region P3BN and an inverter region P3BI.

Floorplan 1000A includes multiplexer region P1, latch region P2B, latch region P3B, output region P4A, NAND region P2BN, a NAND region P3BN, an inverter region P3BI and inverter regions P5-P7.

In some embodiments, latch region P2B corresponds to latch 904, latch region P3B corresponds to latch 906, output region P4A corresponds to output circuit 908, NAND region P2BN corresponds to NAND logic circuit 910, NAND region P3BN corresponds to NAND logic circuit 920, and inverter region P3BI corresponds to inverter 930, and similar detailed description is therefore omitted.

Each of multiplexer region P1, latch region P2B, inverter region P5 and NAND region P2BN are in a first row. Latch region P2B and multiplexer region P1 are between inverter region P5 and NAND region P2BN. Multiplexer region P1 is between inverter region P5 and latch region P2B. Latch region P2B is between multiplexer region P1 and NAND region P2BN.

Each of output region P4A, inverter region P7, NAND region P3BN, latch region P3B, inverter region P6 and inverter region P3BI are in a second row. Inverter region P7, NAND region P3BN, latch region P3B and inverter region P6 are between output region P4A and inverter region P3BI. Inverter region P7 is between output region P4A and NAND region P3BN. NAND region P3BN is between inverter region P7 and latch region P3B. Latch region P3B is between NAND region P3BN and inverter region P6. Inverter region P6 is between latch region P3B and inverter region P3BI.

FIGS. 10B-10D are corresponding diagrams of corresponding portions 1000B-1000D of a layout design 1000 divided into the regions of floorplan 1000A, simplified for ease of illustration.

The layout design 1000 is divided into the regions of the floorplan 1000A.

Layout design 1000 is a layout diagram of integrated circuit 900A of FIG. 9A.

Portion 1000B includes one or more features of layout design 1000 of the POLY level, the BM0 level and the VB level. Portion 1000C includes one or more features of layout design 1000 of the active level or the OD level, the POLY level, the MD level, the M0 level, the VG level and the VD level. Portion 1000D includes one or more features of layout design 1000 of the POLY level, the M1 level and the V0 level.

Figure 10E:
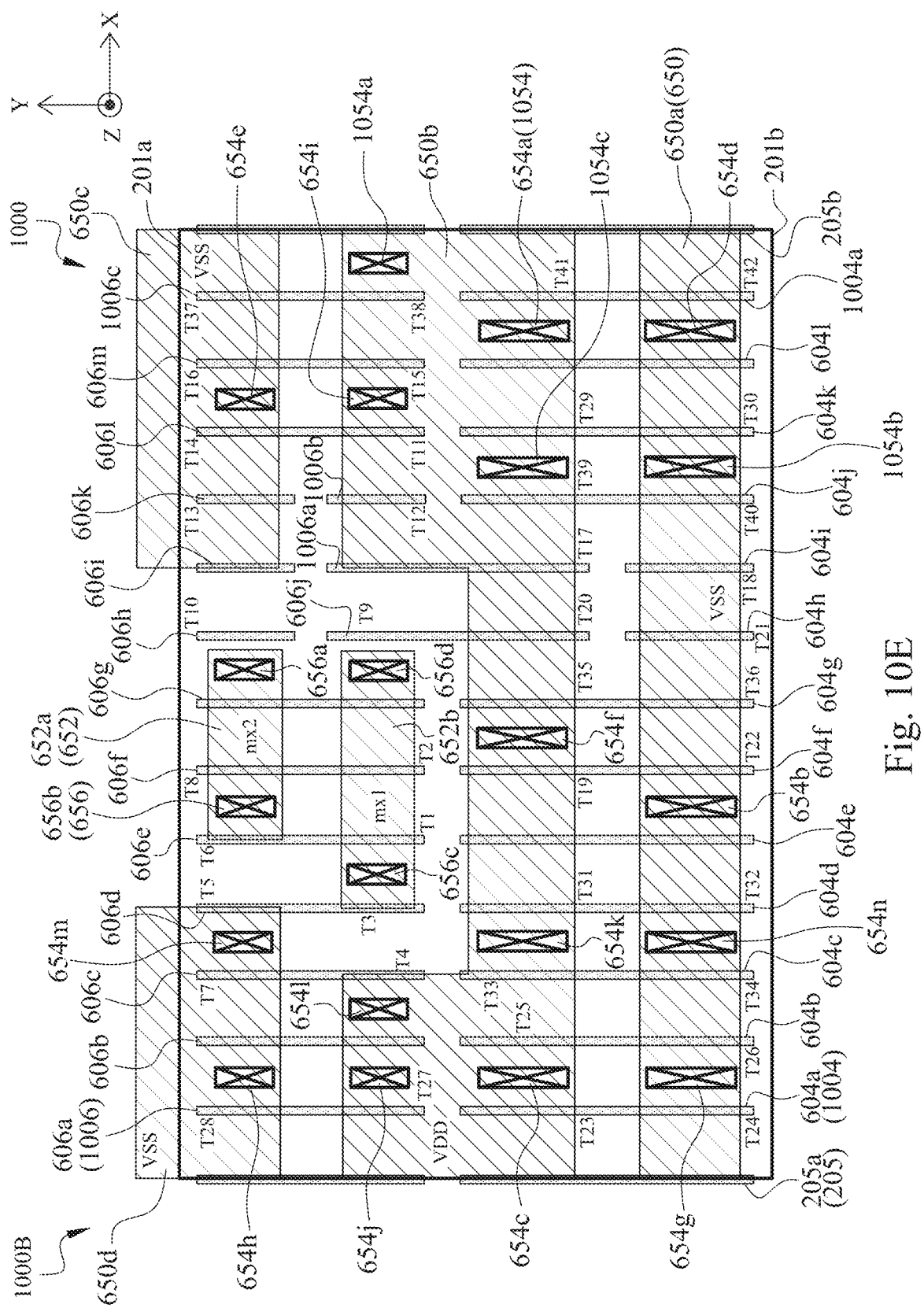
FIGS. 10E-10G are corresponding diagrams of corresponding portions of layout design, simplified for ease of illustration.
Figure 10F:
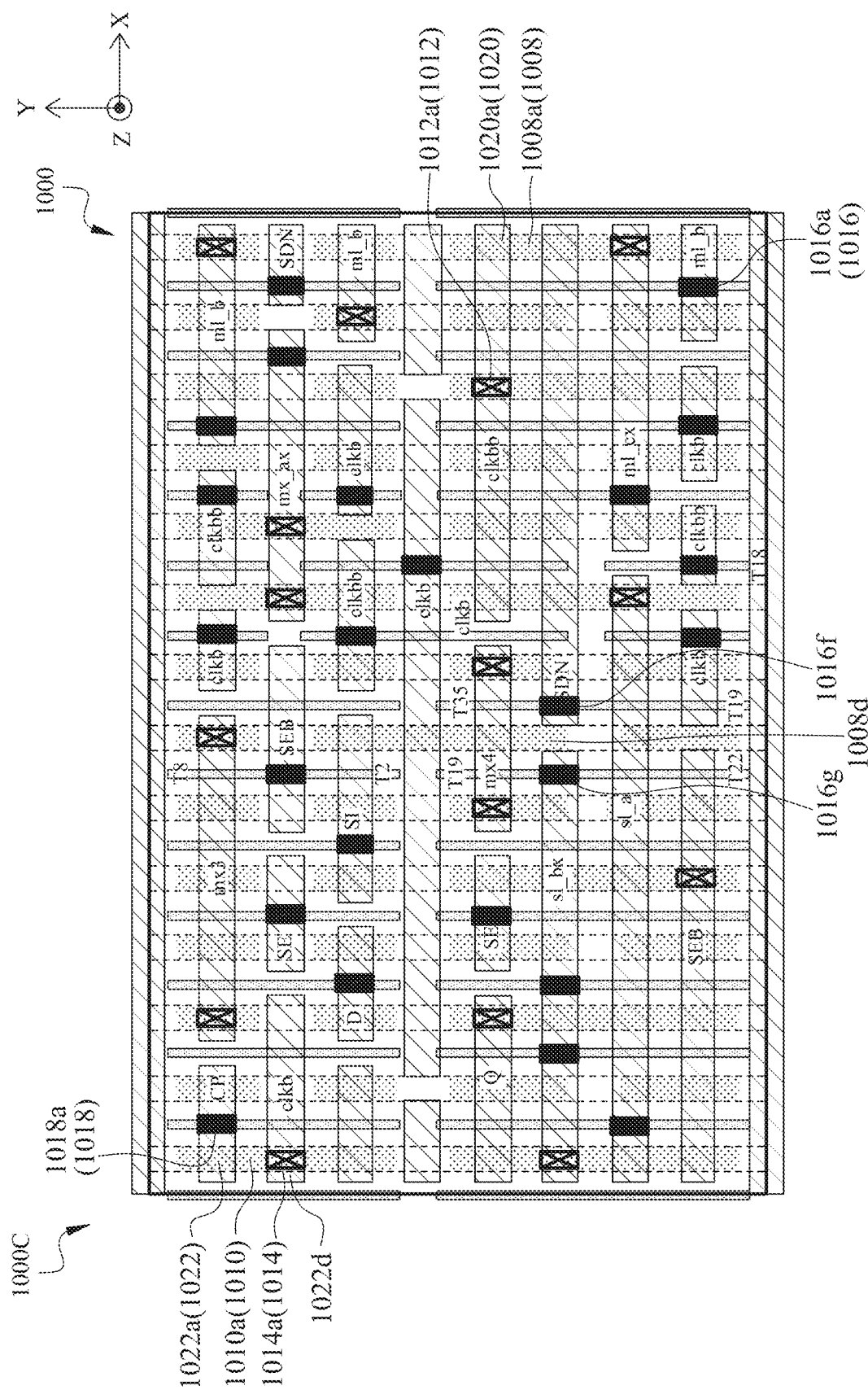
Figure 10G:
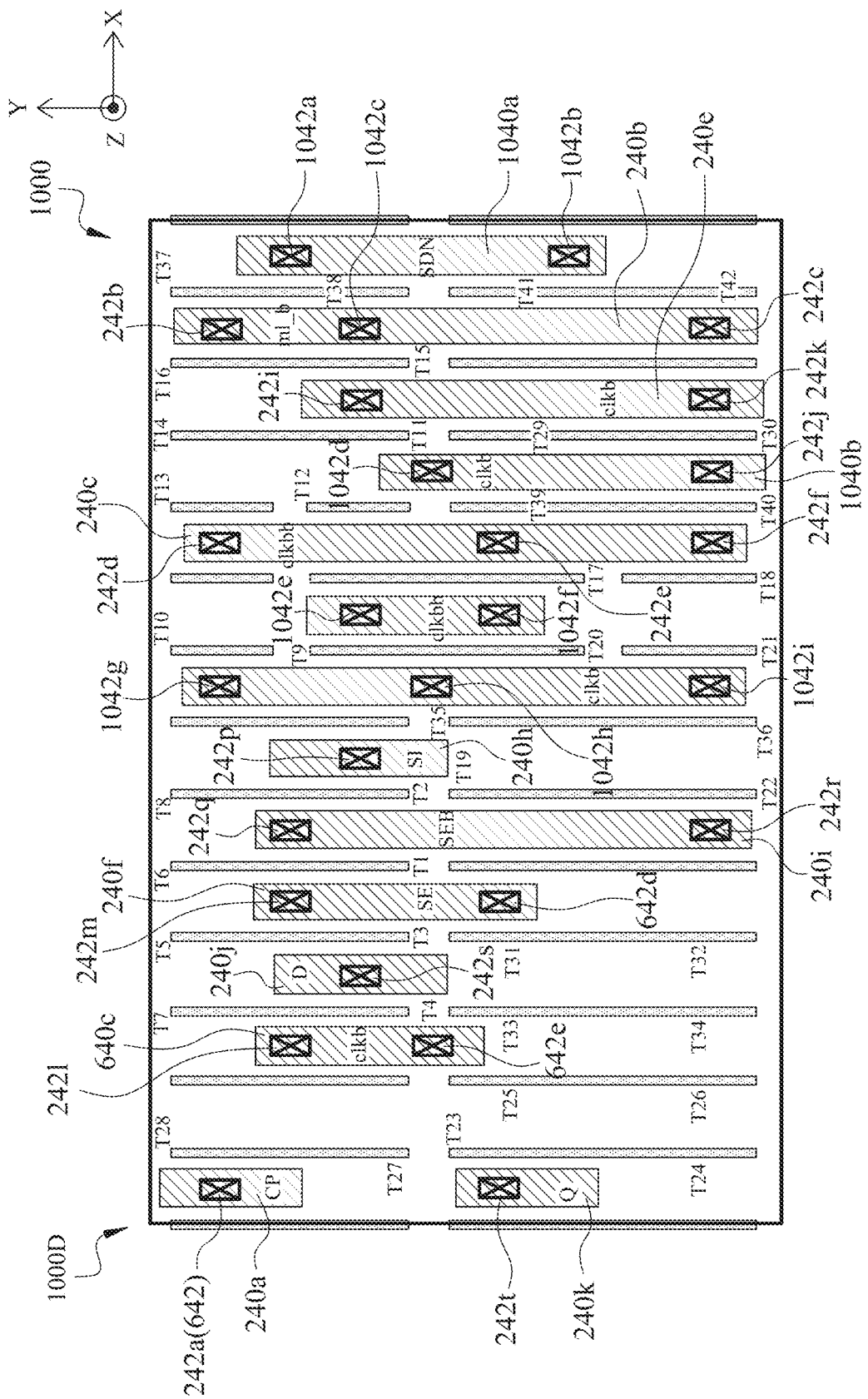

FIGS. 10E-10G are corresponding diagrams of corresponding portions 1000B-1000D of layout design 1000, simplified for ease of illustration.

Layout design 1000 includes one or more features of the BM0 level, the VB level, the OD level, the POLY level, the MD level, the M0 level, the VG level, the VD level, the M1 level and the V0 level.

Figure 11A:
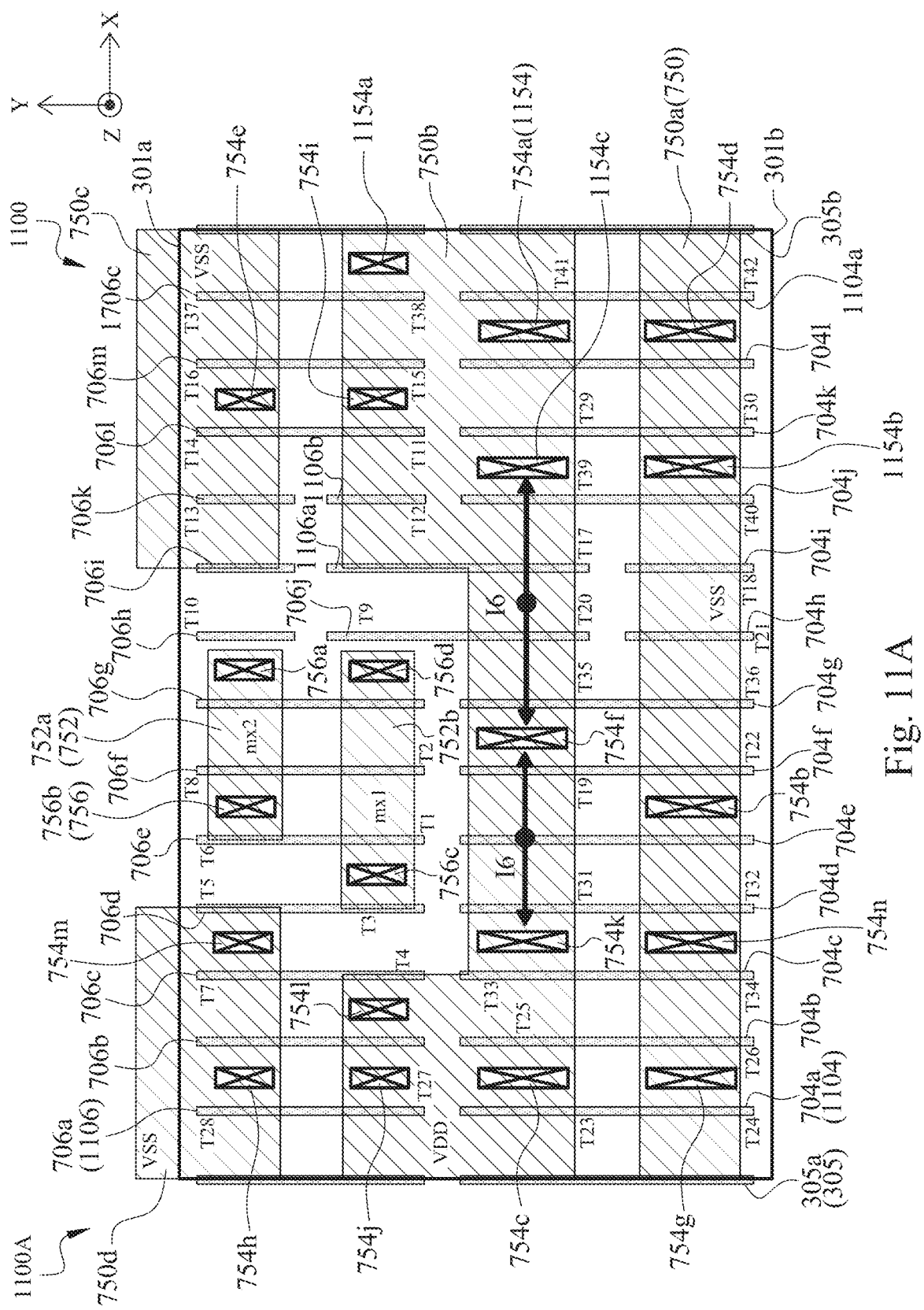
FIGS. 11A-11C are diagrams of an integrated circuit, in accordance with some embodiments.
Figure 11B:
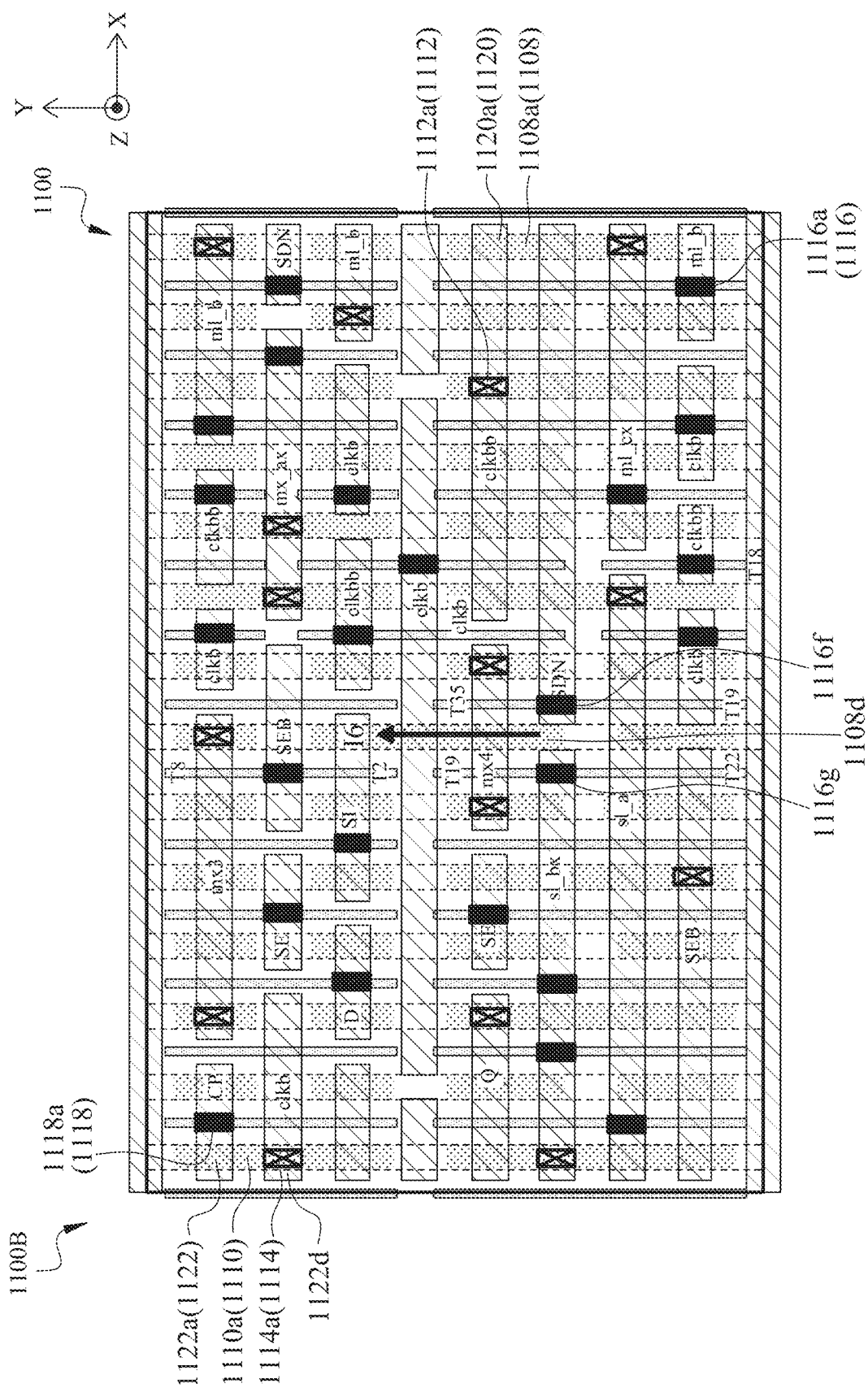
Figure 11C:
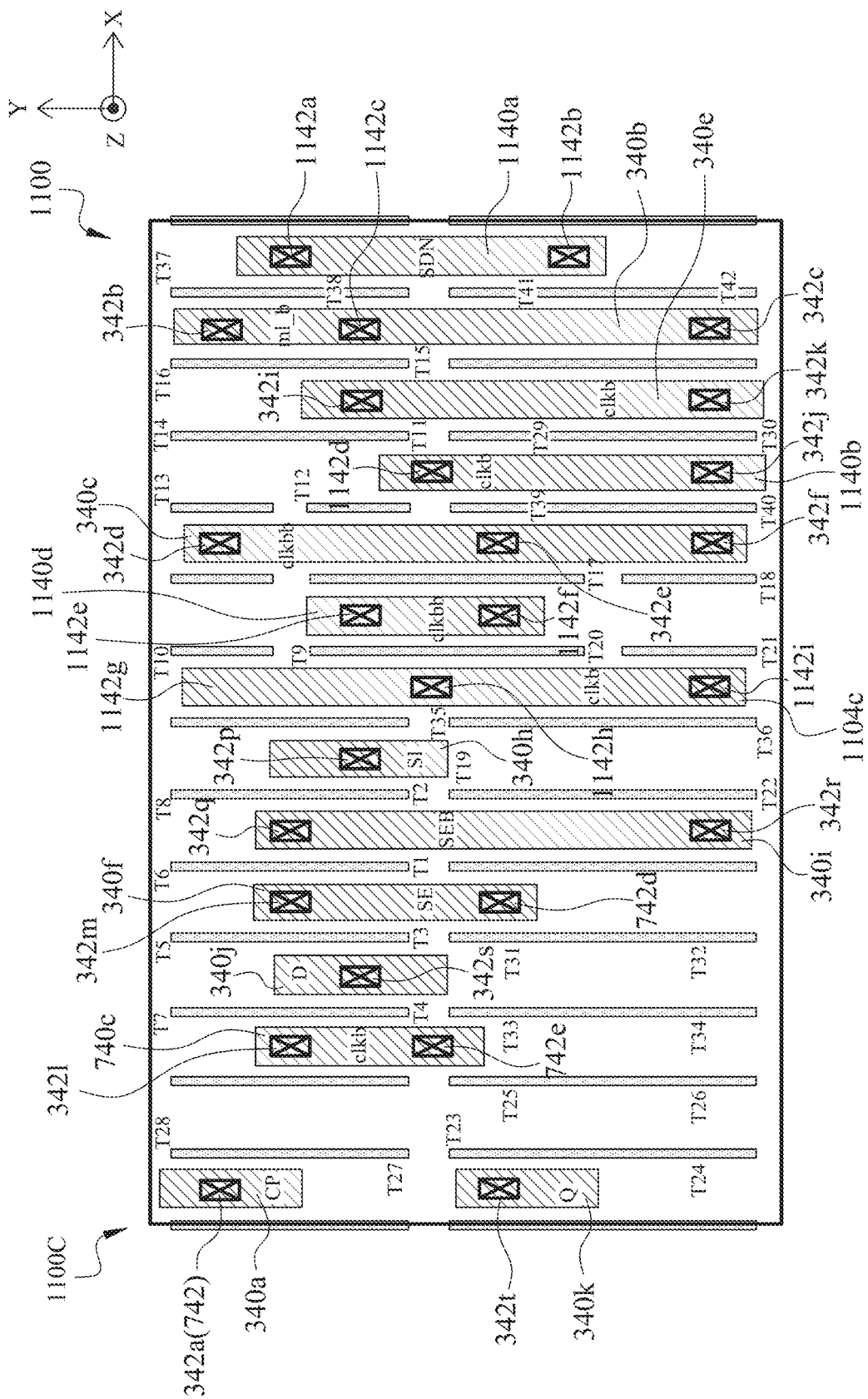

Layout design 1000 is usable to manufacture integrated circuit 1100 of FIGS. 11A-11C.

Layout design 1000 is a variation of layout design 200 and 600, and similar detailed description is therefore omitted.

Layout design 1000 includes a set of active region patterns (not shown), a set of gate patterns 1004, the set of dummy gate patterns 205, a set of gate patterns 1006, a set of contact patterns 1008, a set of contact patterns 1010, a set of conductive feature patterns 1020, a set of conductive feature patterns 1022, a set of via patterns 1012, a set of via patterns 1014, a set of via patterns 1016, a set of via patterns 1018, a set of conductive feature patterns 1040, a set of via patterns 1042, a set of conductive feature patterns 1050, a set of conductive feature patterns 1052, a set of via patterns 1054, a set of via patterns 1056.

In some embodiments, the set of active region patterns (not shown) of layout design 1000 are similar to the set of active region patterns 202 of layout design 200, and similar detailed description is therefore omitted.

In comparison with layout design 200 of FIGS. 2B-2G, the set of gate patterns 1004 replaces the set of gate patterns 204, the set of gate patterns 1006 replaces the set of gate patterns 206, the set of contact patterns 1008 replaces the set of contact patterns 208, and the set of contact patterns 1010 replaces the set of contact patterns 210, and similar detailed description is therefore omitted.

In comparison with layout design 200 of FIGS. 2B-2G, the set of conductive feature patterns 1020, 1022, 1040, 1050 and 1052 replaces the corresponding set of conductive feature patterns 220, 222, 240, 250 and 252, and similar detailed description is therefore omitted.

In comparison with layout design 200 of FIGS. 2B-2G, the set of via patterns 1012, 1014, 1016, 1018, 1042, 1054 and 1056 replaces the corresponding set of via patterns 212, 214, 216, 218, 242, 254 and 256, and similar detailed description is therefore omitted.

The set of gate patterns 1004 or 1006 is usable to manufacture a corresponding set of gates 1104 or 1106 of integrated circuit 1100 or 1200.

In some embodiments, each of the gate patterns in the set of gate patterns 1004 and 1006 are shown in FIGS. 10B-10G with labels "T1-T42" that identify corresponding transistors of FIGS. 9A-9B manufactured by the corresponding gate pattern in FIGS. 10B-10G, and are omitted for brevity.

The set of contact patterns 1008 or 1010 is usable to manufacture a corresponding set of contacts 1108 or 1110 of integrated circuit 1100 or 1200.

The set of conductive feature patterns 1020, 1022, 1040, 1050 and 1052 is usable to manufacture a corresponding set of conductors 1120, 1122, 1140, 1150 and 1152 of integrated circuit 1100 or 1200.

The set of via patterns 1012, 1014, 1016, 1018, 1042, 1054 and 1056 is usable to manufacture a corresponding set of vias 1112, 1114, 1116, 1118, 1142, 1154 and 1156 of integrated circuit 1100 or 1200.

In some embodiments, layout design 1000 achieves one or more of the benefits discussed above in at least FIGS. 2A-2G, FIGS. 3A-3F, FIGS. 4A-4C, FIGS. 6A-6G, FIGS. 7A-7C and FIGS. 8A-8D.

Other configurations, arrangements on other layout levels or quantities of patterns in layout design 1000 are within the scope of the present disclosure.

FIGS. 11A-11C are corresponding diagrams of corresponding portions 1100A-1100C of an integrated circuit 1100, simplified for ease of illustration.

Integrated circuit 1100 is an embodiment of integrated circuit 1000A of FIG. 6A.

Portion 1100A includes one or more features of integrated circuit 1100 of the POLY level, the BM0 level and the VB level. Portion 1100A is manufactured by portion 1000B.

Portion 1100B includes one or more features of integrated circuit 1100 of the OD level, the POLY level, the MD level, the M0 level, the VG level and the VD level. Portion 1100B is manufactured by portion 1000C.

Portion 1100C includes one or more features of integrated circuit 1100 of the POLY level, the M1 level and the V0 level. Portion 1100C is manufactured by portion 1000D.

Integrated circuit 1100 is manufactured by layout design 1000. Structural relationships including alignment, lengths and widths, as well as configurations and layers of integrated circuit 1100 are similar to the structural relationships and configurations and layers of layout design 1000 of FIGS. 10B-10G, and similar detailed description will not be described in at least FIGS. 11A-11C, for brevity. For example, in some embodiments, at least one or more widths, lengths or pitches of layout design 1000 is similar to corresponding widths, lengths or pitches of integrated circuit 1100, and similar detailed description is omitted for brevity.

Integrated circuit 1100 includes at least a set of active regions (not shown, but similar to the set of active regions 302), the set of dummy gates 305, the set of gates 1104 and 1106, the set of contacts 1108, the set of contacts 1110, the set of conductors 1120, the set of conductors 1122, the set of vias 1112, the set of vias 1114, the set of vias 1116, the set of vias 1118, the set of conductors 1140, the set of vias 1142, the set of conductors 750, the set of conductors 752, the set of vias 1154, the set of vias 756, substrate 390 and insulating region 392.

In some embodiments, the set of active region patterns (not shown) of integrated circuit 1100 are similar to the set of active regions 302 of integrated circuit 300, and similar detailed description is therefore omitted.

In comparison with integrated circuit 700 of FIGS. 7A-7C, the set of gates 1104 replaces the set of gates 704, the set of gates 1106 replaces the set of gates 706, the set of contacts 1108 replaces the set of contacts 708, and the set of contacts 1110 replaces the set of contacts 710, and similar detailed description is therefore omitted.

In comparison with integrated circuit 700 of FIGS. 7A-7C, the set of conductors 1120, 1122, 1140 replaces the corresponding set of conductors 720, 722, 740 and similar detailed description is therefore omitted.

In comparison with integrated circuit 700 of FIGS. 7A-7C, the set of vias 1112, 1114, 1116, 1118, 1142 and 1154 replaces the corresponding set of vias 712, 714, 716, 718, 742 and 754, and similar detailed description is therefore omitted.

In some embodiments, each of the gates in the set of gates 1104 and 1106 are shown in FIGS. 11A-11C with labels "T1-T42" that identify corresponding transistors of FIGS. 9A-9B having corresponding gates in FIGS. 11A-11C, and are omitted for brevity.

The set of gates 1104 includes at least gate 1104a and the set of gates 704. In some embodiments, gate 1104a is manufactured by corresponding gate pattern 1004a of the set of gate patterns 1004.

The set of gates 1106 includes at least gate 1106a, 1106b, 1106c and the set of gates 706. In some embodiments, gate 1106a, 1106b, 1106c is manufactured by corresponding gate pattern 1006a, 1006b, 1106c of the set of gate patterns 1006.

In some embodiments, gate 704a is a gate of transistors T24 and T23, gate 704b is a gate of transistors T26 and T25, gate 704c is a gate of transistors T33 and T34, gate 704d is a gate of transistors T32 and T31, gate 704f is a gate of transistors T22 and T19, gate 704g is a gate of transistors T35 and T36, gate 704h is a gate of transistor T21, gate 704i is a gate of transistor T18, gate 704j is a gate of transistors T39 and T40, gate 704k is a gate of transistors T29 and T30, and gate 1104a is a gate of transistors T42 and T41.

In some embodiments, gate 706a is a gate of transistors T28 and T27, gate 706c is a gate of transistors T7 and T4, gate 706d is a gate of transistors T5 and T3, gate 706e is a gate of transistors T6 and T1, gate 706f is a gate of transistors T8 and T2, gate 706h is a gate of transistor T10, gate 706j is a gate of transistors T9 and T20, gate 706k is a gate of transistor T13, gate 706l is a gate of transistors T14 and T11, gate 706m is a gate of transistors T15 and T16, gate 1106a is a gate of transistor T17, gate 1106b is a gate of transistor T12, gate 1106c is a gate of transistors T37 and T38.

In some embodiments, at least gate 704e, 704l, 706b, 706g, 706i, are dummy gates.

Other configurations, arrangements on other layout levels or quantities of gates in the set of gates 1104, 305 and 1106 are within the scope of the present disclosure.

Each contact of the set of contacts 1108 or 1110 corresponds to one or more drain or source terminals of transistors T1-T42 of integrated circuits 900A-900B or 1100-1200.

The set of contacts 1108 includes at least contact 1108a, . . . , 1108v. In some embodiments, contact 1108a, . . . , 1108v is manufactured by corresponding contact pattern 1008a, . . . , 1008v of the set of contact patterns 1008.

The set of contacts 1110 includes at least contact 1110a, . . . , 1110x. In some embodiments, contact 1110a, . . . , 1110x is manufactured by corresponding contact pattern 1010a, . . . , 1010x of the set of contact patterns 1010.

In some embodiments, contact 1108d corresponds to the drain terminals of transistors T19, T35 and T2. In some embodiments, contact 1108d electrically couples the drains of transistors T23 and T24 to the drain of transistor T2.

The set of vias 1112 includes at least via 1112a, . . . , 1112h. In some embodiments, via 1112a, . . . , 1112h is manufactured by corresponding via pattern 1012a, . . . , 1012h of the set of via patterns 1012.

The set of vias 1114 includes at least via 1114a, . . . , 1114g. In some embodiments, via 1114a, . . . , 1114g is manufactured by corresponding via pattern 1014a, . . . , 1014g of the set of via patterns 1014.

The set of vias 1116 includes at least via 1116a, . . . , 1116l. In some embodiments, via 1116a, . . . , 1116l is manufactured by corresponding via pattern 1016a, . . . , 1016l of the set of via patterns 1016.

The set of vias 1118 includes at least via 1118a, . . . , 1118l. In some embodiments, via 1118a, . . . , 1118l is manufactured by corresponding via pattern 1018a, . . . , 1018l of the set of via patterns 1018.

The set of conductors 1120 includes at least conductor 1120a, . . . , 1120n. In some embodiments, conductor 1120a, . . . , 1120n is manufactured by corresponding conductive feature pattern 1020a, . . . , 1020n of the set of conductive feature patterns 1020.

The set of conductors 1122 includes at least conductor 1122a, . . . , 1122o. In some embodiments, conductor 1122a, . . . , 1122o is manufactured by corresponding conductive feature pattern 1022a, . . . , 1022o of the set of conductive feature patterns 1022.

The set of conductors 1140 includes at least conductor 1140a, 1140b, 740b, 740c, or 340a-340k. In some embodiments, conductor 1140a, 1140b is manufactured by corresponding conductive feature pattern 1040a, 1040b of the set of conductive feature patterns 1040. The set of conductive feature patterns 1040 includes at least conductive feature patterns 1040a, 1040b, 640b, 640c, or 240a-240k.

The set of vias 1142 includes at least via 1142a, . . . , 1142i, 742d, 742e, or 342a-342t. In some embodiments, via 1142a, . . . , 1142i is manufactured by corresponding via pattern 1042a, . . . , 1042i of the set of via patterns 1042. The set of via patterns 1042 includes at least via patterns 1042a, . . . , 1042i, 642d, 642e, or 24a-242t.

The set of conductors 750 includes at least conductor 750a, . . . , 750d. In some embodiments, conductor 750a, . . . , 750d is manufactured by corresponding conductive feature pattern 650a, . . . , 650d of the set of conductive feature patterns 650.

The set of conductors 752 includes at least conductor 752a, . . . , 752b. In some embodiments, conductor 752a, . . . , 752b is manufactured by corresponding conductive feature pattern 652a, . . . , 652b of the set of conductive feature patterns 652.

The set of vias 1154 includes at least via 1154a, . . . , 1154c and the set of vias 754. In some embodiments, via 1154a, . . . , 1154c is manufactured by corresponding via pattern 1054a, . . . , 1054c of the set of via patterns 1054. The set of via patterns 1054 includes at least via patterns 1054a, . . . , 1054c and the set of via patterns 654.

The set of vias 756 includes at least via 756a, ..., 756d. In some embodiments, via 756a, ..., 756d is manufactured by corresponding via pattern 656a, ..., 656d of the set of via patterns 656.

Conductors 750a, 750c and 750d are the VSS power rail, and conductor 750b the VDD power rail.

Conductor 750a is electrically coupled to and configured to provide voltage VSS to the source of transistors T24 and T26 by via 754g, the source of transistors T34 and T32 by via 754n, the source of transistor T22 by via 754b, the source of transistors T40 and T30 by via 1154b, and the source of transistor T42 by via 754d.

Conductor 750c is electrically coupled to and configured to provide voltage VSS to the source of transistors T14 and T16 by via 754e.

Conductor 750d is electrically coupled to and configured to provide voltage VSS to the source of transistor T28 by via 754h.

Conductor 750b is electrically coupled to and configured to provide voltage VDD to the source of transistors T23 and T25 by via 754c, the source of transistors T33 and T31 by via 754k, the source of transistors T19 and T35 by via 754f, the source of transistors T39 and T29 by via 1154c, the source of transistor T41 by via 754a, the source of transistor T27 by via 754j, the source of transistor T4 by via 754l, the source of transistors T11 and T15 by via 754i, and the source of transistor T38 by via 1154a.

In some embodiments, contact 1108d electrically couples the drains of transistors T23 and T24 to the drain of transistor T2.

In some embodiments, integrated circuit 1100 includes a hybrid power rail structure where one or more transistor devices are configured to receive power (VDD and VDD) from the back-side 303b of integrated circuit 1100 by the set of conductors 750, and one or more transistor devices are configured to receive power (at least VDD or VDD) from the front-side 303a of integrated circuit 1100 by at least the set of contacts 1108, the set of contacts 1110, the set of conductors 1120, the set of conductors 1122 or the set of conductors 1140.

In some embodiments, when viewed from the bottom/backside (e.g., in the positive Z-direction) of integrated circuit 1100, one or more transistor devices are covered by the set of conductors 752, and power is delivered to the one or more covered transistors from the front-side 303a of integrated circuit 1100 by at least the set of contacts 1108, the set of contacts 1110, the set of conductors 1120, 1122 or 1140.

For example, when viewed from the bottom/backside (e.g., in the positive Z-direction) of integrated circuit 1100, transistor T2 is covered by conductor 752b thereby preventing via landing spots from the back-side 303b of integrated circuit 1100, and therefore power is delivered to transistor T2 from the front-side 303a of integrated circuit 1100 by at least contact 1108d. As shown in FIGS. 11A-11C, transistor T2 is configured to receive current I6 of voltage VDD from the front-side 303a of integrated circuit 1100. The source of transistor T2 is electrically coupled to conductor 750b, and thus receives reference voltage VDD or current I6 from conductor 750b. For example, conductor 750b is electrically coupled to the source of transistors T19 and T35 by via 754f. The source of transistors T19 and T35 is configured to receive current I6 from conductor 750b. The source of transistors T19 and T35 is further electrically coupled to contact 1108d on the front-side 303a of integrated circuit 1100. Contact 1108d is electrically coupled to the source of transistor T2. Thus, the source of transistor T2 is configured to receive current I6 of reference voltage VDD from conductor 750b by at least the source of transistors T19 and T35 and contact 1108d.

In some embodiments, by having transistor T2 receive power from the front-side 303a of integrated circuit 1100 through the active region of transistors T19 and T35, power is still able to be delivered to transistor T2, even though transistor T2 is covered by conductor 752b, thus allowing the set of conductors 752 to provide additional routing resources thereby reducing the area of integrated circuit 1100 compared to other approaches.

In some embodiments, while integrated circuit 1100 included one transistor configured to receive power (voltage VDD or VSS) from the front-side 303a and the other transistors configured to receive power (voltage VDD or VSS) from the back-side 303b, other numbers of transistors configured to receive power (voltage VDD or VSS) from the front-side 303a are within the scope of the present disclosure.

Other configurations or arrangements of integrated circuit 1100 are within the scope of the present disclosure.

FIGS. 12A-12E are diagrams of an integrated circuit 1200, in accordance with some embodiments.

Integrated circuit 1200 is an embodiment of integrated circuit 900B of FIG. 9B.

Figure 12A:
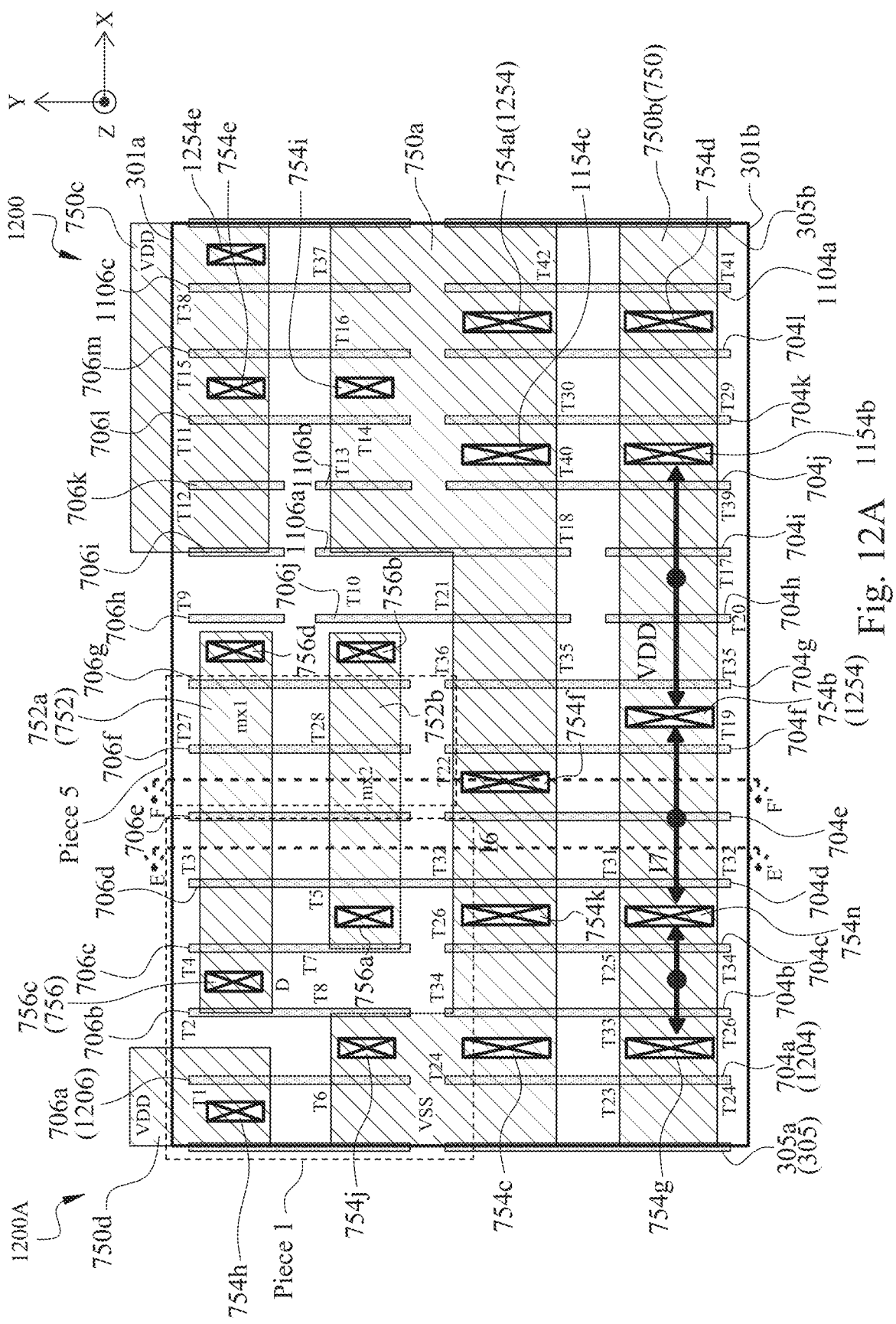
FIGS. 12A-12E are diagrams of an integrated circuit, in accordance with some embodiments.
Figure 12B:
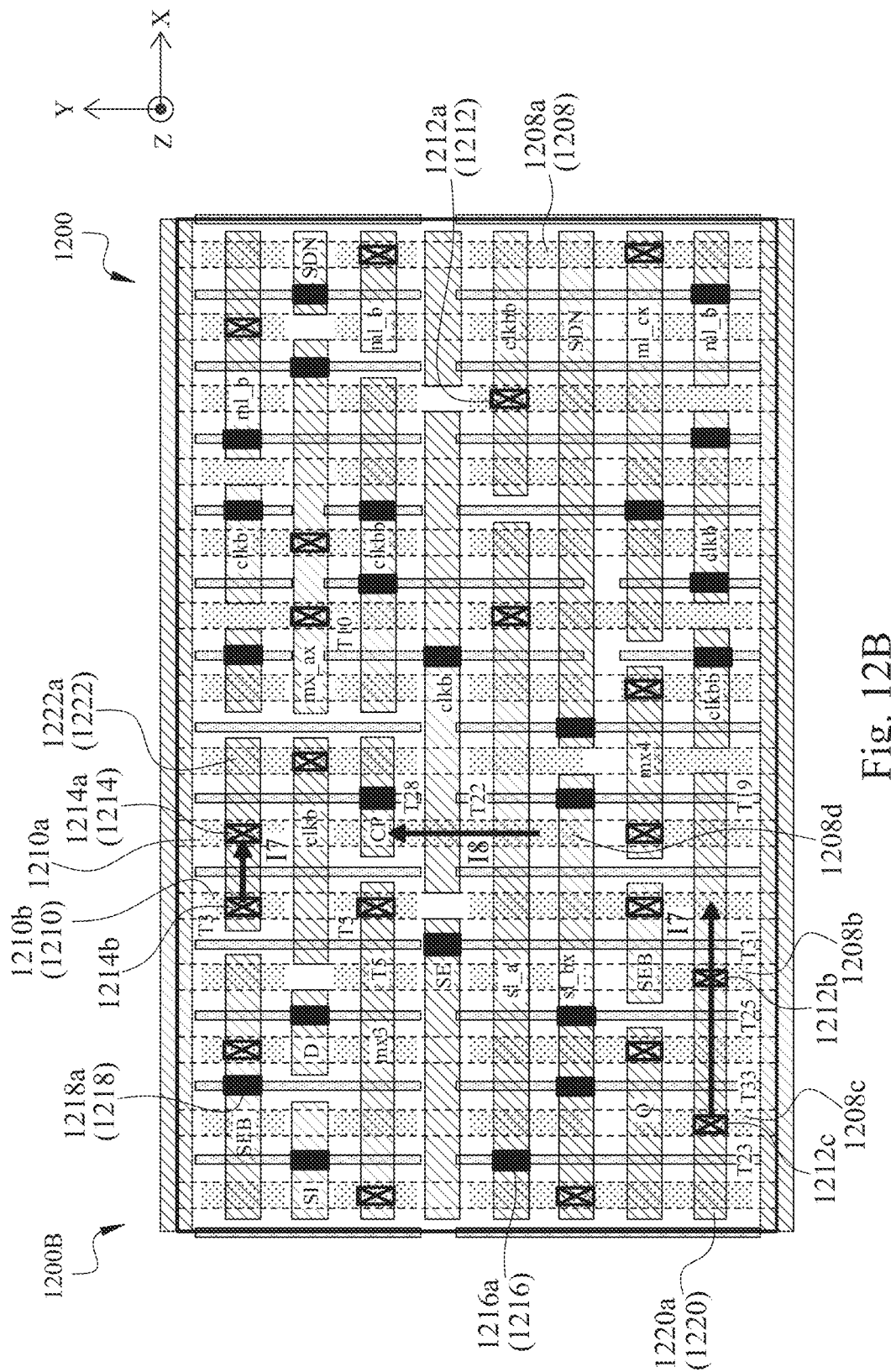
Figure 12C:
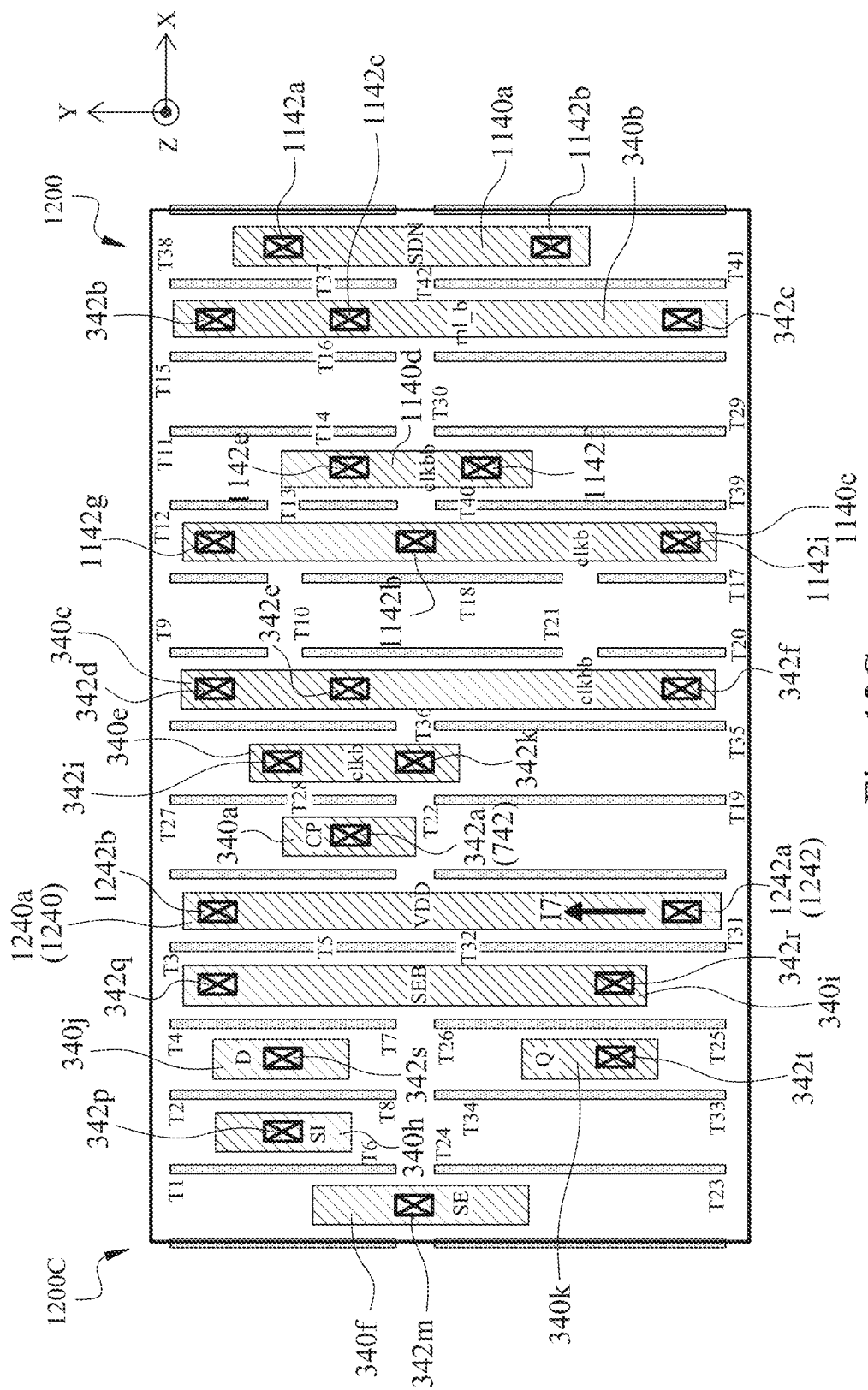
Figure 12D:
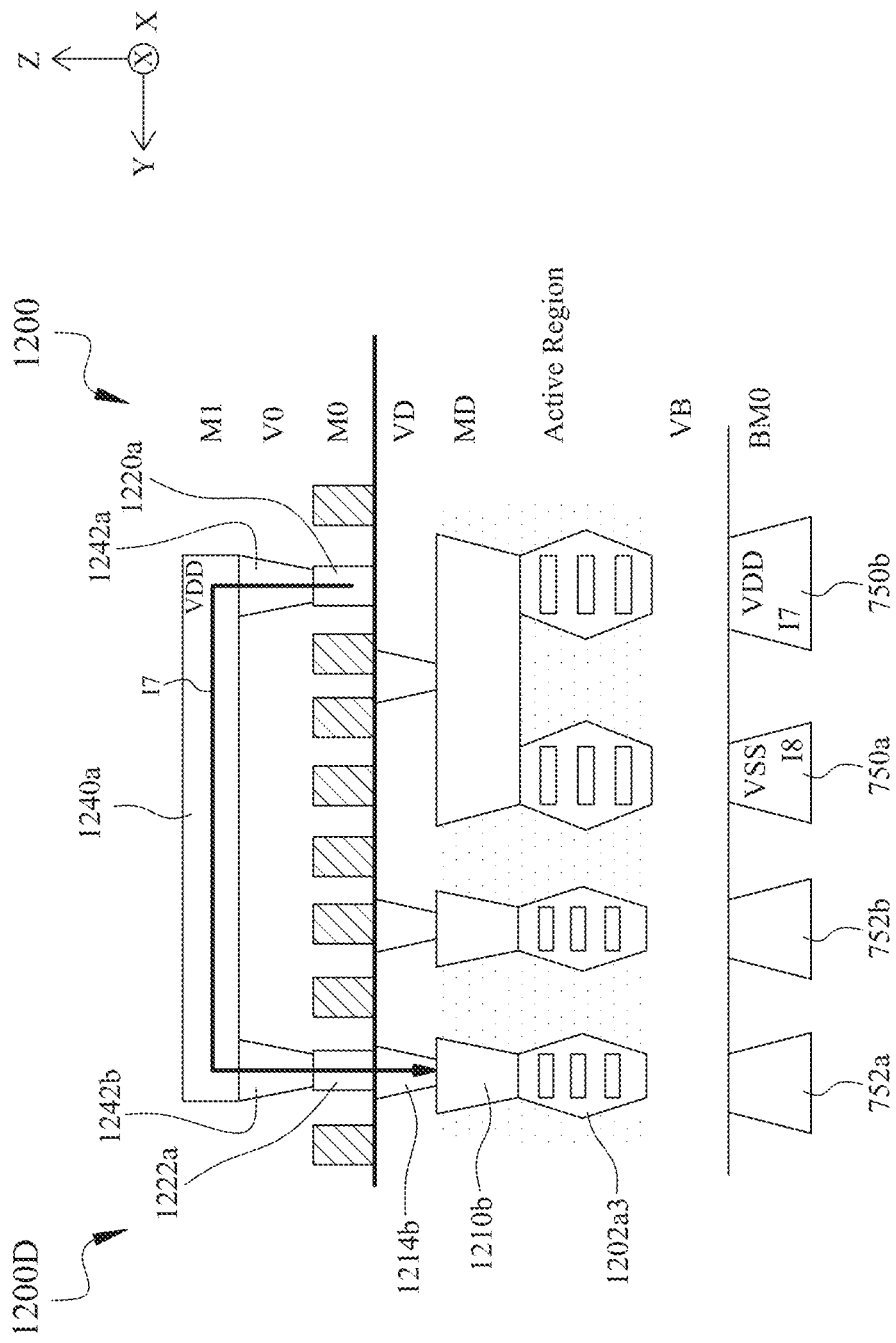
Figure 12E:
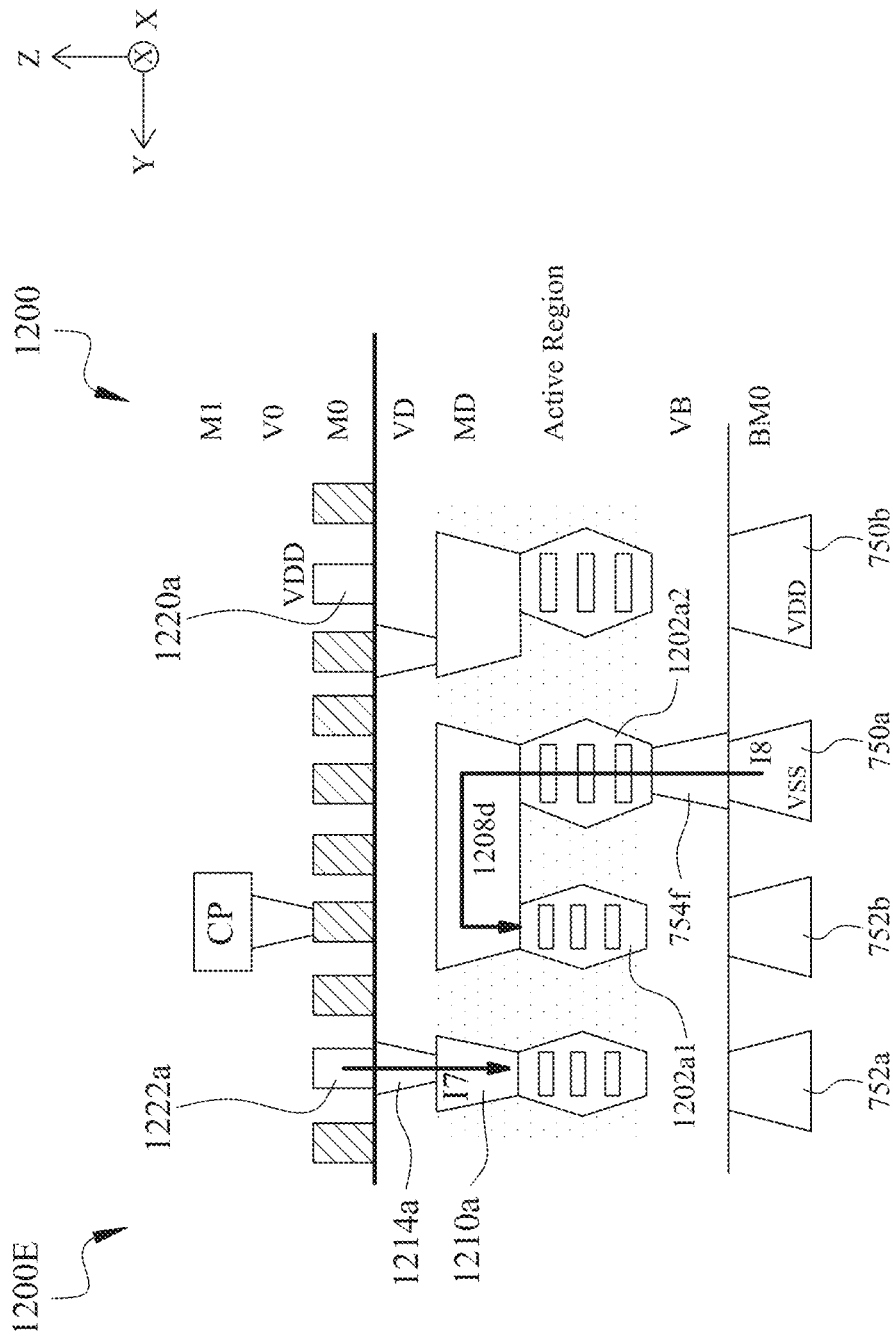

FIGS. 12A-12C are corresponding diagrams of corresponding portions 1200A-1200C of an integrated circuit 1200, simplified for ease of illustration. FIG. 12D is a cross-sectional view of integrated circuit 1200 as intersected by plane E-E', in accordance with some embodiments. FIG. 12E is a cross-sectional view of integrated circuit 1200 as intersected by plane F-F', in accordance with some embodiments.

Portion 1200A is similar to portion 1100A of FIGS. 11A-11C, and similar detailed description is omitted. Portion 1200B is similar to portion 1100B of FIGS. 11A-11C, and similar detailed description is omitted. Portion 1200C is similar to portion 1100C of FIGS. 11A-11C, and similar detailed description is omitted.

Integrated circuit 1200 is manufactured by a corresponding layout design similar to integrated circuit 1100. Integrated circuit 1200 is an embodiment of integrated circuit 900B, and similar detailed description is omitted. For brevity FIGS. 12A-12E are described as a corresponding integrated circuit 1200, but in some embodiments, FIGS. 12A-12E also correspond to layout designs similar to layout design 1000, structural elements of integrated circuit 1200 also correspond to layout patterns, and structural relationships including alignment, lengths and widths, as well as configurations and layers of a corresponding layout design of integrated circuit 1200 are similar to the structural relationships and configurations and layers of integrated circuit 1200, and similar detailed description will not be described for brevity.

In some embodiments, integrated circuit 1200 is manufactured by a layout design similar to layout design 1000, and similar detailed description is omitted for brevity.

Integrated circuit 1200 is a variation of integrated circuit 300 (FIGS. 3A-3F), integrated circuit 700 (FIGS. 7A-7C), and integrated circuit 1100 (FIGS. 11A-11C).

Integrated circuit 1200 includes at least a set of active regions (not shown, but similar to the set of active regions 302), the set of dummy gates 303, the set of gates 1204 and 1206, the set of contacts 1208, the set of contacts 1210, the set of conductors 1220, the set of conductors 1222, the set of vias 1212, the set of vias 1214, the set of vias 1216, the set of vias 1218, the set of conductors 1240, the set of vias 1242, the set of conductors 750, the set of conductors 752, the set of vias 1254, the set of vias 756, substrate 390 and insulating region 392.

In some embodiments, the set of active region patterns (not shown) of integrated circuit 1200 are similar to the set of active regions 302 of integrated circuit 300, and similar detailed description is therefore omitted.

In comparison with integrated circuit 1100 of FIGS. 11A-11C, the set of gates 1204 replaces the set of gates 1104, the set of gates 1206 replaces the set of gates 1106, the set of contacts 1208 replaces the set of contacts 1108, and the set of contacts 1210 replaces the set of contacts 1110, and similar detailed description is therefore omitted.

In comparison with integrated circuit 1100 of FIGS. 11A-11C, the set of conductors 1220, 1222, 1240 replaces the corresponding set of conductors 720, 722, 740 and similar detailed description is therefore omitted.

In comparison with integrated circuit 1100 of FIGS. 11A-11C, the set of vias 1212, 1214, 1216, 1218, 1242 and 1254 replaces the corresponding set of vias 1112, 1114, 1116, 1118, 1142 and 1154, and similar detailed description is therefore omitted.

In some embodiments, each of the gates in the set of gates 1204 and 1206 are shown in FIGS. 12A-12E with labels "T1-T42" that identify corresponding transistors of FIGS. 9A-9B having corresponding gates in FIGS. 12A-12E, and are omitted for brevity.

The set of gates 1204 includes at least gate 1104a and the set of gates 704. In some embodiments, gate 1104a is manufactured by corresponding gate pattern 1004a of the set of gate patterns 1004.

The set of gates 1206 includes at least gate 1106a, 1106b, 1106c and at least gate 706a-706c, 706e-706l or 706m. In some embodiments, gate 1106a, 1106b, 1106c is manufactured by corresponding gate pattern 1006a, 1006b, 1106c of the set of gate patterns 1006.

In some embodiments, gate 704a is a gate of transistors T24 and T23, gate 704b is a gate of transistors T33 and T34, gate 704c is a gate of transistors T26 and T25, gate 704d is a gate of transistors T32, T31, T5 and T3, gate 704f is a gate of transistors T22 and T19, gate 704g is a gate of transistors T35 and T36, gate 704h is a gate of transistor T20, gate 704i is a gate of transistor T17, gate 704j is a gate of transistors T39 and T40, gate 704k is a gate of transistors T29 and T30, and gate 1104a is a gate of transistors T42 and T41.

In some embodiments, gate 706a is a gate of transistors T6 and T1, gate 706b is a gate of transistors T8 and T2, gate 706c is a gate of transistors T7 and T4, gate 706d is a gate of transistors T5 and T3, gate 706f is a gate of transistors T28 and T27, gate 706h is a gate of transistor T9, gate 706j is a gate of transistors T10 and T21, gate 706k is a gate of transistor T12, gate 706l is a gate of transistors T14 and T11, gate 706m is a gate of transistors T15 and T16, gate 1106a is a gate of transistor T18, gate 1106b is a gate of transistor T13, gate 1106c is a gate of transistors T37 and T38.

In some embodiments, at least gate 704e, 704l, 706e, 706g, 706i, are dummy gates.

Other configurations, arrangements on other layout levels or quantities of gates in the set of gates 1204, 305 and 1206 are within the scope of the present disclosure.

In comparison with integrated circuit 1100 of FIGS. 11A-11C, set of contacts 1208 of integrated circuit 1200 replaces the set of contacts 1108, set of contacts 1210 of integrated circuit 1200 replaces the set of contacts 1110, set of vias 1212 of integrated circuit 1200 replaces the set of vias 1112, set of vias 1214 of integrated circuit 1200 replaces the set of vias 1114, and similar detailed description is therefore omitted.

Each contact of the set of contacts 1208 or 1210 corresponds to one or more drain or source terminals of transistors T1-T42 of integrated circuits 900A-900B or 1100-1200.

The set of contacts 1208 includes at least contact 1208a, . . . , 1208v. In some embodiments, contact 1208a, . . . , 1208v is manufactured by corresponding contact pattern 1008a, . . . , 1008v of the set of contact patterns 1008.

The set of contacts 1210 includes at least contact 1210a, . . . , 1210x. In some embodiments, contact 1210a, . . . , 1210x is manufactured by corresponding contact pattern 1010a, . . . , 1010x of the set of contact patterns 1010.

In some embodiments, contact 1208d corresponds to the source terminal of transistor T22 and the source terminal of transistor T28. In some embodiments, contact 1208d electrically couples the source of transistor T22 and the source of transistor T28 together.

In some embodiments, contact 1208d corresponds to the drain terminals of transistors T19, T35 and T2. In some embodiments, contact 1208d electrically couples the drains of transistors T23 and T24 to the drain of transistor T2.

The set of vias 1212 includes at least via 1212a, . . . , 1212j. In some embodiments, via 1212a, . . . , 1212h is manufactured by corresponding via pattern 1012a, . . . , 1012h of the set of via patterns 1012. In some embodiments, via 1212i, 1212j is manufactured by a via pattern similar to one or more of 1012a, . . . , 1012h of the set of via patterns 1012.

The set of vias 1214 includes at least via 1214a, . . . , 1214i. In some embodiments, via 1214a, . . . , 1214g is manufactured by corresponding via pattern 1014a, . . . , 1014g of the set of via patterns 1014. In some embodiments, via 1214h, 1214i is manufactured by a via pattern similar to one or more of 1014a, . . . , 1014g of the set of via patterns 1014.

The set of vias 1216 includes at least via 1216a, . . . , 1216l. In some embodiments, via 1216a, ..., 1216l is manufactured by corresponding via pattern 1016a, . . . , 1016l of the set of via patterns 1016.

The set of vias 1218 includes at least via 1218a, . . . , 1218k. In some embodiments, via 1218a, . . . , 1218k is manufactured by corresponding via pattern 1018a, . . . , 1018k of the set of via patterns 1018.

The set of conductors 1220 includes at least conductor 1220a, . . . , 1220n. In some embodiments, conductor 1220a, . . . , 1220n is manufactured by corresponding conductive feature pattern 1020a, . . . , 1020n of the set of conductive feature patterns 1020.

The set of conductors 1222 includes at least conductor 1222a, . . . , 1222n. In some embodiments, conductor 1222a, . . . , 1222n is manufactured by corresponding conductive feature pattern 1022a, . . . , 1022n of the set of conductive feature patterns 1022.

The set of conductors 1240 includes at least conductor 1240a, 1140a, 1140c, 1140d, 340a, 340b, 340c, 340e, 340f, 340h, 340i, 340j or 340k. In some embodiments, conductor 1240a is manufactured by a conductive feature pattern 1040a, 1040b similar to one of conductive feature pattern 1040a, 1040b of the set of conductive feature patterns 1040.

The set of vias 1242 includes at least via 1242a, 1242b, 1142a, 1142b, 1142c, 1142e, 1142f, 1142g, 1142h, 1142i, 342a, 342b, 342c, 342d, 342e, 342f, 342i, 342k, 342m, 342p, 342q, 342r, 342s or 342t. In some embodiments, via 1242a, 1242b is manufactured by a via pattern similar to one of via pattern 1042a, . . . , 1042i of the set of via patterns 1042.

The set of conductors 750 includes at least conductor 750a, ..., 750d. In some embodiments, conductor 750a, ..., 750d is manufactured by corresponding conductive feature pattern 650a, ..., 650d of the set of conductive feature patterns 650.

The set of conductors 752 includes at least conductor 752a, ..., 752b. In some embodiments, conductor 752a, ..., 752b is manufactured by corresponding conductive feature pattern 652a, ..., 652b of the set of conductive feature patterns 652.

The set of vias 1254 includes at least via 1254e, 1154b, 1154c, 754a, 754b, 754c, 754d, 754e, 754f, 754g, 754h, 754i, 754j, 754k or 754n. In some embodiments, via 1254e is manufactured by a via pattern similar to one of via pattern 1054a, ..., 1054c of the set of via patterns 1054.

The set of vias 756 includes at least via 756a, ..., 756d. In some embodiments, via 756a, ..., 756d is manufactured by corresponding via pattern 656a, ..., 656d of the set of via patterns 656.

Conductors 750b, 750c and 750d are the VDD power rail, and conductor 750a the VSS power rail.

Conductor 750a is electrically coupled to and configured to provide voltage VSS to the source of transistors T24 and T34 by via 754c, the source of transistors T26 and T32 by via 754k, the source of transistor T22 by via 754f, the source of transistors T40 and T30 by via 1154c, the source of transistor T42 by via 754a, the source of transistors T6 and T8 by via 754j, and the source of transistors T14 and T16 by via 754i.

Conductor 750b is electrically coupled to and configured to provide voltage VDD to the source of transistors T23 and T33 by via 754g, the source of transistors T25 and T31 by via 754n, the source of transistors T19 and T35 by via 754b, the source of transistors T39 and T29 by via 1154b, and the source of transistor T41 by via 75d.

Conductor 750c is electrically coupled to and configured to provide voltage VDD to the source of transistors T11 and T15 by via 754e, and the source of transistor T38 by via 1254e.

Conductor 750d is electrically coupled to and configured to provide voltage VDD to the source of transistor T1 by via 754h.

In some embodiments, contact 1208d electrically couples the drains of transistors T23 and T24 to the drain of transistor T2.

In some embodiments, integrated circuit 1200 includes a hybrid power rail structure where one or more transistor devices are configured to receive power (VDD and VSS) from the back-side 303b of integrated circuit 1200 by the set of conductors 750, and one or more transistor devices are configured to receive power (at least VDD or VSS) from the front-side 303a of integrated circuit 1200 by at least the set of contacts 1208, the set of contacts 1210, the set of conductors 1220, the set of conductors 1222 or the set of conductors 1240.

In some embodiments, when viewed from the bottom/backside (e.g., in the positive Z-direction) of integrated circuit 1200, one or more transistor devices are covered by the set of conductors 752, and power is delivered to the one or more covered transistors from the front-side 303a of integrated circuit 1200 by at least the set of contacts 1208, the set of contacts 1210, the set of conductors 1220, 1222 or 1240.

For example, when viewed from the bottom/backside (e.g., in the positive Z-direction) of integrated circuit 1200, transistor T28 is covered by conductor 752b thereby preventing via landing spots from the back-side 303b of integrated circuit 1200, and therefore power is delivered to transistor T28 from the front-side 303a of integrated circuit 1200 by at least contact 1208d. As shown in FIGS. 12A-12D, transistor T28 is configured to receive current I8 of reference voltage VSS from the front-side 303a of integrated circuit 1200. The source 1202a1 of transistor T28 is electrically coupled to conductor 750a, and thus receives reference voltage VSS or current I8 from conductor 750a. For example, conductor 750a is electrically coupled to the source 1202a2 of transistor T22 by via 754f. The source 1202a2 of transistor T22 is configured to receive current I8 from conductor 750a. The source 1202a2 of transistor T22 is further electrically coupled to contact 1208d on the front-side 303a of integrated circuit 1200. Contact 1208d is electrically coupled to the source 1202a1 of transistor T28. Thus, the source 1202a1 of transistor T28 is configured to receive current I8 of reference voltage VSS from conductor 750a by at least the source 1202a2 of transistor T22 and contact 1208d.

In some embodiments, by having transistor T28 receive power from the front-side 303a of integrated circuit 1200 through the active region of transistor T22, power is still able to be delivered to transistor T28, even though transistor T28 is covered by conductor 752b, thus allowing the set of conductors 752 to provide additional routing resources thereby reducing the area of integrated circuit 1200 compared to other approaches.

In yet another example, when viewed from the bottom/backside (e.g., in the positive Z-direction) of integrated circuit 1200, transistors T3 and T27 are covered by conductor 752a thereby preventing via landing spots from the back-side 303b of integrated circuit 1200, and therefore power is delivered to transistors T3 and T27 from the front-side 303a of integrated circuit 1200 by at least conductor 1220a or 1222a or at least conductor 1240a.

As shown in FIGS. 12A-12E, transistors T3 and T27 are configured to receive current I7 of voltage VDD from the front-side 303a of integrated circuit 1200. The source of transistors T3 and T27 is electrically coupled to conductor 750b, and thus receives supply voltage VDD or current I7 from conductor 750b. For example, conductor 750b is electrically coupled to the source of transistors T23 and T33 by via 754g, conductor 750b is electrically coupled to the source of transistors T31 and T25 by via 754n, conductor 750b is electrically coupled to the source of transistors T35 and T19 by via 754b, conductor 750b is electrically coupled to the source of transistors T39 and T29 by via 1154b, and conductor 750b is electrically coupled to the source of transistor T41 by via 754d. The source of transistors T23 and T33, the source of transistors T31 and T25, the source of transistors T35 and T19, the source of transistors T39 and T29 and the source of transistor T41 are configured to receive current 17 from conductor 750b. The source of transistors T23 and T33 is further electrically coupled to contact 1208c on the front-side 303a of integrated circuit 1200. Contact 1208c is electrically coupled to conductor 1220a by via 1212c. The source of transistors T31 and T25 are further electrically coupled to contact 1208b on the front-side 303a of integrated circuit 1200. Contact 1208b is electrically coupled to conductor 1220a by via 1212b. Conductor 1220a is electrically coupled to conductor 1240a by via 1242a. Conductor 1220a is configured to carry current I7. Conductor 1240a is electrically coupled to conductor 1222a by via 1242b. Conductor 1222a is configured to receive current I7. Conductor 1222a is electrically coupled to contact 1210b by via 1214b, and to contact 1210a by via 1214a. The contact 1210b is electrically coupled to the source of transistor T3. The contact 1210a is electrically coupled to the source of transistor T27. Thus, the sources of corresponding transistors T3 and T27 are configured to receive current I7 of supply voltage VDD from conductor 1222a.

In some embodiments, by having transistors T3 and T27 receive power from the front-side 303a of integrated circuit 1200 through the active region of transistors T23, T33, T31, T25, T35, T19, T39, T29 or T41 and at least conductor 1220a, 1222a or 1240a, power is still able to be delivered to transistors T3 and T27, even though transistors T3 and T27 are covered by conductor 752a, thus allowing the set of conductors 752 to provide additional routing resources thereby reducing the area of integrated circuit 1200 compared to other approaches.

Other configurations or arrangements of integrated circuit 1200 are within the scope of the present disclosure.

FIG. 13 is a functional flow chart of a method 1300 of manufacturing an IC device, in accordance with some embodiments. It is understood that additional operations may be performed before, during, and/or after the method 1300 depicted in FIG. 13, and that some other processes may only be briefly described herein.

In some embodiments, other order of operations of method 1300-1500 is within the scope of the present disclosure. Method 1300-1500 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 1300, 1400 or 1500 is not performed.

In some embodiments, method 1300 is an embodiment of operation 1404 of method 1400. In some embodiments, the methods 1300-1500 are usable to manufacture or fabricate at least integrated circuit 300, 400, 700, 800, 1100 or 1200, or an integrated circuit with similar features as at least layout design 200, 600 or 1000 or floorplan 200A, 600A or 1000A.

In some embodiments, other order of operations of methods 1300-1500 are within the scope of the present disclosure. Methods 1300-1500 include exemplary operations, but the operations are not necessarily performed in the order shown. Operations may be added, replaced, changed order, and/or eliminated as appropriate, in accordance with the spirit and scope of disclosed embodiments.

In operation 1302 of method 1300, a first set of transistors and a second set of transistors are fabricated on a front-side 303a of a semiconductor wafer or substrate. In some embodiments, the first set of transistors or the second set of transistors of method 1300 includes one or more transistors in the set of active regions 302. In some embodiments, the first set of transistors or the second set of transistors of method 1300 includes one or more transistors described herein.

In some embodiments, operation 1302 includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation.

In some embodiments, the first well has a dopant concentration ranging from $1\times10^{12}$ atoms/cm$^3$ to $1\times10^{14}$ atoms/cm$^3$.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^3$ to about $1\times10^{14}$ atoms/cm$^3$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 1302 further includes operation 1302a (not shown). In some embodiments, operation 1302a includes forming contacts (e.g., set of contacts 308, 310, 408, 410, 708, 710, 808, 810, 1108, 1110, 1208 or 1210) of the first set of transistors or the second set of transistors. In some embodiments, operation 1302a further includes fabricating a first set of contacts on the front-side of the substrate, thereby electrically coupling a first source/drain of a second transistor of the first set of transistors and a first source/drain of a third transistor of the second set of transistors. In some embodiments, the first source/drain of the second transistor is configured to receive the first supply voltage or a second supply voltage from at least a second conductor of the first set of conductors through the first source/drain of the third transistor.

In some embodiments, operation 1302 further includes forming a gate region of the first set of transistors or the second set of transistors. In some embodiments, the gate regions of method 1300 include the set of gates 304, 305, 306, 704, 706, 1104 or 1106.

In some embodiments, the gate region is between the drain region and the source region. In some embodiments, the gate region is over the first well and the substrate. In some embodiments, fabricating the gate regions of operation 1302 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1304 of method 1300, thinning is performed on the back-side 303b of the wafer or substrate. In some embodiments, operation 1304 includes a thinning process performed on the back-side 303b of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside 303b of the semiconductor wafer or substrate.

In operation 1306 of method 1300, a first set of vias are formed on the back-side 303b of the thinned wafer or substrate on a first level (e.g., VB). In some embodiments, the first set of vias of method 1300 includes one or more portions of at least the set of vias 354, 356, 454, 456, 754, 756, 1154, 1156, 1254 or 1256. In some embodiments, operation 1306 includes forming a first set of self-aligned contacts (SACs) in the insulating layer over the back-side 303b of the wafer. In some embodiments, the first set of vias is electrically coupled to at least the first set of transistors or the second set of transistors.

In operation 1308 of method 1300, a first conductive material is deposited on the back-side of the thinned substrate on a first level thereby forming a first set of conductors on the back-side 303b of the wafer or substrate on a first level (e.g., BM). In some embodiments, operation 1306 includes at least depositing a first set of conductive regions over the back-side of the integrated circuit. In some embodiments, the first set of conductors of method 1300 includes one or more portions of at least the set of conductors 350, 450, 750, 850, 1150 or 1254. In some embodiments, operation 1308 further includes at least forming a set of power rails and forming a set of signal lines.

In some embodiments, the first set of conductors is electrically coupled to at least the first set of transistors by the first set of vias. In some embodiments, the first set of transistors is configured to receive a first supply voltage (VDD or VSS) from at least a first conductor of the first set of conductors from the back-side.

In operation 1310 of method 1300, a second set of vias are fabricated on the front-side 303a of the wafer or substrate. In some embodiments, the second set of vias of method 1300 includes at least portions of one or more of the set of vias 312, 314, 316, 318, 412, 414, 416, 418, 712, 714, 716, 718, 812, 814, 816, 818, 1112, 1114, 1116, 1118, 1212, 1214, 1216 or 1218.

In operation 1312 of method 1300, a second conductive material is deposited on the front-side 303a of the wafer or substrate on a second level (e.g., M0) of the integrated circuit thereby forming a second set of conductive structures. In some embodiments, the second set of conductive structures of method 1300 includes at least portions of one or more of the set of conductors 320, 322, 420, 422, 720, 722, 820, 822, 1120, 1122, 1220 or 1222.

In operation 1314 of method 1300, a third set of vias are fabricated on the front-side 303a of the wafer or substrate. In some embodiments, the third set of vias (e.g., V0) of method 1300 includes at least portions of one or more of the set of vias 342, 442, 742, 842, 1142 or 1242

In operation 1316 of method 1300, a third conductive material is deposited on the front-side 303a of the wafer or substrate on a third level (e.g., M1) of the integrated circuit thereby forming a third set of conductive structures. In some embodiments, the third set of conductive structures of method 1300 includes at least portions of one or more of the set of conductors 340, 440, 740, 840, 1140, or 1240.

In some embodiments, at least operation 1310, 1312, 1314, 1316 or 1318 are part of operation 1309 (not shown). In some embodiments, operation 1309 includes electrically coupling the second set of transistors to at least the first set of conductors by the front-side of the thinned substrate through at least a first source/drain of a first transistor of the first set of transistors, thereby configuring the second set of transistors to receive the first supply voltage from at least the first conductor of the first set of conductors from the back-side of the thinned substrate.

In some embodiments, one or more of operations 1306, 1308, 1309, 1310, 1312, 1314 or 1316 of method 1300 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 17:
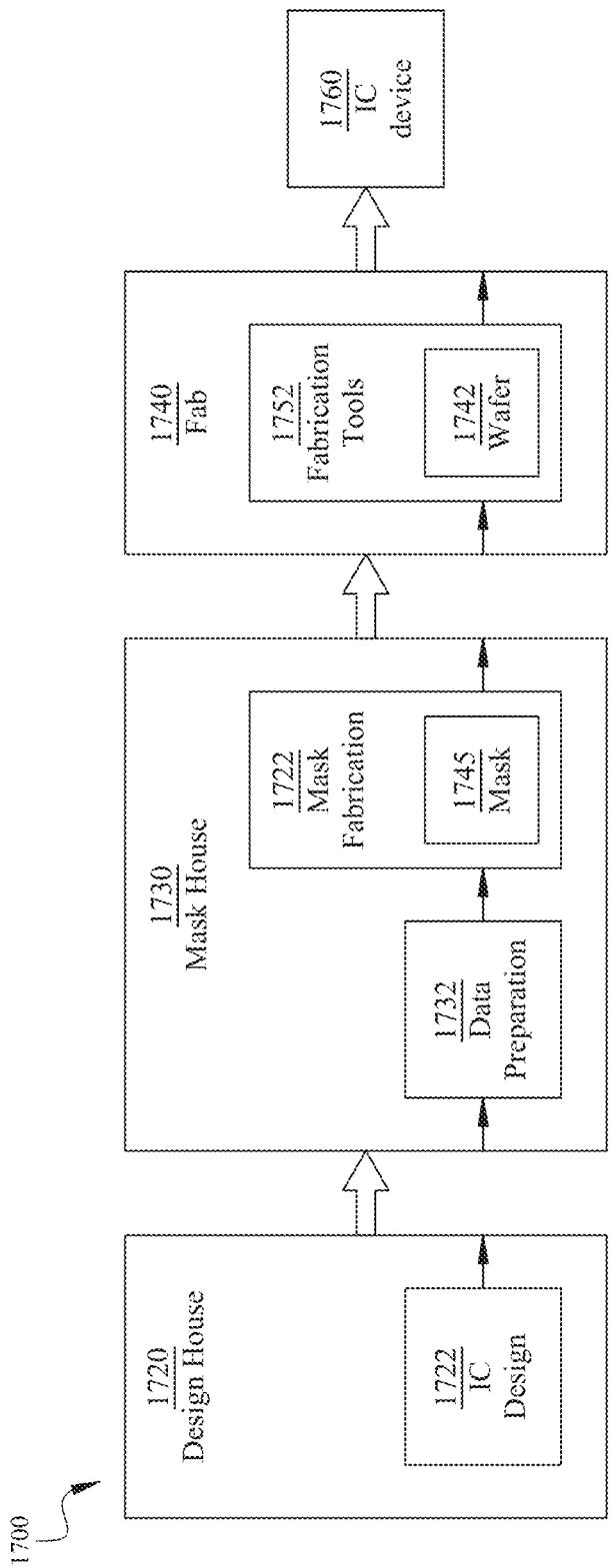
FIG. 17 is a block diagram of an IC manufacturing system, and an IC manufacturing flow associated therewith, in accordance with at least one embodiment of the present disclosure.

In some embodiments, at least one or more operations of method 1300 is performed by system 1700 of FIG. 17. In some embodiments, at least one method(s), such as method 1300 discussed above, is performed in whole or in part by at least one manufacturing system, including system 1700. One or more of the operations of method 1300 is performed by IC fab 1740 (FIG. 17) to fabricate IC device 1760. In some embodiments, one or more of the operations of method 1300 is performed by fabrication tools 1752 to fabricate wafer 1742.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 1308, 1312 or 1316, the conductive material is planarized to provide a level surface for subsequent steps.

In some embodiments, one or more of the operations of method 1300, 1400 or 1500 is not performed.

One or more of the operations of methods 1400-1500 is performed by a processing device configured to execute instructions for manufacturing an integrated circuit, such as at least integrated circuit 100A-100B, 300, 400, 500A-500B, 700, 800, 900A-900B, 1100 or 1200. In some embodiments, one or more operations of methods 1400-1500 is performed using a same processing device as that used in a different one or more operations of methods 1400-1500. In some embodiments, a different processing device is used to perform one or more operations of methods 1400-1500 from that used to perform a different one or more operations of methods 1400-1500. In some embodiments, other order of operations of method 1300, 1400 or 1500 is within the scope of the present disclosure. Method 1300, 1400 or 1500 includes exemplary operations, but the operations are not necessarily performed in the order shown. Operations in method 1300, 1400 or 1500 may be added, replaced, changed order, and/or eliminated as appropriate, in accordance with the spirit and scope of disclosed embodiments.

Figure 14:
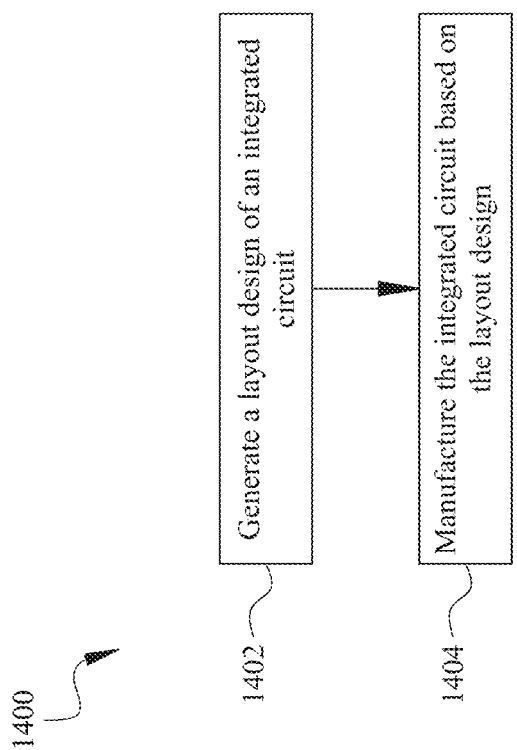
FIG. 14 is a flow chart of a method of manufacturing an IC device, in accordance with some embodiments.

FIG. 14 is a flowchart of a method 1400 of forming or manufacturing an integrated circuit in accordance with some embodiments. It is understood that additional operations may be performed before, during, and/or after the method 1400 depicted in FIG. 14, and that some other operations may only be briefly described herein. In some embodiments, the method 1400 is usable to form integrated circuits, such as at least integrated circuit 300, 400, 700, 800, 1100 or 1200. In some embodiments, the method 1400 is usable to form integrated circuits having similar features and similar structural relationships as one or more of layout design 200, 600 or 1000 or floorplan 200A, 600A or 1000A.

In operation 1402 of method 1400, a layout design of an integrated circuit is generated. Operation 1402 is performed by a processing device (e.g., processor 1602 (FIG. 16)) configured to execute instructions for generating a layout design. In some embodiments, the layout design of method 1400 includes one or more patterns of at least layout design 200, 600 or 1000 or floorplan 200A, 600A or 1000A, or one or more features similar to at least integrated circuit 300, 400, 700, 800, 1100 or 1200. In some embodiments, the layout design of the present application is in a graphic database system (GDSII) file format.

In operation 1404 of method 1400, the integrated circuit is manufactured based on the layout design. In some embodiments, operation 1404 of method 1400 comprises manufacturing at least one mask based on the layout design, and manufacturing the integrated circuit based on the at least one mask. In some embodiments, operation 1404 corresponds to method 1300 of FIG. 13.

Figure 15:
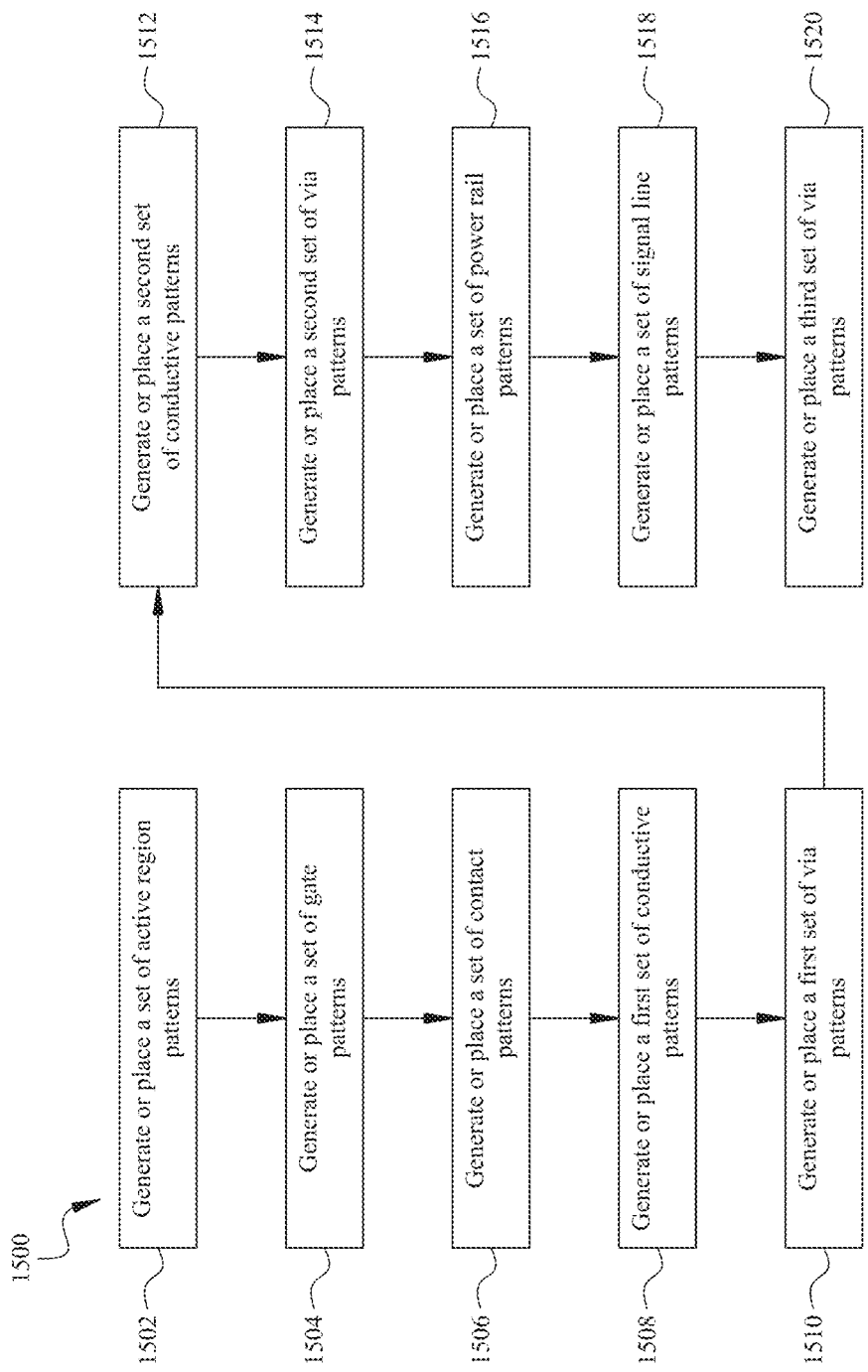
FIG. 15 is a flowchart of a method of generating a layout design of an integrated circuit, in accordance with some embodiments.

FIG. 15 is a flowchart of a method 1500 of generating a layout design of an integrated circuit, in accordance with some embodiments. It is understood that additional operations may be performed before, during, and/or after the method 1500 depicted in FIG. 15, and that some other processes may only be briefly described herein. In some embodiments, method 1500 is an embodiment of operation 1402 of method 1400. In some embodiments, method 1500 is usable to generate one or more layout patterns of at least layout design 200, 600 or 1000 or floorplan 200A, 600A or 1000A, or one or more features similar to at least integrated circuit 300, 400, 700, 800, 1100 or 1200.

In some embodiments, method 1500 is usable to generate one or more layout patterns having structural relationships including alignment, lengths and widths, as well as configurations and layers of at least layout design 200, 600 or 1000 or floorplan 200A, 600A or 1000A, or one or more features similar to at least integrated circuit 300, 400, 700, 800, 1100 or 1200, and similar detailed description will not be described in FIG. 15, for brevity.

In operation 1502 of method 1500, a set of active region patterns is generated or placed on the layout design. In some embodiments, the set of active region patterns of method 1500 includes at least portions of one or more patterns of set of active region patterns 202. In some embodiments, the set of active region patterns of method 1500 includes one or more regions similar to the set of active regions 302.

In operation 1504 of method 1500, a set of gate patterns is generated or placed on the layout design. In some embodiments, the set of gate patterns of method 1500 includes at least portions of one or more patterns of set of gate patterns 203, 204, 206, 604, 606, 1004 or 1006.

In operation 1506 of method 1500, a set of contact patterns is generated or placed on the layout design. In some embodiments, the set of contact patterns of method 1500 includes at least portions of one or more patterns of set of contact patterns 208, 210, 608, 610, 1008 or 1010. In some embodiments, the set of contact patterns of method 1500 includes one or more contact patterns similar to the set of contacts 408, 410, 808, 810, 1208 or 1210. In some embodiments, the set of contact patterns of method 1500 includes one or more patterns or similar contacts in the MD layer.

In operation 1508 of method 1500, a first set of conductive patterns is generated or placed on the layout design. In some embodiments, the first set of conductive patterns of method 1500 includes at least portions of one or more patterns of at least the set of conductive patterns 220, 222, 620, 622, 1020 or 1022. In some embodiments, the first set of conductive patterns of method 1500 includes one or more conductive patterns similar to at least the set of conductors 420, 422, 820, 822, 1220 or 1222. In some embodiments, the first set of conductive patterns of method 1500 includes one or more patterns or similar conductors in the M0 layer.

In operation 1510 of method 1500, a first set of via patterns is generated or placed on the layout design. In some embodiments, the first set of via patterns of method 1500 includes at least portions of one or more patterns of set of via patterns 212, 214, 216, 218, 612, 614, 616, 618, 1012, 1014, 1016 or 1018.

In some embodiments, the first set of via patterns of method 1500 includes one or more via patterns similar to at least the set of vias 412, 414, 416, 418, 812, 814, 816, 818, 1212, 1214, 1216 or 1218. In some embodiments, the first set of via patterns of method 1500 includes one or more patterns or similar vias in the VG or VD layer.

In operation 1512 of method 1500, a second set of conductive patterns is generated or placed on the layout design. In some embodiments, the second set of conductive patterns of method 1500 includes at least portions of one or more patterns of at least the set of conductive patterns 240, 640 or 1040. In some embodiments, the second set of conductive patterns of method 1500 includes one or more conductive patterns similar to at least the set of conductors 440, 840 or 1240. In some embodiments, the second set of conductive patterns of method 1500 includes one or more patterns or similar conductors in the M1 layer.

In operation 1514 of method 1500, a second set of via patterns is generated or placed on the layout design. In some embodiments, the second set of via patterns of method 1500 includes at least portions of one or more patterns of set of via patterns 242, 642 or 1042.

In some embodiments, the second set of via patterns of method 1500 includes one or more via patterns similar to at least the set of vias 442, 842 or 1242. In some embodiments, the second set of via patterns of method 1500 includes one or more patterns or similar vias in the V0 layer.

In operation 1516 of method 1500, a set of power rail patterns is generated or placed on the layout design. In some embodiments, the set of power rail patterns of method 1500 includes at least portions of one or more patterns of set of conductive patterns 250 or 650. In some embodiments, the set of power rail patterns of method 1500 includes one or more patterns similar to at least the set of conductors 450 or 750. In some embodiments, the power rail patterns of method 1500 includes one or more patterns or similar conductors in the BM layer.

In operation 1518 of method 1520, a set of signal line patterns is generated or placed on the layout design. In some embodiments, the set of signal line patterns of method 1520 includes at least portions of one or more patterns of set of conductive patterns 252 or 652. In some embodiments, the set of signal line patterns of method 1520 includes one or more patterns similar to at least the set of conductors 352 or 752. In some embodiments, the signal line patterns of method 1500 includes one or more patterns or similar conductors in the BM layer.

In operation 1520 of method 1500, a third set of via patterns is generated or placed on the layout design. In some embodiments, the third set of via patterns of method 1500 includes at least portions of one or more patterns of set of via patterns 254, 654, 1054, 256, 656 or 1056.

In some embodiments, the third set of via patterns of method 1500 includes one or more via patterns similar to at least the set of vias 354, 754, 1254, 356, 756 or 1256. In some embodiments, the third set of via patterns of method 1500 includes one or more patterns or similar vias in the VB layer.

Figure 16:
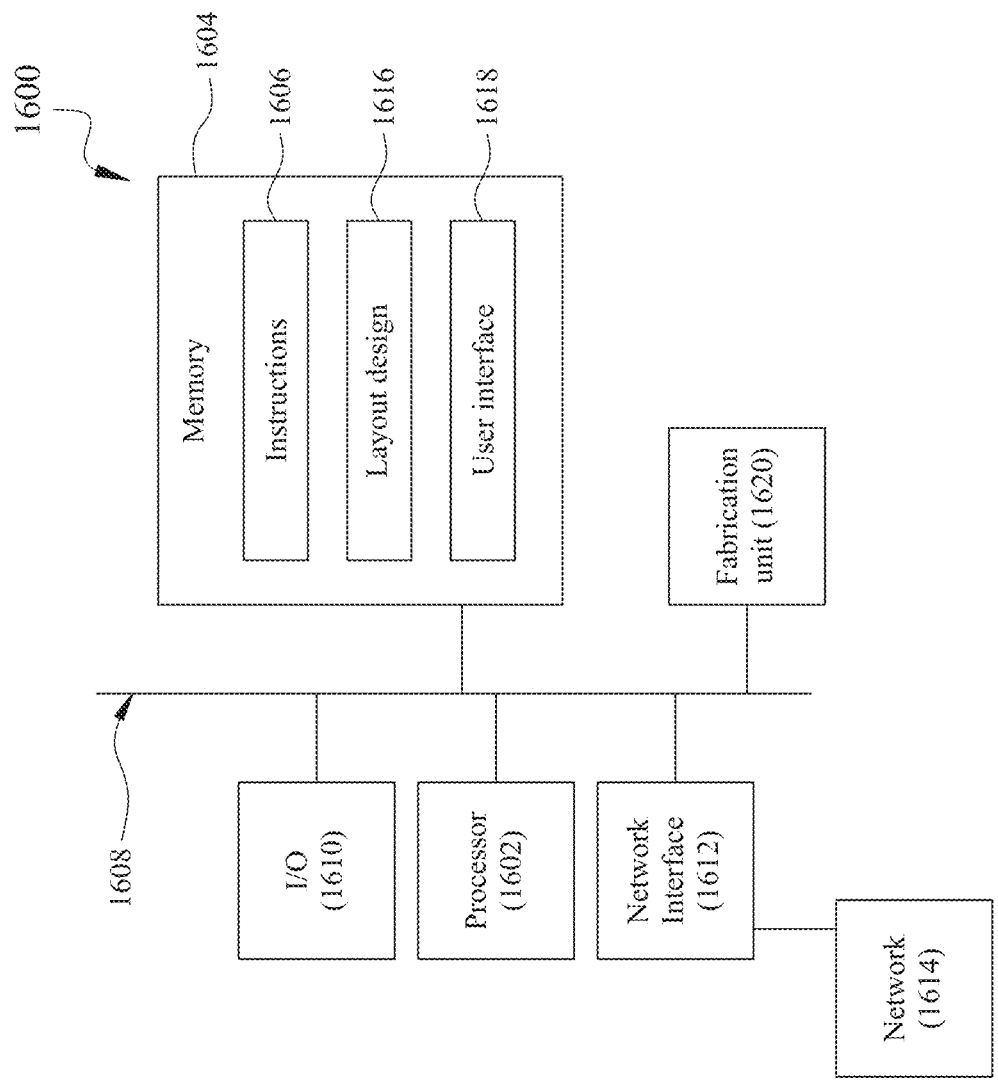
FIG. 16 is a schematic view of a system for designing an IC layout design and manufacturing an IC circuit, in accordance with some embodiments.

FIG. 16 is a schematic view of a system 1600 for designing an IC layout design and manufacturing an IC circuit in accordance with some embodiments.

In some embodiments, system 1600 generates or places one or more IC layout designs described herein. System 1600 includes a hardware processor 1602 and a non-transitory, computer readable storage medium 1604 (e.g., memory 1604) encoded with, i.e., storing, the computer program code 1606, i.e., a set of executable instructions 1606. Computer readable storage medium 1604 is configured for interfacing with manufacturing machines for producing the integrated circuit. The processor 1602 is electrically coupled to the computer readable storage medium 1604 via a bus 1608. The processor 1602 is also electrically coupled to an I/O interface 1610 by bus 1608. A network interface 1612 is also electrically connected to the processor 1602 via bus 1608. Network interface 1612 is connected to a network 1614, so that processor 1602 and computer readable storage medium 1604 are capable of connecting to external elements via network 1614. The processor 1602 is configured to execute the computer program code 1606 encoded in the computer readable storage medium 1604 in order to cause system 1600 to be usable for performing a portion or all of the operations as described in method 1400-1500.

In some embodiments, the processor 1602 is a central processing unit (CPU), a multi-processor, a distributed processing system, an application specific integrated circuit (ASIC), and/or a suitable processing unit.

In some embodiments, the computer readable storage medium 1604 is an electronic, magnetic, optical, electromagnetic, infrared, and/or a semiconductor system (or apparatus or device). For example, the computer readable storage medium 1604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1604 includes a compact disk-read only memory (CD-ROM), a compact disk-read/write (CD-R/W), and/or a digital video disc (DVD).

In some embodiments, the storage medium 1604 stores the computer program code 1606 configured to cause system 1600 to perform method 1400-1500. In some embodiments, the storage medium 1604 also stores information needed for performing method 1400-1500 as well as information generated during performing method 1400-1500, such as layout design 1616, user interface 1618 and fabrication unit 1620, and/or a set of executable instructions to perform the operation of method 1400-1500. In some embodiments, layout design 1616 comprises one or more of layout patterns of at least layout design 200, 600 or 1000 or floorplan 200A, 600A or 1000A, or features similar to at least integrated circuit 300, 400, 700, 800, 1100 or 1200.

In some embodiments, the storage medium 1604 stores instructions (e.g., computer program code 1606) for interfacing with manufacturing machines. The instructions (e.g., computer program code 1606) enable processor 1602 to generate manufacturing instructions readable by the manufacturing machines to effectively implement method 1400-1500 during a manufacturing process.

System 1600 includes I/O interface 1610. I/O interface 1610 is coupled to external circuitry. In some embodiments, I/O interface 1610 includes a keyboard, keypad, mouse, trackball, trackpad, and/or cursor direction keys for communicating information and commands to processor 1602.

System 1600 also includes network interface 1612 coupled to the processor 1602. Network interface 1612 allows system 1600 to communicate with network 1614, to which one or more other computer systems are connected. Network interface 1612 includes wireless network interfaces such as BLUETOOTH, WIFI, WIMAX, GPRS, or WCDMA; or wired network interface such as ETHERNET, USB, or IEEE-2094. In some embodiments, method 1400-1500 is implemented in two or more systems 1600, and information such as layout design, and user interface are exchanged between different systems 1600 by network 1614.

System 1600 is configured to receive information related to a layout design through I/O interface 1610 or network interface 1612. The information is transferred to processor 1602 by bus 1608 to determine a layout design for producing at least integrated circuit 300, 400, 700, 800, 1100 or 1200. The layout design is then stored in computer readable medium 1604 as layout design 1616. System 1600 is configured to receive information related to a user interface through I/O interface 1610 or network interface 1612. The information is stored in computer readable medium 1604 as user interface 1618. System 1600 is configured to receive information related to a fabrication unit 1620 through I/O interface 1610 or network interface 1612. The information is stored in computer readable medium 1604 as fabrication unit 1620. In some embodiments, the fabrication unit 1620 includes fabrication information utilized by system 1600. In some embodiments, the fabrication unit 1620 corresponds to mask fabrication 1734 of FIG. 17.

In some embodiments, method 1400-1500 is implemented as a standalone software application for execution by a processor. In some embodiments, method 1400-1500 is implemented as a software application that is a part of an additional software application. In some embodiments, method 1400-1500 is implemented as a plug-in to a software application. In some embodiments, method 1400-1500 is implemented as a software application that is a portion of an EDA tool. In some embodiments, method 1400-1500 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1400-1500 is implemented by a manufacturing device to manufacture an integrated circuit using a set of masks manufactured based on one or more layout designs generated by system 1600. In some embodiments, system 1600 is a manufacturing device configured to manufacture an integrated circuit using a set of masks manufactured based on one or more layout designs of the present disclosure. In some embodiments, system 1600 of FIG. 16 generates layout designs of an integrated circuit that are smaller than other approaches. In some embodiments, system 1600 of FIG. 16 generates layout designs of integrated circuit structure that occupy less area and provide better routing resources than other approaches.

FIG. 17 is a block diagram of an integrated circuit (IC) manufacturing system 1700, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1700.

In FIG. 17, IC manufacturing system 1700 (hereinafter "system 1700") includes entities, such as a design house 1720, a mask house 1730, and an IC manufacturer/fabricator ("fab") 1740, that interact with one another in the design, development, and manufacturing cycles and/or services related to manufacturing an IC device 1760. The entities in system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1720, mask house 1730, and IC fab 1740 is owned by a single larger company. In some embodiments, one or more of design house 1720, mask house 1730, and IC fab 1740 coexist in a common facility and use common resources.

Design house (or design team) 1720 generates an IC design layout 1722. IC design layout 1722 includes various geometrical patterns designed for an IC device 1760. The geometrical patterns correspond to patterns of metal, oxide, or semiconductor layers that make up the various components of IC device 1760 to be fabricated. The various layers combine to form various IC features. For example, a portion of IC design layout 1722 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1720 implements a proper design procedure to form IC design layout 1722. The design procedure includes one or more of logic design, physical design or place and route. IC design layout 1722 is presented in one or more data files having information of the geometrical patterns. For example, IC design layout 1722 can be expressed in a GDSII file format or DFII file format.

Mask house 1730 includes data preparation 1732 and mask fabrication 1734. Mask house 1730 uses IC design layout 1722 to manufacture one or more masks 1745 to be used for fabricating the various layers of IC device 1760 according to IC design layout 1722. Mask house 1730 performs mask data preparation 1732, where IC design layout 1722 is translated into a representative data file (RDF). Mask data preparation 1732 provides the RDF to mask fabrication 1734. Mask fabrication 1734 includes a mask writer. A mask writer converts the RDF to an image on a substrate, such as a mask (reticle) 1745 or a semiconductor wafer 1742. The design layout 1722 is manipulated by mask data preparation 1732 to comply with particular characteristics of the mask writer and/or requirements of IC fab 1740. In FIG. 17, mask data preparation 1732 and mask fabrication 1734 are illustrated as separate elements. In some embodiments, mask data preparation 1732 and mask fabrication 1734 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts IC design layout 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1734, which may undo part of the modifications performed by OPC in order to meet mask creation rules.

In some embodiments, mask data preparation 1732 includes lithography process checking (LPC) that simulates processing that will be implemented by IC fab 1740 to fabricate IC device 1760. LPC simulates this processing based on IC design layout 1722 to create a simulated manufactured device, such as IC device 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1722.

It should be understood that the above description of mask data preparation 1732 has been simplified for the purposes of clarity. In some embodiments, data preparation 1732 includes additional features such as a logic operation (LOP) to modify the IC design layout according to manufacturing rules. Additionally, the processes applied to IC design layout 1722 during data preparation 1732 may be executed in a variety of different orders.

After mask data preparation 1732 and during mask fabrication 1734, a mask 1745 or a group of masks 1745 are fabricated based on the modified IC design layout 1722. In some embodiments, mask fabrication 1734 includes performing one or more lithographic exposures based on IC design 1722. In some embodiments, an electron-beam (e-beam) or a mechanism of multiple e-beams is used to form a pattern on a mask (photomask or reticle) 1745 based on the modified IC design layout 1722. The mask 1745 can be formed in various technologies. In some embodiments, the mask 1745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1745 includes a transparent substrate (e.g., fused quartz) and an opaque material (e.g., chromium) coated in the opaque regions of the binary mask. In another example, the mask 1745 is formed using a phase shift technology. In the phase shift mask (PSM) version of mask 1745, various features in the pattern formed on the mask are configured to have proper phase difference to enhance the resolution and imaging quality. In various examples, the phase shift mask can be attenuated PSM or alternating PSM. The mask(s) generated by mask fabrication 1734 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1740 is an IC fabrication entity that includes one or more manufacturing facilities for the fabrication of a variety of different IC products. In some embodiments, IC Fab 1740 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1740 includes wafer fabrication tools 1752 (hereinafter "fabrication tools 1752") configured to execute various manufacturing operations on semiconductor wafer 1742 such that IC device 1760 is fabricated in accordance with the mask(s), e.g., mask 1745. In various embodiments, fabrication tools 1752 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1740 uses mask(s) 1745 fabricated by mask house 1730 to fabricate IC device 1760. Thus, IC fab 1740 at least indirectly uses IC design layout 1722 to fabricate IC device 1760. In some embodiments, a semiconductor wafer 1742 is fabricated by IC fab 1740 using mask(s) 1745 to form IC device 1760. In some embodiments, the IC fabrication includes performing one or more lithographic exposures based at least indirectly on IC design 1722. Semiconductor wafer 1742 includes a silicon substrate or other proper substrate having material layers formed thereon. Semiconductor wafer 1742 further includes one or more of various doped regions, dielectric features, multilevel interconnects, and the like (formed at subsequent manufacturing steps).

System 1700 is shown as having design house 1720, mask house 1730 or IC fab 1740 as separate components or entities. However, it is understood that one or more of design house 1720, mask house 1730 or IC fab 1740 are part of the same component or entity.

Details regarding an integrated circuit (IC) manufacturing system (e.g., system 1700 of FIG. 17), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a first power rail extending in a first direction, configured to supply a first supply voltage, and being on a back-side of a substrate. In some embodiments, the integrated circuit further includes a second power rail extending in the first direction, configured to supply a second supply voltage different from the first supply voltage, being on the back-side of the substrate, and being separated from the first power rail in a second direction different from the first direction. In some embodiments, the integrated circuit further includes a first signal line extending in the first direction and being separated from the first power rail in the second direction, and being on the back-side of the substrate. In some embodiments, the integrated circuit further includes a first transistor having a first active region extending in the first direction, and being in a front-side of the substrate opposite from the back-side, the first active region being overlapped by the first power rail, and being electrically coupled to the first power rail. In some embodiments, the integrated circuit further includes a second transistor having a second active region extending in the first direction, and being in the front-side of the substrate, the second active region being separated from the first active region in at least the second direction, being overlapped by the first signal line, and being configured to receive the first supply voltage of the first power rail through the first active region of the first transistor.

Another aspect of this description relates to an integrated circuit. In some embodiments, the integrated circuit includes a first power rail extending in a first direction, configured to supply a first supply voltage, and being on a back-side of a substrate. In some embodiments, the integrated circuit further includes a first power rail extending in a first direction, configured to supply a first supply voltage, and being on a back-side of a substrate. In some embodiments, the integrated circuit further includes a first active region extending in the first direction, and being in a front-side of the substrate opposite from the back-side, the first active region being overlapped by the first power rail, and being electrically coupled to the first power rail. In some embodiments, the integrated circuit further includes a second active region extending in the first direction, and being in the front-side of the substrate, the second active region being separated from the first active region in a second direction different from the first direction. In some embodiments, the second active region includes a first source/drain region of a first transistor. In some embodiments, the integrated circuit further includes a first contact extending in the second direction, being on a first level below the front-side of the substrate, the first contact being electrically coupled to the first active region and the first source/drain region of the first transistor. In some embodiments, the first source/drain region of the first transistor is configured to receive the first supply voltage of the first power rail through the first contact and the first active region.

Still another aspect of this description relates to a method of fabricating an integrated circuit. In some embodiments, the method includes fabricating a first set of transistors and a second set of transistors in a front-side of a substrate. In some embodiments, the method further includes fabricating a first set of vias on a back-side of a thinned substrate, the first set of vias being electrically coupled to at least the first set of transistors or the second set of transistors, the back-side of the thinned substrate being opposite from the front-side of the substrate. In some embodiments, the method further includes depositing a first conductive material on the back-side of the thinned substrate on a first level thereby forming a first set of conductors, the first set of conductors being electrically coupled to at least the first set of transistors by the first set of vias, the first set of transistors being configured to receive a first supply voltage from at least a first conductor of the first set of conductors from the back-side. In some embodiments, the method further includes electrically coupling the second set of transistors to at least the first set of conductors by the front-side of the substrate through at least a first source/drain of a first transistor of the first set of transistors, thereby configuring the second set of transistors to receive the first supply voltage from at least the first conductor of the first set of conductors from the back-side of the thinned substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first power rail extending in a first direction, configured to supply a first supply voltage, and being on a back-side of a substrate;
a second power rail extending in the first direction, configured to supply a second supply voltage different from the first supply voltage, being on the back-side of the substrate, and being separated from the first power rail in a second direction different from the first direction;
a first signal line extending in the first direction and being separated from the first power rail in the second direction, and being on the back-side of the substrate;
a first transistor having a first active region extending in the first direction, and being in a front-side of the substrate opposite from the back-side, the first active region being overlapped by the first power rail, and being electrically coupled to the first power rail; and
a second transistor having a second active region extending in the first direction, and being in the front-side of the substrate, the second active region being separated from the first active region in at least the second direction, being overlapped by the first signal line, and being configured to receive the first supply voltage of the first power rail through the first active region of the first transistor.

2. The integrated circuit of claim 1, wherein a first source of the second active region is electrically coupled to the first power rail by a second source of the first active region.

3. The integrated circuit of claim 1, wherein the first transistor and the second transistor are part of a flip-flop.

4. The integrated circuit of claim 1, wherein
the first transistor is not overlapped by the first signal line; and
the second transistor is not overlapped by the first power rail.

5. The integrated circuit of claim 4, further comprising:
a first contact extending in the second direction, being on a first level below the front-side of the substrate, the first contact being coupled to a first side of the first active region; and
a first via electrically coupling the first active region and the first power rail together, the first via being between the first power rail and a second side of the first active region opposite from the first side of the first active region.

6. The integrated circuit of claim 5, further comprising:
a first conductor extending in the first direction, being overlapped by the first power rail and the first contact, and being on a second level different from the first level; and
a second via between the first conductor and the first contact, the second via electrically coupling the first conductor and the first contact together.

7. The integrated circuit of claim 6, further comprising:
a second conductor extending in the second direction, being overlapped by at least the first conductor and the first power rail, and being on a third level different from the first level and the second level; and
a third via between the second conductor and the first conductor, the third via electrically coupling the second conductor and the first conductor together.

8. The integrated circuit of claim 7, further comprising:
a third conductor extending in the first direction, being overlapped by the first signal line, being separated from the first conductor in the second direction, and being on the second level of the front-side of the substrate; and a fourth via between the third conductor and the second conductor, the fourth via electrically coupling the third conductor and the second conductor together.

9. The integrated circuit of claim 8, further comprising:
a second contact extending in the second direction, being on the first level, being separated from the first contact in at least the first direction or the second direction, the second contact being coupled to a first side of the second active region; and
a fifth via between the second contact and the third conductor, the fifth via electrically coupling the second contact and the third conductor together.

10. The integrated circuit of claim 9, further comprising:
a fourth conductor extending in the second direction, being overlapped by at least the first conductor and the third conductor, being separated from the second conductor in the first direction, and being on the third level;
a sixth via between the fourth conductor and the first conductor, the sixth via electrically coupling the fourth conductor and the first conductor together; and
a seventh via between the fourth conductor and the third conductor, the seventh via electrically coupling the fourth conductor and the third conductor together.

11. An integrated circuit comprising:
a first power rail extending in a first direction, configured to supply a first supply voltage, and being on a back-side of a substrate;
a first active region extending in the first direction, and being in a front-side of the substrate opposite from the back-side, the first active region being overlapped by the first power rail, and being electrically coupled to the first power rail;
a second active region extending in the first direction, and being in the front-side of the substrate, the second active region being separated from the first active region in a second direction different from the first direction, the second active region including:
a first source/drain region of a first transistor;
a first contact extending in the second direction, being on a first level below the front-side of the substrate, the first contact being electrically coupled to the first active region and the first source/drain region of the first transistor,
wherein the first source/drain region of the first transistor is configured to receive the first supply voltage of the first power rail through the first contact and the first active region.

12. The integrated circuit of claim 11, further comprising:
a second power rail extending in the first direction, being configured to supply a second supply voltage different from the first supply voltage, and being on the back-side of the substrate;
a first signal line extending in the first direction and being separated from the first power rail and the second power rail in the second direction, and being on the back-side of the substrate;
a third active region extending in the first direction, and being in the front-side of the substrate, the third active region being overlapped by the second power rail, and being electrically coupled to the second power rail; and
a fourth active region extending in the first direction, and being in the front-side of the substrate, the fourth active region being separated from the third active region in the second direction, being covered by the first signal line, and being configured to receive the second supply voltage of the second power rail through a first source/drain of the third active region.

13. The integrated circuit of claim 12, further comprising:
a second contact extending in the second direction, being on the first level, the second contact being coupled to a first side of the first source/drain of the third active region;
a first via electrically coupling the first source/drain of the third active region and the second power rail together, the first via being between the second power rail and a second side of the first source/drain of the third active region opposite from the first side of the first source/drain of the third active region;
a first conductor extending in the first direction, being overlapped by the second power rail and the second contact, and being on a second level different from the first level; and
a second via between the first conductor and the second contact, the second via electrically coupling the first conductor and the second contact together.

14. The integrated circuit of claim 13, further comprising:
a second conductor extending in the second direction, being overlapped by at least the first conductor, and being on a third level different from the first level and the second level;
a third via between the second conductor and the first conductor, the third via electrically coupling the second conductor and the first conductor together;
a third conductor extending in the first direction, being overlapped by the first signal line, being separated from the first conductor in the second direction, and being on the second level; and
a fourth via between the third conductor and the second conductor, the fourth via electrically coupling the third conductor and the second conductor together.

15. The integrated circuit of claim 14, further comprising:
a third contact extending in the second direction, being on the first level, being separated from the second contact in at least the first direction or the second direction, the third contact being coupled to a first source/drain of the fourth active region;
a fifth via between the third contact and the third conductor, the fifth via electrically coupling the third contact and the third conductor together;
a fourth contact extending in the second direction, being on the first level, being separated from the third contact in the first direction, the fourth contact being coupled to a second source/drain of the fourth active region; and
a sixth via between the fourth contact and the third conductor, the sixth via electrically coupling the fourth contact and the third conductor together.

16. The integrated circuit of claim 11, wherein the first source/drain region of the first transistor is not overlapped by the first power rail.

17. The integrated circuit of claim 11, further comprising:
a first conductor extending in the first direction, and being on the back-side of the substrate,
wherein the first conductor is configured to electrically couple the first source/drain region of the first transistor and a second source/drain of a second transistor together.

18. The integrated circuit of claim 11, further comprising:
a first via electrically coupling a second drain/source of the first active region and the first power rail together;
wherein the first contact is coupled to a first side of the second drain/source of the first active region; and the first power rail is coupled to a second side of the second drain/source of the first active region opposite from the first side of the second drain/source of the first active region.

19. A method of fabricating an integrated circuit, the method comprising:
- fabricating a first set of transistors and a second set of transistors in a front-side of a substrate;
- fabricating a first set of vias on a back-side of a thinned substrate, the first set of vias being electrically coupled to at least the first set of transistors or the second set of transistors, the back-side of the thinned substrate being opposite from the front-side of the substrate;
- depositing a first conductive material on the back-side of the thinned substrate on a first level thereby forming a first set of conductors, the first set of conductors being electrically coupled to at least the first set of transistors by the first set of vias, the first set of transistors being configured to receive a first supply voltage from at least a first conductor of the first set of conductors from the back-side; and
- electrically coupling the second set of transistors to at least the first set of conductors by the front-side of the substrate through at least a first source/drain of a first transistor of the first set of transistors, thereby configuring the second set of transistors to receive the first supply voltage from at least the first conductor of the first set of conductors from the back-side of the thinned substrate.

20. The method of claim 19, wherein fabricating the first set of transistors and the second set of transistors in the front-side of the substrate comprises:
- fabricating a first set of contacts on the front-side of the substrate, thereby electrically coupling a first source/drain of a second transistor of the first set of transistors and a first source/drain of a third transistor of the second set of transistors,
- wherein the first source/drain of the second transistor is configured to receive the first supply voltage or a second supply voltage from at least a second conductor of the first set of conductors through the first source/drain of the third transistor.

\* \* \* \* \*